US007691685B2

(12) United States Patent
Maekawa et al.

(10) Patent No.: US 7,691,685 B2
(45) Date of Patent: Apr. 6, 2010

(54) METHOD FOR MANUFACTURING SEMICONDUCTOR DEVICE

(75) Inventors: Shinji Maekawa, Shizuoka (JP); Shunpei Yamazaki, Tokyo (JP); Hironobu Shoji, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 626 days.

(21) Appl. No.: 10/579,800

(22) PCT Filed: Jan. 24, 2005

(86) PCT No.: PCT/JP2005/001286

§ 371 (c)(1),
(2), (4) Date: May 19, 2006

(87) PCT Pub. No.: WO2005/071478

PCT Pub. Date: Aug. 4, 2005

(65) Prior Publication Data

US 2007/0093002 A1    Apr. 26, 2007

(30) Foreign Application Priority Data

Jan. 26, 2004   (JP)   ............................. 2004-017583
Jan. 26, 2004   (JP)   ............................. 2004-017608

(51) Int. Cl.
*H01L 21/00*   (2006.01)
*H01L 21/84*   (2006.01)

(52) U.S. Cl. .................. 438/149; 438/151; 257/E21.32

(58) Field of Classification Search ................. 438/149, 438/151, 157, 160; 257/E21.32, E21.561, 257/E21.7

See application file for complete search history.

(56) References Cited

U.S. PATENT DOCUMENTS 6,416,583 B1    7/2002   Kitano et al.

(Continued)

FOREIGN PATENT DOCUMENTS

JP    5-114504    5/1993

(Continued)

OTHER PUBLICATIONS

First Office Action from Patent Office of the People's Republic of China issued Feb. 22, 2008, for Chinese Patent Application No. 200580003270.7.

(Continued)

*Primary Examiner*—Hoai v Pham
(74) *Attorney, Agent, or Firm*—Nixon Peabody LLP; Jeffrey L. Costellia

(57) ABSTRACT

In the present circumstances, a film formation method of using spin coating in a manufacturing process is heavily used. As increasing the substrate size in future, the film formation method of using spin coating becomes at a disadvantage in mass production since a mechanism for rotating a large substrate becomes large, and there is many loss of material solution or waste liquid. According to the present invention, in a manufacturing process of a semiconductor device, a microscopic wiring pattern can be realized by delivering selectively photosensitive conductive material solution by droplet discharging, exposing selectively to laser light or the like, and developing. The present invention can reduce drastically costs since a patterning process can be shortened and an amount of material in a process of forming a conductive pattern can be reduced. Accordingly, the present invention can be applied to manufacture a large substrate.

22 Claims, 33 Drawing Sheets

U.S. PATENT DOCUMENTS

| | | | |
|---|---|---|---|
| 6,426,595 | B1 | 7/2002 | Odake et al. |
| 6,586,155 | B2 | 7/2003 | Furuse et al. |
| 6,627,263 | B2 | 9/2003 | Kitano et al. |
| 6,638,359 | B2 | 10/2003 | Yajima et al. |
| 6,833,224 | B2 | 12/2004 | Furuse et al. |
| 6,855,377 | B2 | 2/2005 | Yajima et al. |
| 7,365,805 | B2 * | 4/2008 | Maekawa et al. ........... 348/739 |
| 2002/0012868 | A1 | 1/2002 | Furuse et al. |
| 2005/0008955 | A1 | 1/2005 | Furuse et al. |

FOREIGN PATENT DOCUMENTS

| | | |
|---|---|---|
| JP | 6-061257 | 3/1994 |
| JP | 2000-188251 | 7/2000 |
| JP | 2000-258921 | 9/2000 |
| JP | 2000-298446 | 10/2000 |
| JP | 2003-031922 | 1/2003 |
| JP | 2003-318133 | 11/2003 |

OTHER PUBLICATIONS

Written Opinion of the International Searching Authority for PCT/JP2005/001286 dated May 10, 2005.

International Search Report for PCT/JP2005/001286 dated May 10, 2005.

* cited by examiner terminal portion | pixel portion terminal portion | pixel portion terminal portion | pixel portion terminal portion | pixel portion terminal portion | pixel portion terminal portion | pixel portion terminal portion | pixel portion terminal portion | pixel portion terminal portion | pixel portion terminal portion | pixel portion

METHOD FOR MANUFACTURING SEMICONDUCTOR DEVICE

TECHNICAL FIELD

The present invention relates to a semiconductor device and a method for manufacturing the semiconductor device having a circuit composed of thin film transistors (hereinafter, TFT). More specifically, the present invention relates to an electric appliance installed with an electro-optic device as typified by a light-emitting display device having an organic light-emitting element, or a liquid crystal display panel.

As used herein, the term "semiconductor device" refers to a device in general that can operate by utilizing semiconductor characteristics such as an electro-optic device, a semiconductor circuit, and an electric appliance.

BACKGROUND ART

In recent years, technique of composing thin film transistors (TFT) by using a semiconductor thin film (with a thickness of approximately several to several hundreds nm) formed over a substrate having an insulating surface has attracted attention. A thin film transistor is widely applied to an electronic device such as an IC or an electro-optic device, and is especially developed as a switching element for an image display device.

As an image display device, a liquid crystal display device is generally well known. An active matrix liquid crystal display device is used more often as an image display device than a passive matrix liquid crystal display device since the active matrix liquid crystal display device can achieve a higher definition image than that of the passive matrix liquid crystal display device. In an active matrix liquid crystal display device, a display pattern is formed on a screen by driving pixel electrodes arranged in a matrix configuration. Specifically, upon being applied voltage between a selected pixel electrode and an opposing electrode corresponding to the pixel electrode, optical modulation of a liquid crystal layer interposed between the pixel electrode and the opposing electrode is occurred, and the optical modulation is recognized by a viewer as a display pattern.

Conventionally, production technique of performing efficiently mass production by clipping a plurality of liquid crystal display panels from one mother glass substrate has been adopted. The mother glass substrate has grown in size from a first generation at the start of 1990s, 300×400 mm to a fourth generation in 2000 s, 680×880 mm or 730×920 mm. Simultaneously, production technique has been progressed so that multiple display panels can be obtained from one substrate.

In recent years, study of a light-emitting device having an EL element as a self luminous light-emitting element has been activated. The light-emitting device is also referred to as an organic EL display or an organic light-emitting diode. These light-emitting devices have attracted attention as a new generation cellular phone, a personal digital assistance (PDA), or a next generation display for their characteristics of high speed response speed that is suitable for movie display; low voltage; low power consuming driving; and the like.

An EL element comprises an anode, a cathode, and a layer containing an organic compound as a light-emitting layer (hereinafter, EL layer) that is interposed between the anode and the cathode. Upon applying voltage to the anode and the cathode, light is emitted from the EL layer (Electro Luminescence). Fluorescence that occurs from the singlet excited state back down to the ground state and phosphorescence that occurs from the triplet excited state back down to the ground state are obtainable from the EL element.

The application range of an active matrix display device has been expanded. Requirements of high definition, a high opening ratio, and high reliability have been increased as increasing the size of a screen.

Unexamined patent publication No. 2000-298446 discloses that a large display can be realized by forming one display screen composed of a plurality of tiled panels. However, the large display requires high costs and a unique driving method since a plurality of panel is used.

Simultaneously with increasing the screen size, requirements of improvement of productivity and reduction in costs have been increased.

Unexamined patent publication No. 2000-188251 discloses technique for forming a film over a semiconductor wafer by using a device that can deliver continuously resist solution in the form of a line having a thin diameter to improve the yield of the solution used for film formation.

DISCLOSURE OF INVENTION

In the present circumstances, a film formation method of using spin coating in a manufacturing process is heavily used. When the substrate size is further increased in a future, the film formation method of using spin coating becomes at a disadvantage in mass production since a rotation mechanism for rotating a large substrate becomes large and there is much loss of material solution or waste liquid. In the case that a rectangular substrate is spin coated with material solution; a coated film tends to be uneven, that is, the coated film tends to have circular spots, each of which is centered at a rotation axis. The present invention provides a manufacturing process using a droplet discharging method that is suitable for manufacturing a large substrate in mass production.

In view of the foregoing, it is an object of the present invention to provide a large screen display using a wiring formed by droplet discharging and the manufacturing method thereof. It is another object of the present invention is to provide a light-emitting device in which a wiring is formed by droplet discharging to have a desired electrode width and a TFT having a channel length of 10 μm or less is arranged in a pixel.

It is further another object of the present invention to provide a liquid crystal display device in which a wiring is formed by droplet discharging to have a desired electrode width and a TFT having a channel length of 10 μm or less is arranged in a pixel.

According to the present invention, a microscopic wiring pattern can be realized by discharging selectively photosensitive conductive material solution by droplet discharging, exposing selectively to light, and developing. The present invention can reduce drastically costs since a patterning process can be shortened and an amount of material can be reduced in a process of forming a conductive pattern. Accordingly, the present invention can be applied to manufacture a large substrate.

The conductive material solution contains a metal or an alloy such as Ag, Au, Cu, Ni, Al, or Pt; and photosensitive resin comprising organic high molecular resin, photo polymerization initiator, photo polymerization, or solvent. As the organic high molecular resin, novolac resin, acrylic copolymer, methacrylic copolymer, cellulose derivatives, cyclic rubber resin, or the like can be used.

A photosensitive material can be broadly divided into negative type and positive type. In the case of using the negative type photosensitive material, an exposed portion brings about chemical reactions, and the portion chemically reacted is only left due to developing solution, then, a pattern is formed. In the case of using the positive type photosensitive material, an exposed portion brings about chemical reactions, and the portion chemically reacted is dissolved, then, unexposed portion is only left, and then, a pattern is formed.

Further, since the wiring width is determined by accuracy of laser light irradiation, a desired wiring width can be obtained irrespective of an amount or viscosity of a drop or nozzle diameter. Generally, the wiring width is varied by a contact angle between material solution discharged by a nozzle and a substrate. For example, an amount of a drop discharged from a nozzle having a diameter of 50 μm×50 μm of a typical ink jet device is 30 to 200 μl, and an obtained wiring width is 60 to 300 μm. A wiring having a narrow width (for example, an electrode width of 3 μm to 10 μm) can be obtained by laser light exposure according to the present invention. An amount of a material solution discharged from a nozzle having a thinner diameter than that of a typical nozzle is 0.1 to 40 μl, and an obtained wiring width is 5 to 100 μm.

In the case of forming a wiring pattern by droplet discharging, a conductive material may be discharged intermittently from a nozzle by drops in the form of a dot, or a conductive material may be discharged continuously in the form of a ribbon. In the present invention, a wiring pattern may be appropriately formed by discharging the conductive material in the form of either a dot or a ribbon. In the case of forming a wiring pattern having a comparative large width, it leads to better productivity that the wiring pattern is formed by discharging the conductive material in the form of a ribbon.

Before forming a wiring pattern by droplet discharging, a base layer for improving adhesiveness is preferably formed over a whole surface or a selected area of a substrate. Alternatively, base pretreatment is performed. As formation of a base layer, treatment such that a photocatalyst material (titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$)) is dropped over the whole surface by spraying or sputtering may be performed. Alternatively, treatment such that an organic material (polyimide, acrylic, or a coated insulating film using a material which has a skeleton formed by the bond of silicon (Si) and oxygen (O), and which includes at least one selected from the group consisting of hydrogen, fluoride, alkyl group, and aromatic hydrocarbon as the substituent) is selectively formed by ink jetting or sol-gel may be performed.

A photocatalyst substance refers to a substance having a photocatalyst function that yields photocatalyst activity by being irradiated with light in an ultraviolet region (wavelength of 400 nm or less, preferably, 380 nm or less). If a conductor mixed into solvent is discharged by droplet discharging as typified by ink jetting over a photocatalyst substance, a microscopic drawing can be realized.

Before emitting light to $TiO_x$, $TiO_x$ has a lipophilic property but no hydrophilic property, that is, the $TiO_x$ has water-shedding quality. By light irradiation, $TiO_x$ brings about photocatalyst activity and loses a lipophilic property. Further, $TiO_x$ is capable of having both of a lipophilic property and a hydrophilic property depending on light irradiation time.

By doping a transition metal (Pd, Pt, Cr, Ni, V, Mn, Fe, Ce, Mo, W, and the like) into a photocatalyst substance, photocatalyst activity can be improved or photocatalyst activity can be yielded due to light in a visible light region (wavelength of 400 to 800 nm). Since light wavelength can be determined by a photocatalyst substance, light irradiation refers to emit light of a wavelength that can yield photocatalyst activity of a photocatalyst substance.

A conductor mixed into solvent can be discharged by droplet discharging as typified by ink jetting while light irradiation.

After forming photocatalyst substance that can bring about photocatalyst activity due to a wavelength of laser light over a whole surface, only an irradiated region can be modified by emitting selectively laser light to the photocatalyst substance. Further, a conductor mixed into solvent can be discharged by droplet discharging as typified by ink jetting while laser light irradiation.

A hydrophilic property refers to a property of being easier to be wet by water. A super hydrophilic property refers to the state of having a contact angle of 30° or less, especially, 5° or less. On other hand, a water-shedding property refers to a property of hardly being wet by water with a contact angle of 90° or more. Similarly, a lipophilic property refers to a property of being easier to be wet by oil, whereas an oil-shedding property refers to a property of hardly being wet by oil. Further, a contact angle means to an angle formed by tangents to a surface and a drop at the edge of a dropped dot.

In the case that conductive material solution has a flow property or the flow property is increased in baking when forming a wiring by conductive material solution by droplet discharging, there is a threat that it becomes difficult to form a microscopic pattern due to dripping. In the case that a space between wirings is narrow, there is a threat that patterns are in contact with each other. According to the present invention, a microscopic pattern can be obtained by mixing a photosensitive material into conductive material solution to be precisely exposed to laser light and developed even if a wide pattern is formed.

For example, in manufacturing a large display, a bus line such as a gate wiring is preferably formed to have a wide width formed by droplet discharging, whereas a gate electrode is preferably formed to have a narrow width. In this instance, a gate wiring and a first gate electrode are formed by conductive material solution containing a positive photosensitive material, and laser light is selectively emitted to only a portion of the first gate electrode (portion one wishes to remove), then, the laser irradiated portion is developed, and then, a second gate electrode processed into thin by the development can be formed. In the case of forming the gate wiring and the first gate electrode by conductive material solution containing a negative photosensitive material, laser light is selectively emitted to only a portion of the gate wiring and the first gate electrode (portion one wishes to leave), and the laser irradiated portion is developed, and then, a second gate electrode processed into thin by the development can be formed.

Not only the gate electrode of a TFT, but also a source electrode, a drain electrode, an anode of a light-emitting element, a cathode of a light-emitting element, a power source line, a lead wiring, and the like can be formed.

Depending on a wavelength of laser light, the light can pass through a glass substrate. The reverse surface of the glass substrate can be exposed to the laser light. By exposing the reverse surface of the glass substrate to light, a conductive material at the periphery of an interface can be exposed to light in first. Accordingly, adhesiveness between a wiring and a base layer, or adhesiveness between a wiring and a substrate can be improved.

In the case of manufacturing a bottom gate TFT, a source electrode and a drain electrode can be formed in a self-aligning manner using a gate electrode as a mask by reverse surface exposure.

The invention provides a semiconductor device comprising: a gate wiring or a gate electrode formed over an insulating surface of a first substrate; a gate insulating film formed over the gate wiring or the gate electrode; a semiconductor layer including a channel formation region over the gate insulating film; a source electrode or a drain electrode formed over the semiconductor layer; and a pixel electrode formed over the source electrode or the drain electrode; wherein the channel formation region has a channel length that is the same as a width of the gate electrode and the gate electrode has a width that is the same as a space between the source electrode and the drain electrode.

In the foregoing structure, an active layer of the thin film transistor is an amorphous single crystalline semiconductor film added with hydrogen or a hydrogen halide, or a polycrystalline semiconductor film.

The present invention can be applied to any TFT structure. For example, a bottom gate (reverse staggered) TFT or a top gate (staggered) TFT can be used. Further, it is not limited to a single gate TFT, a TFT may be formed to be a multigate TFT having a plurality of channel formation regions; or a double gate TFT.

As an active layer of a TFT, an amorphous semiconductor film, a semiconductor film including a crystalline structure, a compound semiconductor film having an amorphous crystalline structure, and the like can be appropriately used. As the active layer of a TFT, the semiamorphous semiconductor film (microcrystalline semiconductor film) that has an intermediate structure between an amorphous structure and a crystalline structure (including single crystals and poly crystals); a stable third state with respect to free energy; and a crystalline region having a short-range order and lattice distortion can be used.

In each of the foregoing structure, the source electrode or the drain electrode contains a photosensitive material.

According to a pattern formation method for forming a conductive layer by droplet discharging, a pattern is formed according to the procedure, that is, a pattern formation material processed into particles is discharged, and the discharged material is fused by baking or fusion bonded to be solidified. Therefore, the pattern often in a polycrystalline state having many grain boundaries, whereas most patterns formed by sputtering or the like have a column structure.

A conductive layer formed by droplet discharging is a material containing resin. The resin is a material such as binder contained in a droplet that contains a conductive material. The material is capable of being discharged by ink jetting by mixing the resin, solvent, and nanoparticles of a metal.

In the foregoing structure, the semiconductor device comprises a first substrate, a second substrate, and a liquid crystal interposed between a pair of the first substrate and the second substrate. Alternatively, the semiconductor device comprises a plurality of light-emitting elements having a cathode, a layer containing an organic compound, an anode, and a thin film transistor.

In each of the foregoing structure, the semiconductor device is an image-voice two-way communications device or a versatile remote control device as illustrated in FIG. 33D as an example.

The present invention provides a method for manufacturing a semiconductor device comprising the steps of: forming a first conductive film pattern by discharging a conductive material containing a photosensitive material over an insulating surface of a substrate by droplet discharging; exposing selectively the first conductive film pattern to laser light; forming a second conductive film pattern having a narrower width than that of the first conductive film pattern by developing the exposed first conductive film pattern; forming a gate insulating film covering the second conductive film pattern; and forming a semiconductor film over the gate insulating film.

In the foregoing structure, the conductive material containing a photosensitive material contains an elementary substance of Ag, Au, Cu, Ni, Al, and Pt or a compound including the elementary substance.

In the foregoing structure, the photosensitive material is a negative type or a positive type photosensitive material.

The present invention provides a method for manufacturing a semiconductor device comprising the steps of: forming a gate electrode over an insulating surface of a substrate; forming a gate insulating film covering the gate electrode; forming a first semiconductor film over the gate insulating film; forming a second semiconductor film containing an impurity element imparting n-type or p-type conductivity over the first semiconductor film; forming a first conductive film pattern by discharging a conductive material containing a positive type photosensitive material by droplet discharging over a second semiconductor film; exposing the first conductive film pattern to laser light by emitting selectively laser light to a surface of the substrate; forming a source electrode and a drain electrode by developing the exposed first conductive film pattern; and etching the first semiconductor film and the second semiconductor film using the source electrode and the drain electrode as masks.

The present invention provides a method for manufacturing a semiconductor device comprising the steps of: forming a gate electrode over an insulating surface of a substrate; forming a gate insulating film covering the gate electrode; forming a first semiconductor film over the gate insulating film; forming a second semiconductor film containing an impurity element imparting n-type or p-type conductivity over the first semiconductor film; forming a first conductive film pattern by discharging a conductive material containing a negative type photosensitive material by droplet discharging over a second semiconductor film; exposing selectively the first conductive film pattern to laser light by emitting laser light to a reverse surface of the substrate using the gate electrode as a mask; forming a source electrode and a drain electrode in a self-aligning manner to have the same widths as that of the gate electrode by developing the exposed first conductive film pattern; and etching the first semiconductor film and the second semiconductor film using the source electrode and the drain electrode as masks.

A microscopic wiring pattern can be obtained by droplet discharging according to the present invention. The present invention can reduce drastically costs since a patterning process can be shortened and an amount of material can be reduced. Accordingly, the present invention can be applied to manufacture a large substrate.

BEST MODE FOR CARRYING OUT THE INVENTION

Hereinafter, embodiments of the present invention are explained.

Embodiment 1

FIGS. 1A to 2D illustrate a method for manufacturing an active matrix light-emitting display device having a channel etch type TFT as a switching element.

A base layer 11 for improving adhesiveness between a substrate 10 and a material layer that is formed later by droplet discharging is formed over the substrate 10. Since the base layer 11 may be formed to have an ultra thin thickness, the base layer is not always required to have a layered structure. The form of the base layer 11 can be considered as base pretreatment. Treatment such that a photocatalyst material (titanium oxide ($TiO_x$), strontium titanate ($SrTiO_3$), cadmium selenide (CdSe), potassium tantalate ($KtaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$)) is dropped over the whole surface by spraying or sputtering may be performed. Alternatively, treatment such that an organic material (polyimide, acrylic, or a coated insulating film using a material which has a skeleton formed by the bond of silicon (Si) and oxygen (O), and which includes at least one selected from the group consisting of hydrogen, fluoride, alkyl group, and aromatic hydrocarbon as the substituent) is selectively formed by ink jetting or sol-gel may be performed.

Here, an example in which base pretreatment for improving adhesiveness is performed in the case that a conductive material is discharged over the substrate is explained. However, the present invention is not limited thereto. $TiO_x$ depositing treatment may be performed to improve the adhesiveness between a material layer and another material layer in the case that a material layer (for example, an organic layer, an inorganic layer, or a metal layer) is formed by droplet discharging over another material layer (for example, an organic layer, an inorganic layer, or a metal layer) or over a discharged conductive layer. That is, in the case that a conductive material is discharged to be drawn by droplet discharging, it is desired that base pretreatment is interposed between the interface between an upper conductive material layer and a lower conductive material layer to improve their adhesiveness.

As the base layer 11, not only a photocatalyst material, but also 3d transition metals (Sc, Ti, Cr, Ni, V, Mn, Fe, Co, Cu, Zn, or the like), oxides thereof, nitrides thereof, oxynitrides thereof can be used.

As the substrate 10, a non alkali glass substrate manufactured by fusion technique or float technique such as barium borosilicate glass, alumino borosilicate glass, or alumino silicate glass; or a plastic substrate and the like having heat resistance that can resist a processing temperature of this manufacturing process can be used.

Figure 1A:
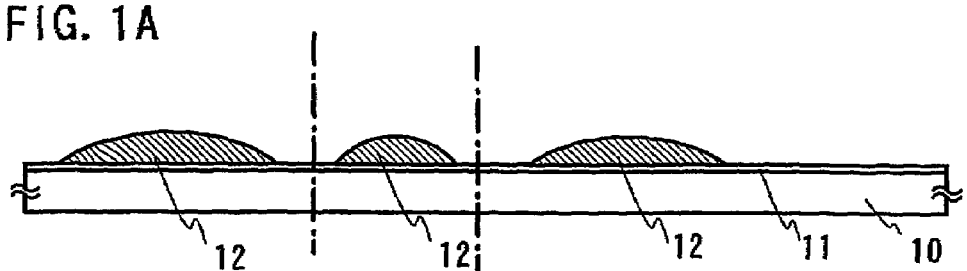
FIGS. 1A to 1E are cross-sectional views for showing a manufacturing process of an active matrix light-emitting device.

Then, conductive material solution is dropped by droplet discharging, typically, ink jetting to form a conductive pattern 12 (FIG. 1A). As a conductive material contained in the conductive material solution, gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), or aluminum (Al), alloys of the foregoing materials, dispersed nano particles of the foregoing materials, or silver halide fine particles can be used. Especially, a gate wiring is preferably has low resistance. Accordingly, the gate wiring is preferably made from a material formed by solving or dispersing gold, silver, or copper into solvent in consideration of specific resistance value. More preferably, silver or copper having low resistance is used. Further, in the case of using silver or copper, a barrier film is also provided to prevent impurities from dispersing. The solvent corresponds to esters such as butyl acetate, alcohols such as isopropyl alcohol, or organic solvent such as acetone. The surface tension and viscosity are appropriately adjusted by controlling the concentration of the solvent or by adding surface-active agent or the like.

Figure 16:
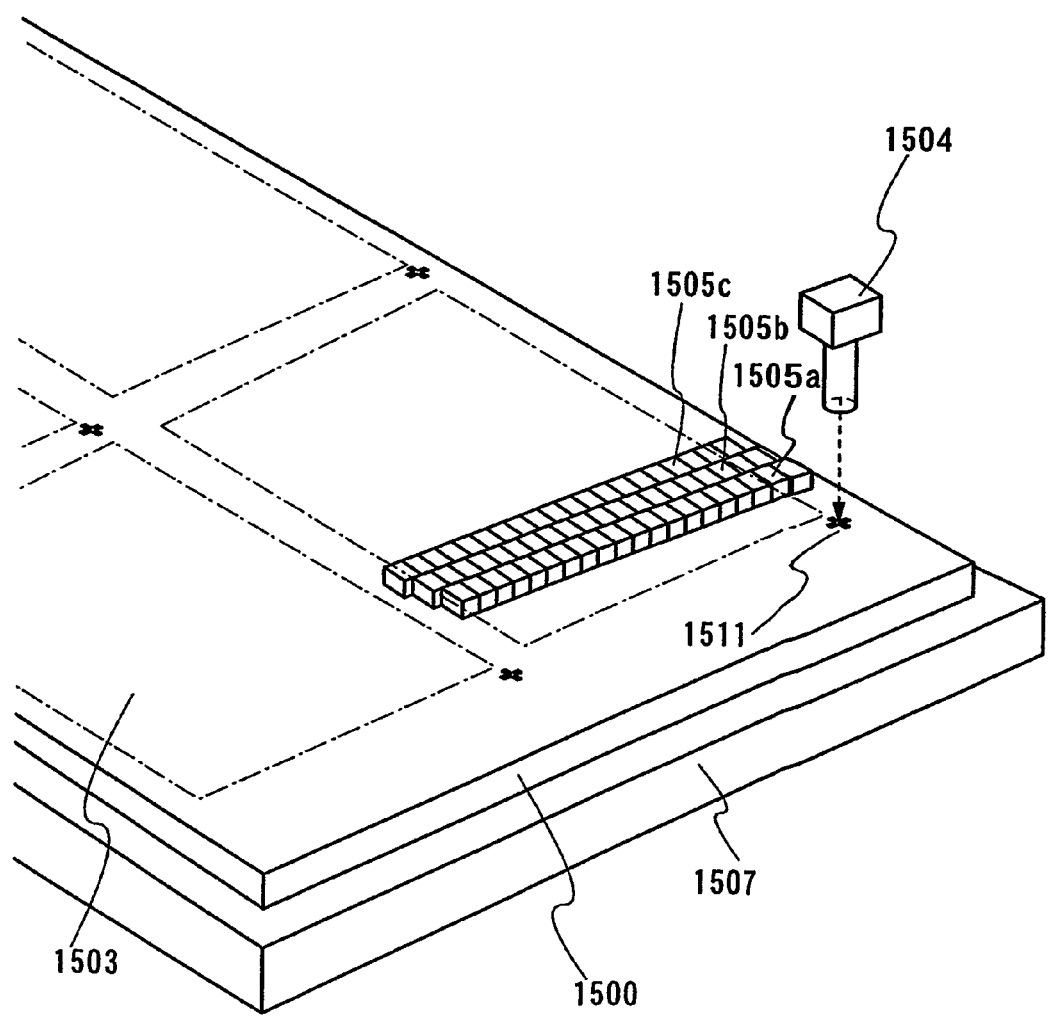
FIG. 16 is a perspective view of a droplet discharging device (Example 7)

FIG. 16 illustrates an example of a droplet discharging device.

In FIG. 16, reference numeral 1500 denotes a large substrate; 1504, an imaging means; 1507, a stage; 1511, a marker; and 1503, a region provided with one panel. Heads 1505a, 1505b, and 1505c having the same widths as that of one panel are equipped to the droplet discharging device to scan the panel by moving the stage in zigzags or back and forth and form appropriately a pattern of a material layer. The heads may have the same widths as that of the large substrate; however, operation becomes easier by matching the heads' widths to that of one panel as illustrated in FIG. 16. Further, to improve throughput, a material is preferably discharged while keeping the stage moving.

The heads 1505a, 1505b, 1505c, and the stage 1507 have preferably temperature control functions.

The space between the head (tip of a nozzle) and the large substrate is approximately 1 mm. By narrowing the space, target accuracy can be improved.

In FIG. 16, heads 1505a, 1505b, and 1505c brought into three lines in the scan direction may be capable of forming different layers respectively, or discharging the same materials. In the case that an interlayer insulating film is pattern formed by discharging the same materials by the three heads, the throughput is improved.

The droplet discharging device illustrated in FIG. 16 can scan the substrate 1500 by securing the heads and moving the substrate 1500, and scan the substrate 1500 by securing the substrate 1500 and moving the heads.

Each of the heads 1505a, 1505b, and 1505c of the droplet discharging means is connected to a controlling means. The heads can draw a pattern that is preliminarily programmed by controlling the controlling means by a computer. The amount of discharging is controlled by an applied pulse voltage. The timing of the drawing, for example, may be based on the marker formed over the substrate. Alternatively, the base point may be decided on the basis of the edge of the substrate. The base point is detected by an imaging means such as CCD, converted into a digital signal by an image processing means, and recognized by a computer to generate a control signal. Then, the control signal is sent to a controlling means. Of course, information on a pattern that should be formed over a substrate is stored in a storing medium. The control signal can be sent to the controlling means to control each head of the droplet discharging means respectively.

Figure 1B:
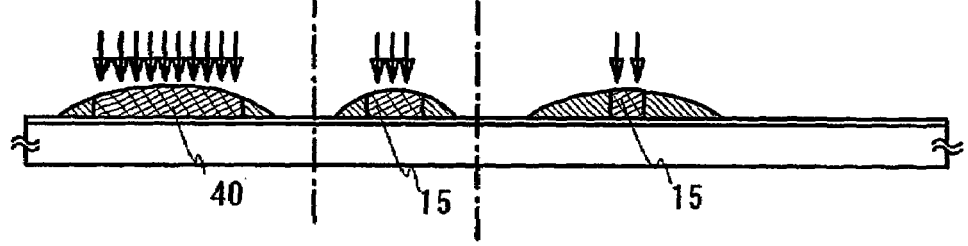

Then, a part of the conductive pattern is selectively irradiated with laser light to be exposed (FIG. 1B). A photosensitive material is preliminarily contained in a conductive material solution to be discharged to bring about a chemical reaction due to the laser light. As the photosensitive material, an example of using a negative type photosensitive material remaining a portion that is reacted chemically by laser light irradiation is described. By the laser light irradiation, a wiring having a precise pattern form, particularly, having a thin width can be obtained.

A laser beam drawing device is explained with reference to FIG. 4. A laser beam drawing device 401 comprises a personal computer (hereinafter, PC) 402 for executing various kinds of control in emitting a laser beam; a laser oscillator 403 for outputting a laser beam; a power source 404 of the laser oscillator 403; an optical system (ND filter) 405 for attenuating a laser beam; an acoustooptical modulator (AOM) 406 for modulating the intensity of laser light; a lens for enlarging and shrinking the cross-section of a laser beam; an optical system 407 composed of a mirror and the like for changing an optical path; a substrate moving mechanism 409 having an X stage and a Y stage; a D/A conversion portion 410 for digital-analog conversion of a control data outputted from the PC; a driver 411 for controlling the acoustooptical modulator 406 depending on analog voltage outputted from the D/A conversion portion; and a driver 412 for outputting a driving signal for driving the substrate moving mechanism 409.

As the laser oscillator 403, the laser oscillator capable of oscillating ultraviolet light, visible light, or infrared light can be used. As the laser oscillator, an excimer laser oscillator such as KrF, ArF, XeCl, or Xe; a gas laser oscillator such as He, He—Cd, Ar, He—Ne, or HF; a solid laser oscillator using crystals such as YAG, $GdVO_4$, $YVO_4$, YLF, or $YalO_3$ doped with Cr, Nd, Er, Ho, Ce, Co, Ti, or Tm; or a semiconductor laser oscillator such as GaN, GaAs, GaAlAs, or InGaAsP can be used. In the solid laser oscillator, a first harmonic to a fifth harmonic of a fundamental harmonic are preferably adopted.

Hereinafter, a method for exposing a photosensitive material to a laser beam direct drawing device is explained. The photosensitive material as used herein means a conductive material (including a photosensitive material) that is formed to be a conductive pattern.

Upon a substrate 408 mounting to a substrate moving mechanism 409, the PC 402 detects the position of the marker attached to the substrate by a camera outside of the drawing. Then, the PC 402 produces movement data for moving the substrate moving mechanism 409 based on the position data of the marker that is detected and draw pattern data that is preliminarily inputted. And then, a laser beam outputted from the laser oscillator 403 is attenuated by the optical system 405, and the laser light is controlled to have a predetermined quantity by the acoustooptical modulator 406 by means of the control of quantity of output light of the acoustooptical modulator 406 by the PC 402 via the driver 411. On the other hand, a laser beam outputted from the acoustooptical modulator 406 is varied its optical path and beam shape by the optical system 407, and condensed by a lens. Then, the laser beam is emitted to a photosensitive material formed over the substrate to expose the photosensitive material. Simultaneously, movement control of the substrate moving mechanism 409 is performed in X direction and Y direction according to the movement data produced by the PC 402. As a result, laser beam is emitted to a predetermined spot to expose a photosensitive material.

A part of the energy of the laser light emitted to the photosensitive material is converted into heat to react a part of the photosensitive material. Therefore, a width of a pattern becomes larger than that of a laser beam. Further, since laser light of a short wavelength can make it easier for beam diameter to be converted small, a laser beam of a short wavelength is preferably emitted to form a pattern having an extremely thin width.

The form of a laser beam spot on a surface of the photosensitive material is processed to have a point like shape, a round shape, an elliptical shape, a rectangular shape, or a line form (in a strict sense, an elongated oblong shape) by an optical system. The laser beam spot form may be a round shape. However, the laser beam spot form is preferably a line form, since the line form laser spot can form a pattern having an uniform width.

Figure 4:
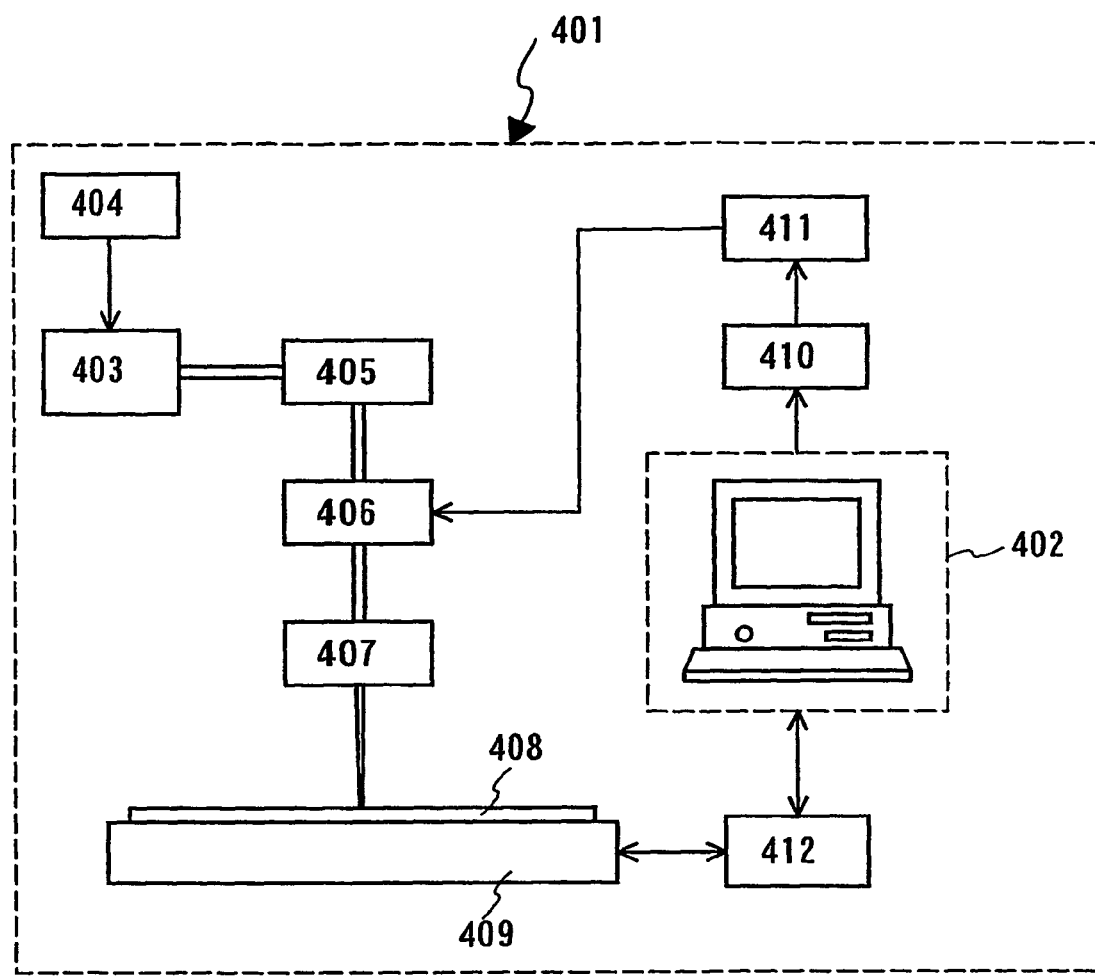
FIG. 4 shows a laser beam drawing device.

An example of the laser beam drawing device illustrated in FIG. 4 that exposes the substrate to laser light by emitting the laser light to the surface of the substrate is described. However, a laser beam drawing device with an appropriately varied optical system or substrate moving mechanism that exposes the substrate to laser light by emitting the laser light to the reverse surface of the substrate may be used.

Here, a laser beam is selectively emitted by moving the substrate. However, the present invention is not limited thereto. A laser beam can be emitted by scanning the laser beam into X-Y axis direction. In this instance, a polygon mirror or a galvanometer mirror is preferably used as the optical system 407.

Figure 1C:
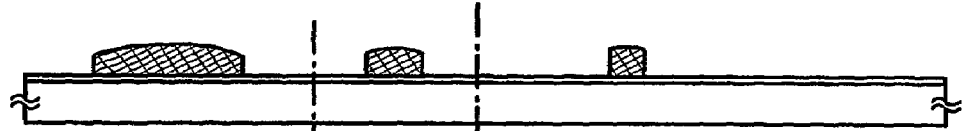

Then, development is performed by using etchant (or developing solution) to remove excess portions, and baked to form a metal wiring 15 serving as a gate electrode or a gate wiring (FIG. 1C).

A wiring 40 extending to a terminal portion is formed as well as the metal wiring 15 is formed. Although not shown, a power line may be formed to supply current to a light-emitting element. Further, a capacitor electrode or a capacitor wiring can be formed to form a retention volume if necessary.

In the case that a positive photosensitive material is used, the portion to be removed may be irradiated with laser light to yield a chemical reaction, and the portion reacted chemically may be dissolved by etchant.

Alternatively, exposure by laser light irradiation may be performed after a conductive material solution is dropped, indoor dried, and pre-baked.

Then, a gate insulating film 18, a semiconductor film 19, and an n-type semiconductor film 20 are sequentially deposited by plasma CVD or sputtering.

As the gate insulating film 18, a material containing silicon oxide, silicon nitride, or silicon oxynitride as its main component obtained by plasma CVD is used. The gate insulating film 18 may be formed to be a SiOx film including an alkyl group by droplet discharging using siloxane polymer and baking.

The semiconductor film is formed by an amorphous semiconductor film or a semiamorphous semiconductor film by a vapor growth method, a sputtering method, or a thermal CVD method, each of which uses a semiconductor material gas as typified by silane or germane.

As the amorphous semiconductor film, an amorphous silicon film that is obtained by plasma CVD using $SiH_4$ or a mixed gas of $SiH_4$ and $H_2$ can be used. As the semiamorphous semiconductor film, a semiamorphous silicon film that is obtained by plasma CVD using a mixed gas of $SiH_4$ diluted with $H_2$ by 3 to 1000 times, a mixed gas of $Si_2H_6$ and $GeF_4$ to have a gas flow ratio of 20 to 40:0.9 ($Si_2H_6$:$GeF_4$), a mixed gas of $Si_2H_6$ and $F_2$ or a mixed gas of $SiH_4$ and $F_2$ can be used. Further, the semiamorphous semiconductor film is preferably used since the semiamorphous semiconductor film can hold crystallinity due to an interface between the semiamorphous semiconductor film and a base film.

The crystallinity may be further improved by laser irradiation to the semiamorphous silicon film obtained by plasma CVD using a mixed gas of $SiH_4$ and $F_2$.

An n-type semiconductor film may be formed by an amorphous semiconductor film or a semiamorphous semiconductor film by plasma CVD using a silane gas and a phosphine gas. Although n-type semiconductor film 20 is preferably provided since the contact resistance between the semiconductor film and an electrode (formed in the subsequent process) becomes lower, the n-type semiconductor film 20 may be provided as-needed basis.

Figure 1D:
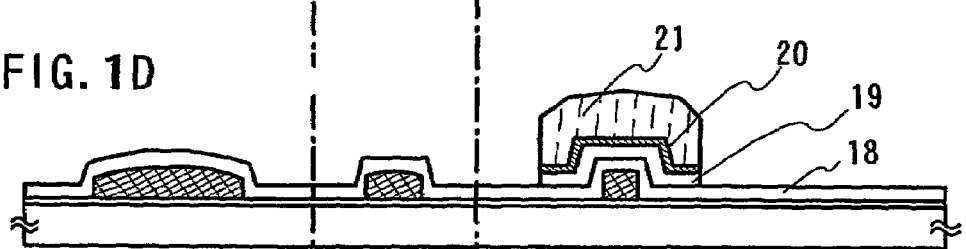

Then, a mask 21 is provided to obtain an island-like semiconductor film 19 and an n-type semiconductor film 20 by etching selectively the semiconductor film and the n-type semiconductor film (FIG. 1D). A method for forming the mask 21, droplet discharging or printing (relief printing, surface printing, gravure printing, screen printing, or the like) is used. A desired mask pattern may be directly formed by droplet discharging or printing. Alternatively, a high definition microscopic resist pattern may be formed by forming sketchily a resist pattern by droplet discharging or printing, and by exposing selectively the resist pattern to laser light.

By using a laser beam drawing device illustrated in FIG. 4, resist can be exposed to light. In this instance, the resist mask 21 may be formed by exposing a photosensitive material used as resist to laser light.

Then, after removing the mask 21, a mask (not shown) is provided, and the gate insulating film is selectively etched to form a contact hole. Further, the gate insulating film is removed at the edge portion. As a way of forming the mask, resist pattern is formed by a general photolithography technique or droplet discharging; or resist pattern is formed by coating positive type resist over a whole surface to be exposed to laser light and developed. In an active matrix light-emitting device, a plurality of TFTs is provided per pixel to have a connecting portion to an upper layered wiring via a gate electrode and a gate insulating layer.

Figure 1E:
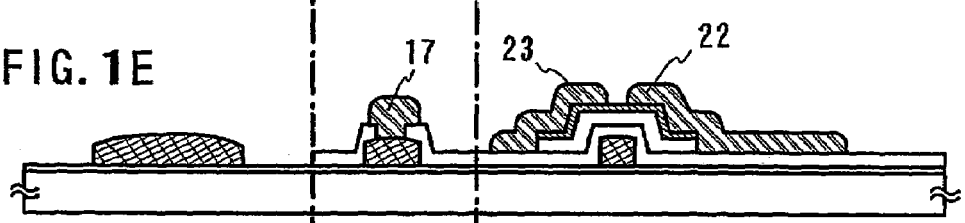

A source wiring or drain wiring 22, 23, and a leading out electrode 17 are formed by discharging selectively a composite containing a conductive material (Ag (silver), Au (gold), Cu (copper), W (tungsten), Al (aluminum), or the like) by droplet discharging. Similarly, a power line of supplying current to a light-emitting element is formed and a connecting wiring (not shown) is formed at a terminal portion (FIG. 1E).

Figure 2A:
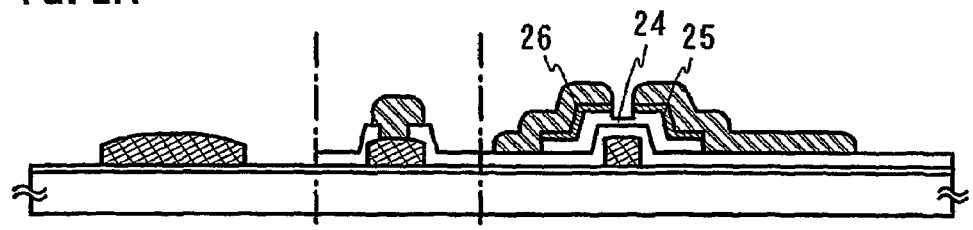
FIGS. 2A to 2D are cross-sectional views for showing a manufacturing process of an active matrix light-emitting device.

Then, the n-type semiconductor film and an upper layer of the semiconductor film are etched using the source wiring or drain wiring 22, 23 as masks to obtain the state illustrated in FIG. 2A. At this stage, a channel etch TFT having a channel formation region 24, a source region 26, and a drain region 25, each of which serves as an active layer, is completed.

Figure 2B:
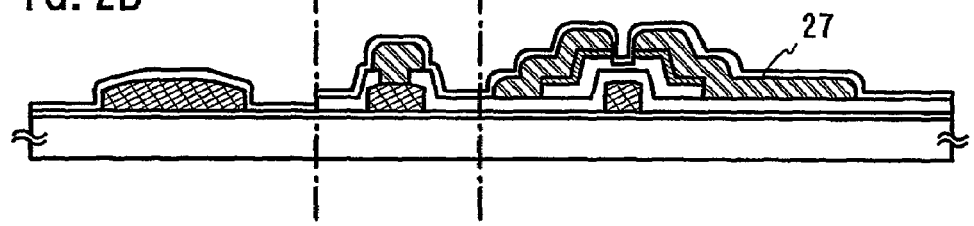

A protective film 27 to prevent the channel formation region 24 from being contaminated by impurities is formed (FIG. 2B). As a material for the protective film 27, a material containing silicon nitride or silicon nitride oxide as its main component formed by sputtering or plasma CVD is used. In this instance, an example of using the protective film is described, however, the protective film is not always necessarily provided.

Then, an interlayer insulating film 28 is selectively formed by droplet discharging. As a material for the interlayer insulating film 28, a resin material such as epoxy resin, acrylic resin, phenol resin, novolac resin, acryl resin, melamine resin, or urethane resin is used. An organic material such as benzocyclobutene, parylene, flare, or polyimide having permeability; a compound material formed by polymerization of siloxane polymer and the like; a composite material containing water-soluble homopolymer and water-soluble copolymer; or the like is formed by droplet discharging. A method for forming the interlayer insulating film 28 is not limited to the droplet discharging. Coating, plasma CVD, or the like can be used to form the interlayer insulating film 28 over a whole surface.

Then, the protective film is etched using the interlayer insulating film 28 as a mask to form a convex portion (pillar) 29 made from a conductive member over a part of the source wring or drain wiring 22, 23. The convex portion (pillar) 29 may be stacked by repeating discharging and baking of a composite containing a conductive material (Ag (silver), Au (gold), Cu (copper), W (tungsten), Al (aluminum), or the like).

Figure 2C:
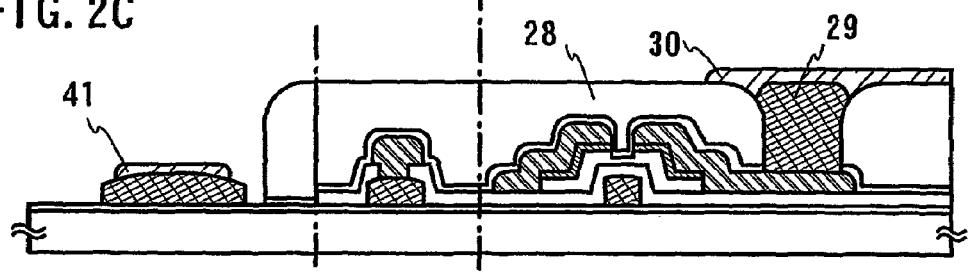

And then, a first electrode 30 being in contact with the convex portion (pillar) 29 is formed over the interlayer insulating film 28 (FIG. 2C). Similarly, a terminal electrode 41 being in contact with a wiring 40 is formed. Here, an example of n-channel type driving TFT is described, and so the first electrode 30 serves preferably as a cathode. In the case of passing light through the first electrode 30, the first electrode 30 is formed by forming a predetermined pattern made from a composite containing indium tin oxide (ITO), indium tin oxide containing silicon oxide (ITSO), zinc oxide (ZnO), tin oxide ($SnO_2$), or the like by droplet discharging or printing to be baked. Then, the first electrode 30 and a terminal electrode 41 are formed. In the case of reflecting light by the first electrode 30, a predetermined pattern is formed by a composite made from metal particles as its main component such as Ag (silver), Au (gold), Cu (copper), W (tungsten), or Al (aluminum) by droplet discharging to be baked. Then, the first electrode 30 and the terminal electrode 41 are formed. Alternatively, the first electrode 30 may be formed by sputtering a transparent conductive film or a light-reflective conductive film, and forming a mask pattern by droplet discharging, then, being etched.

Figure 2D:
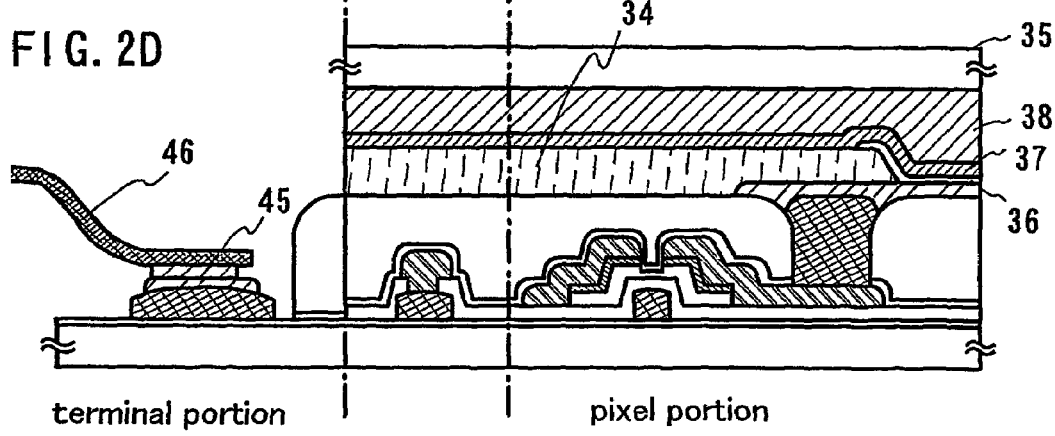
Figure 3:
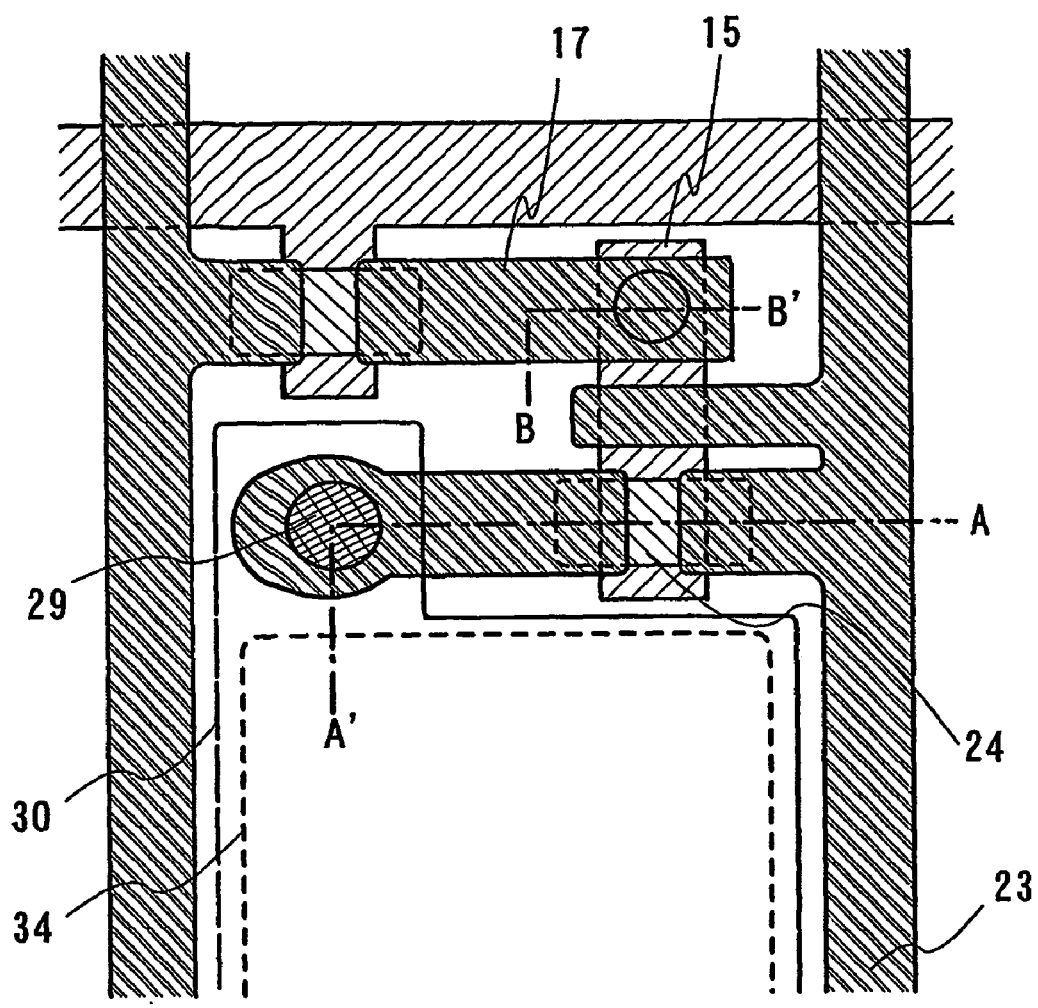
FIG. 3 is a top view of a pixel.

FIG. 3 illustrates an example of a top view of a pixel at the stage illustrated in FIG. 2C. In FIG. 3, a cross-section taken along line of A-A' corresponds to a cross-sectional view of the right side of the pixel portion in FIG. 2C, and a cross-section taken along line B-B' corresponds to the left side of the pixel portion in FIG. 2C. In FIG. 3, like components are denoted by like numerals as of FIGS. 1A to 2D. In FIG. 3, the portion to be an edge portion of a bank 34 that is formed subsequently is indicated by dotted line.

Since an example of providing the protective film 27 is shown, the interlayer insulating film 28 and the convex portion (pillar) 29 are formed separately. In the case that the protective film is not provided, the interlayer insulating film 28 and the convex portion (pillar) 29 can be formed by droplet discharging using one device.

Then, a bank 34 for covering the periphery of the first electrode 30 is formed. The bank 34 (also referred to as a bank) is made from a material containing silicon, an organic material, and a compound material. Further, a porous film can also be used for the bank 34. The bank 34 is preferably formed by a photosensitive material or non-photosensitive material such as acrylic or polyimide, since the bank 34 is formed to have a curved edge portion having a radius of curvature varying continuously, and an upper thin film of the bank 34 can be formed without step cut.

According to the foregoing processes, a TFT substrate used for a light-emitting display panel in which a bottom gate (also referred to as reverse staggered) and a first electrode are formed over the substrate 10.

Then, a layer serving as an electroluminescent layer, that is, a layer containing an organic compound 36 is formed. The layer containing organic compound 36 has a layered structure in which each layer is formed by vapor deposition or coating. For example, an electron transporting layer (electron injecting layer), a light-emitting layer, a hole transporting layer, and a hole injecting layer are sequentially formed over a cathode.

The electron transporting layer contains a charge injecting-transporting substance. As a charge injecting-transporting material having a high electron transporting property, a metal complex or the like having a quinoline skeleton or benzoquinoline skeleton such as tris(8-quinolinolate) aluminum (abbreviated $Alq_3$), tris(5-methyl-8-quinolinolate) aluminum (abbreviated $Almq_3$), bis(10-hydroxybenzo[h]-quinolinato) beryllium (abbreviated $BeBq_2$), bis(2-methyl-8-quinolinolate)-4-phenylphenolato-aluminum (abbreviated BAlq) can be nominated. As a material having a high hole transporting property, an aromatic amine compound (that is, the one having a benzene ring-nitrogen bond) such as 4,4'-bis[N-(1-naphthyl)-N-phenyl-amino]-biphenyl (abbreviated a-NPB), 4,4'-bis[N-(3-methylphenyl)-N-phenyl-amino]-biphenyl (abbreviated TPD), 4,4',4"-tris(N,N-diphenyl-amino)-triphenyl amine (abbreviated TDATA), and 4,4',4"-tris[N-(3-methylphenyl)-N-phenyl-amino]-triphenyl amine (abbreviated MTDATA) can be nominated.

Among the charge injecting-transporting material, as a material especially having a high electron injecting property, a compound of an alkali metal or an alkali earth metal such as lithium fluoride (LiF), cesium fluoride (CsF), calcium fluoride ($CaF_2$), or the like can be used. Besides, mixture of a material having a high electron transportation property such as $Alq_3$ and magnesium (Mg) such as alkali earth metal can be used.

A light-emitting layer is formed by a charge injecting-transporting material and a light-emitting material, each of which contains an organic compound and an inorganic compound. The light-emitting layer may include a layer made from one kind or a plurality kinds selected based on its molecularity from the group consisting of a low molecular weight organic compound, an intermediate molecular weight organic compound (that can be defined that an aggregate of an organic compound which does not have subliming property or dissolving property (preferably, an aggregate which has molecularity of 10 or less), or an organic compound which has a molecular chain length of 5 μm of less (preferably 50 nm or less)), and a high molecular weight organic compound, and an inorganic compound having a charge injecting-transporting property or a hole injecting transporting property can be combined with the light-emitting layer.

As a material for the light-emitting layer, various materials can be used. As a low molecular weight organic light-emitting material, 4-dicyanomethylene-2-methyl-6-(1,1,7,7-tetramethyljulolidyl-9-enyl)-4H-pyran (abbreviated DCJT), 4-dicyanomethylene-2-t-butyl-6-(1,1,7,7-tetramethyljulolidyl-9-enyl)-4H-pyran (abbreviated DPA), periflanthene, 2,5-dicyano-1,4-bis(10-metoxy-1,1,7,7-tetramethyljulolidyl-9-enyl)benzene, N,N'-dimethylquinacridone (abbreviated DMQd), coumarin 6, coumarin 545T, tris(8-quinolinolato) aluminum (abbreviated $Alq_3$), 9,9'-biantrile, 9,10-diphenylantracene (abbreviated DPA), 9,10-bis(2-naphtyl)anthracene (abbreviated DNA), or the like can be used. Another material may be used.

A high molecular weight organic light-emitting material has higher physical strength than that of a low molecular organic light-emitting material. Accordingly, a light-emitting element formed by the high molecular weight organic light-emitting material can hold high durability. A light-emitting element using the high molecular weight organic light-emitting material can be comparatively readily manufactured since a light-emitting layer can be formed by coating. The structure of the light-emitting element using the high molecular weight organic light-emitting material is basically the same as that using the low molecular weight organic light-emitting material, that is, cathode/organic light-emitting layer/anode. However, in the case that the light-emitting layer is formed by the high molecular weight organic light-emitting material, it is difficult to form a layered structure that is, formed in the case of using the low molecular weight organic light-emitting material. Therefore, the light-emitting element using the high molecular weight organic light-emitting material is formed to have a two layered structure, specifically, cathode/light-emitting layer/hole transporting layer/anode.

Emission color is determined by a material for the light-emitting layer. Accordingly, a light-emitting element exhibiting desired emission can be formed by selecting the material for the light-emitting layer. As a high molecular weight electroluminescent material used for forming the light-emitting layer, a polyparaphenylene vinylene material, a polyparaphenylene material, a polythiophene material, a polyfluorene material can be nominated.

As the polyparaphenylene vinylene material, a derivative of poly(paraphenylene vinylene) [PPV], poly(2,5-dialkoxy-1,4-phenylen vinylene) [RO-PPV], poly(2-(2'-ethyl-hexoxy)-5-methoxy-1,4-phenylene vinylene) [MEH-PPV], poly(2-dialkoxyphenyl)-1,4-phenylenevinylene) [ROPh-PPV], and the like are nominated. As the polyparaphenylene material, a derivative of polyparaphenylene [PPP], poly(2,5-dialkoxy-1,4-phenylene) [RO-PPP], poly(2,5-dihexoxy-1,4-phenylene), and the like are nominated. As the polythiophene material, a derivative of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCMHT], poly(3,4-dicyclohexylthiophene) [PDCHT], poly[3-(4-octylphenyl)-thiophene] [POPT], poly[3-(4-octylphenyl)-2,2-bithiophene], [PTOPT], and the like are nominated. As the polyfluorene material, a derivative of polyfluorene [PF], poly(9,9-dialkylfluorene) [PDAF], poly(9,9-dioctylfluorene) [PDOF], and the like are nominated.

An injecting property of holes from the anode can be improved by interposing a high molecular weight organic light-emitting material having a hole transporting property between the anode and a high molecular weight organic light-emitting material having a light-emitting property. Generally, the high molecular weight organic fight-emitting material having a hole transporting property and an acceptor material dissolved in water is coated by spin coating. The high molecular weight organic light-emitting material having a hole transporting property is not dissolved in organic solvent, accordingly, the material can be stacked over the organic light-emitting material having a light-emitting property. As the high molecular weight organic light-emitting material having a hole transporting property, mixture of PEDOT and camphoric sulfonic acid (CSA) as an acceptor material, mixture of polyaniline [PANI] and polystyrene sulfonic acid [PSS] as an acceptor material, and the like can be nominated.

Besides the foregoing singlet excited light-emitting material, a triplet excited material containing a metal complex or the like can be used for the light-emitting layer. For example, among a red emitting pixel, a green emitting pixel, and a blue emitting pixel; a red emitting pixel having comparative short half-brightness life is formed by a triplet excited light-emitting material and the other are formed by singlet excited light-emitting materials. The triplet excited light-emitting material has a characteristic that it requires lower power consumption than that of the singlet excited light-emitting material to obtain a certain level of luminance since the triplet excited light-emitting material has high luminous efficiency. In the case that the triplet excited light-emitting material is used for forming the red emitting pixel, the reliability can be improved since the light-emitting element requires a small amount of current. To reduce power consumption, the red emitting pixel and the green emitting pixel may be formed by the triplet excited light-emitting material, and the blue emitting pixel may be formed by a single excited light-emitting material. The power consumption of a green light-emitting element that has high visibility for human can be reduced by using the triplet excited light-emitting material for forming the green light-emitting element.

As an example for the triplet excited light-emitting material, a material using a metal complex as a dopant such as a metal complex including platinum that is the third transition element as a central metal or a metal complex including iridium as a central metal is well known. The triplet excited light-emitting material is not limited to these compounds. A compound that has the foregoing structure and that has an element belonging 8 to 10 groups in the periodic table as a central metal can be used.

The hole transporting layer contains a charge injecting and transporting material. As a material having a high hole injecting property, for example, metal oxide such as molybdenum oxide (MoOx), vanadium oxide (VOx), ruthenium oxide (RuOx), tungsten oxide (WOx), manganese oxide (MnOx), or the like can be nominated. Besides, a phthalocyanine compound such as phthalocyanine (abbreviated $H_2Pc$) or copper phthalocyanine (CuPc) can be nominated.

Before forming the layer containing an organic compound 36, plasma treatment in the presence of oxygen or heat treatment in vacuum atmosphere is preferably performed. In the case of using vapor deposition, an organic compound is vaporized by resistance heating, and scattered toward a substrate by opening a shutter in depositing the organic compound. The vaporized organic compound is scattered upward and deposited over a substrate through an opening portion provided to a metal mask. To realize full color display, alignment of a mask may be performed per emission color (R, G, and B).

A light-emitting layer may have the structure in which light-emitting layers having different emission wavelength bands are respectively provided to each pixel for realizing full color display. Typically, light-emitting layers corresponding to color of R (red), G (green), and B (blue) are formed. In this instance, color purity can be improved and a pixel portion can be prevented from being a mirror surface (reflection) by providing a filter (colored layer) transparent to light in each emission wavelength region at the light emission side of the pixel. By providing the filter (colored layer), a circularly-polarized light plate or the like that is conventionally required becomes not required, further, light can be emitted from the light-emitting layer without loss of light. Moreover, color changes occurred in the case of viewing obliquely the pixel portion (display screen) can be further reduced.

Alternatively, full color display can be realized by using a material exhibiting a monochromatic emission as the layer containing an organic compound 36, and combining a color filter or color conversion layer without patterning. For example, in the case that an electroluminescent layer exhibiting white or orange emission is formed, full color display can be realized by providing separately a color filter, a color conversion layer, or a combination of the color filter and the color conversion layer at the light emission side of the pixel. The color filter or the color conversion layer may be formed, for example, over a second substrate (sealing substrate) and pasted onto another substrate. Further, as mentioned above, all of the material exhibiting monochromatic emission, the color filter, and the color conversion layer can be formed by droplet discharging.

To form a light-emitting layer that exhibits white emission, for example, $Alq_3$, $Alq_3$ partly doped with Nile red, $Alq_3$, p-EtTAZ, TPD (aromatic diamine) are deposited sequentially by vapor deposition. In the case that the light-emitting layer is formed by spin coating, the material is preferably baked by vacuum heating after being coated. For example, poly(ethylene dioxythiophene)/poly(styrene sulfonate) solution (PEDOT/PSS) acts as the hole injecting layer may be coated over a whole surface and baked, and polyvinylcarbazole (PVK) doped with pigments (1,1,4,4-tetraphenyl-1,3-butadiene (abbreviated TPB), 4-dicyanomethylene-2-methyl-6-(p-dimethylamino-styryl)-4H-pyran (DCM1), Nile red, coumarin 6, or the like) acts as the light-emitting layer may be coated over a whole surface and baked.

The light-emitting layer may be formed by a single layer besides a multilayer as mentioned above. In this instance, the light-emitting layer may be made from polyvinylcarbazole (PVK) with the hole transporting property dispersed with a 1,3,4-oxadiazole derivative (PBD) with the electron transporting property. Further, white emission can be obtained by dispersing PBD of 30 wt % as the electron transporting material and dispersing an appropriate amount of four kinds of pigments (TPB, coumarin 6, DCM1, and Nile red).

Above mentioned materials for forming the layer containing an organic compound are illustrative only. The light-emitting element can formed by stacking each functional layer such as a hole injecting-transporting layer, a hole transporting layer, a, electron injecting-transporting layer, an electron transporting layer, a light-emitting layer, an electron blocking layer, and a hole blocking layer. A mixed layer or mixed junction of the foregoing layers may be formed. The structure of the light-emitting layer is capable of being varied. Therefore, instead of providing a specified electron injecting region or light emitting region, modifications of the structure such as providing an electrode in order to be used for the electron injecting region or the light emitting region, or providing a dispersed light-emitting material can be allowed unless otherwise such modifications depart from the scope of the present invention.

Needless to say, monochromatic emission display can be performed. For example, an area color type light-emitting display device can be formed by utilizing monochromatic emission. A passive matrix type display portion is suitable for the area color type display device. The display device can display mainly texts or symbols.

Then, a second electrode 37 is formed. The second electrode 37 serving as an anode of the light-emitting element is formed by a transparent conductive film, which can transmit a light, for example, by ITO, ITSO, or mixture of indium oxide mixed with zinc oxide (ZnO) of 2 to 20%. The light-emitting element has the structure in which the layer containing an organic compound 36 is interposed between the first electrode and the second electrode. A material for the first electrode and the second electrode should be selected in consideration of a work function. Either the first electrode or the second electrode is capable of being an anode or a cathode according to a pixel structure.

The light-emitting element formed by the foregoing materials emits light under forward bias. A pixel of a display device formed by using the light-emitting element can drive by either a passive matrix driving technique or an active matrix driving technique. At any rate, each pixel is emitted by applying forward bias at a specified timing. Further, the respective pixels are in non-emission state for a certain period. The reliability of the light-emitting element can be improved by applying reverse bias in the non-emission state. The light-emitting element may be in a deterioration mode of lowering emission intensity under a regular driving condition or may be in a deterioration mode of lowering apparently luminance due to the expansion of a non-emission region within the pixel. The deterioration progression can be delayed by AC driving to apply forward bias and reverse bias, which leads to the improvement of the reliability of the light-emitting device.

An auxiliary electrode may be provided over a part of the second electrode that does not serve as a light-emitting region to lower the resistance of the second electrode 37.

A protective layer for protecting the second electrode 37 may be formed. For example, a protective film can be formed by forming a silicon nitride film by a discotic target made from silicon in a deposition chamber of nitrogen atmosphere or atmosphere including nitrogen and argon. Further, a thin film containing carbon as its main component (a DLC film, a CN film, or an amorphous carbon film) can be formed as the protective film and other deposition chamber using CVD may be provided. A diamond like carbon film (also referred to as a DLC film) can be formed by plasma CVD (typically, RF plasma CVD, micro wave CVD, electron cyclotron resonance (ECR) CVD, heat filament CVD, or the like), combustion-flame, sputtering, ion beam deposition, laser deposition, or the like. Hydrogen gas and hydrocarbon gas ($CH_4$, $C_2H_2$, $C_6H_6$, or the like) are used as a reaction gas for deposition. The reaction gases are ionized by glow discharging, and the ions are made accelerated collide to a cathode applied with negative self-bias, then, the DLC film is deposited. Further, the CN film may be formed by using $C_2H_4$ gas and $N_2$ gas as reaction gas. In addition, the DLC film and the CN film are insulating films transparent or semitransparent to visible light. The term "transparent to visible light" means having a transmittance of 80 to 100% for visible light. The term "semi-transparent to visible light" means having a transmittance of 50 to 80% for visible light. The protective film is not always necessarily provided.

Then, the sealing substrate 35 is pasted by sealant (not shown) to seal the light-emitting element. The space surrounded by the sealant is filled with transparent filler 38. The filler 38 is not especially limited. Any material can be used as long as it has a light-transmitting property. Here, high heat-resistant UV epoxy resin (manufactured by Electrolite Cooperation: 2500 Clear) having refractivity of 1.50, viscosity of 500 cps, shore D hardness of 90, tensil intensity of 3000 psi, Tg point 150° C., volume resistance of $1\times10^{15}$ Ωcm, withstand voltage of 450 V/mil is used. Filling the filler 38 between a pair of substrates can improve the whole transmittance.

Lastly, the FPC 46 is pasted onto the terminal electrode 41 by an anisotropic conductive film 45 in accordance with the known method (FIG. 2D).

According to the foregoing processes, an active matrix light-emitting device can be manufactured.

Figure 10:
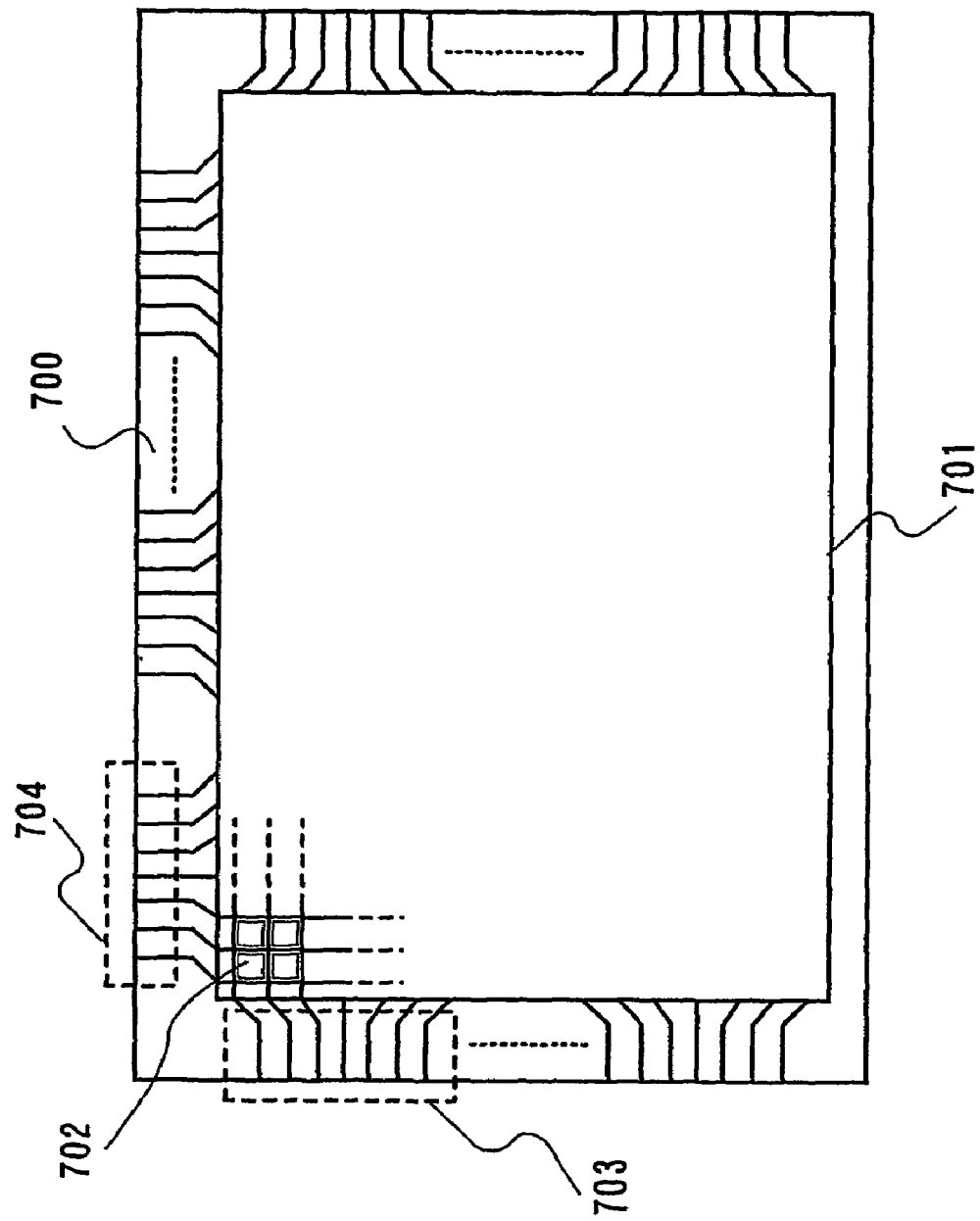
FIG. 10 is a top view of a light-emitting display device according to the present invention (Embodiment 1)

FIG. 10 illustrates a top view for showing an example of an EL display panel structure. FIG. 10 illustrates a structure of a light-emitting display panel that controls a signal to be inputted to a scanning line and a signal line by an external driver circuit. A pixel portion 701 composed of pixels 702 in a matrix configuration over a substrate 700 having an insulating surface, a scanning line side input terminal 703, and a signal line side input terminal 704 are formed. The number of pixels may be set according to various specifications, for example, 1024×768×3 (RGB) for XGA, 1600×1200×3 (RGB) for UXGA, or 1920×1080×3 (RGB) in case of corresponding to full spec high vision.

The pixels 702 are arranged in a matrix configuration by crossing scanning lines extending from the scanning line side input terminal 703 and signal lines extending from the signal line side input, terminal 704. Each of the pixels 702 is provided with a switching element and a pixel electrode that connects to the switching element. A typical example of the switching element is a thin film transistor (TFT). Each of the pixels can be independently controlled by signals inputted from outside by connecting the scanning line to a gate electrode side of the TFT and connecting a source or a drain to the signal lines.

In the case of forming the first electrode by a transparent material and forming the second electrode by a metal material, a structure of emitting light through the substrate 10, that is, a bottom emission type is formed. Alternatively, in case of forming the first electrode by a metal material and forming the second electrode by a transparent material, a structure of emitting light through the sealing substrate 35, that is, a top emission type is formed. Further alternatively, in case of forming the first and second electrodes by transparent materials, a structure of emitting light through both of the substrate 10 and the sealing substrate 35. The present invention may appropriately adopt any one of the foregoing structures.

As mentioned above, a microscopic pattern can be formed by exposing the conductive film pattern using droplet discharging to laser light and developing in this embodiment. By forming various patterns directly over the substrate by droplet discharging, an EL display panel can be readily manufactured even if a fifth generation and later glass substrate having a side of over 1000 mm.

This embodiment explains a process that does not perform spin coating and that does not perform a light exposure process using a photo mask as much as possible. However, the present invention is not limited thereto, a part of the patterning can be performed by a light exposure process using a photo mask.

Embodiment 2

Embodiment 1 explains an example of exposing a gate wiring by a laser beam drawing device. Here, an example of a process that uses a laser beam drawing device for forming a source wiring or a gate wiring with reference to FIG. 5.

The process differs slightly from that explained in Embodiment 1, and so the same part of the process is not further explained for simplification.

Figure 5A:
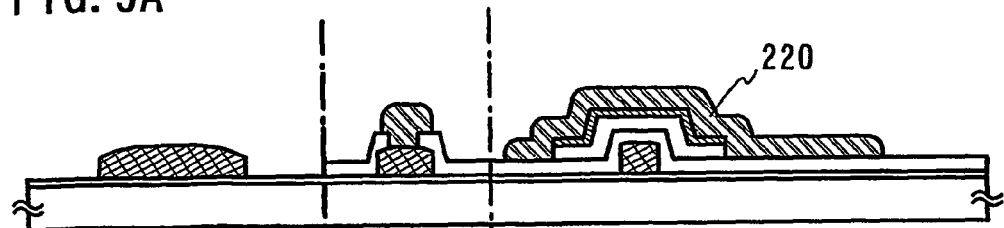
FIGS. 5A to 5D show a manufacturing process of a light-emitting device (Embodiment 2)

Similar to Embodiment 1, up to a patterning process of a semiconductor film is performed. Then, a conductive film pattern 220 is formed by droplet discharging (FIG. 5A). A positive type photosensitive material is mixed into the conductive film pattern 220.

Figure 5B:
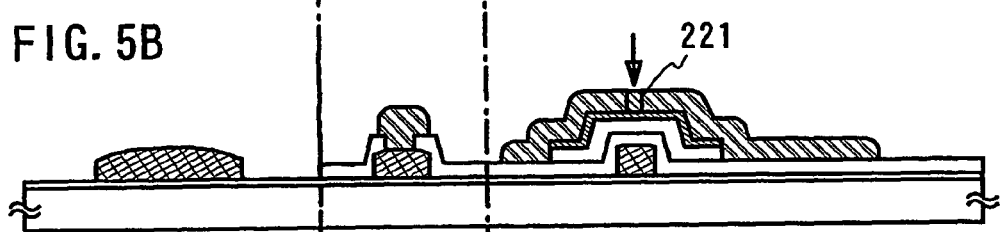

Then, the conductive film pattern 220 is selectively exposed to laser light by using the device illustrated in FIG. 4 (FIG. 5B). A portion 221 that is irradiated with the laser light brings about chemical reactions.

Figure 5C:
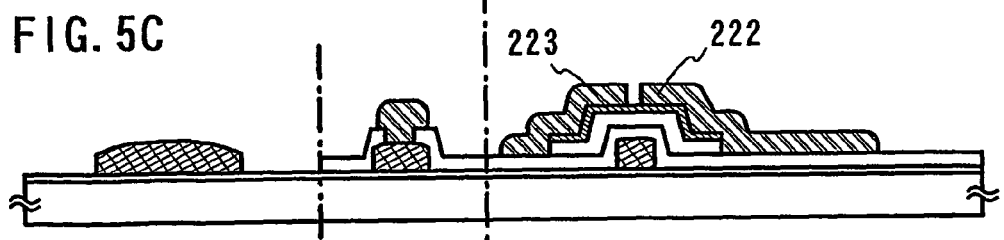

The portion 221 that is irradiated with laser light by developing is removed to form a source wiring or a drain wiring 222, 223 (FIG. 5C).

Since the space between the source wiring and the drain wiring 222 or 223 is determined by laser irradiation, a practitioner can freely set the space. Setting freely the space between the source wiring and the drain wiring 222 or 223 is useful since the space determines the length (L) of a channel formation region.

Figure 5D:
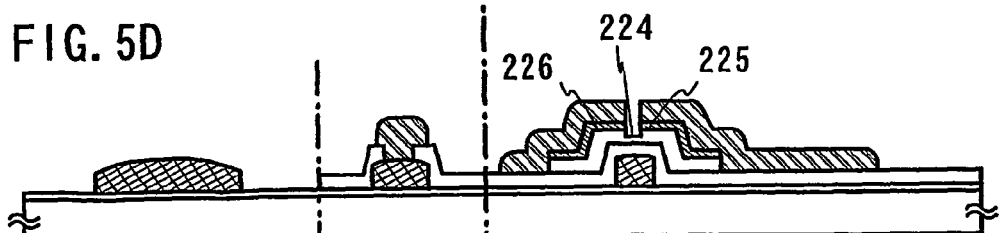

The state illustrated in FIG. 5D is obtained by etching an n-type semiconductor film and a top layer portion of the semiconductor film using the source wiring or the drain wiring 222, 223 as masks. At this state, a channel etch TFT having a channel formation region 224, which serves as an active layer, a source region 226, and a drain region 225, is completed. The subsequent processes are the same as that explained in Embodiment 1, and will not be further explained.

In the case of forming the source wiring or the drain wiring by using droplet discharging, the source wiring and the drain wiring should be spaced to some extent in consideration of a margin for dripping or the like. Therefore, the length (L) of the channel formation region is difficult to be reduced. As explained in this embodiment, the channel formation region can be reduced, for example, to have the length (L) of 10 μm or less.

This embodiment can be freely combined to Embodiment 1.

Embodiment 3

FIGS. 6A to 6D illustrate examples of other processes. In FIGS. 6A to 6D, an example of using a planarizing film as a gate insulating film 260. Other components are the same as those explained in Embodiment 2.

After forming a gate electrode, the gate insulating film 260 having a plane surface is formed by sputtering, a planarizing treatment of a film obtained by chemical vapor deposition, or coating method. The planarizing treatment is typified by chemical mechanical polishing treatment.

In the case of manufacturing a light-emitting display device having a large screen, a gate wiring having low resistance may be preferably formed to have a thick thickness, for example, of 1 to 5 μm. When a cross-sectional area is increased by increasing the thickness of a wiring, difference in level between the surface of the substrate and the surface of the thick film wiring is produced, which leads to deterioration of coverage. The plane gate insulating film 260 is useful in case of increasing the thickness of the gate wiring.

Generally, the substrate surface provided with a metal wiring has protrusion by an increment of the thickness of the metal wiring. In this embodiment, the substrate surface provided with the plane gate insulating film 260 is plane. Accordingly, coverage deterioration or the like is hardly occurred even if the thickness of a semiconductor film is reduced.

Similar to Embodiment 1, a semiconductor film and an n-type semiconductor film are sequentially formed. Then, a mask is provided to etch selectively the semiconductor film and the n-type semiconductor film. Accordingly, an island like semiconductor film and an n-type semiconductor film can be obtained.

Figure 6A:
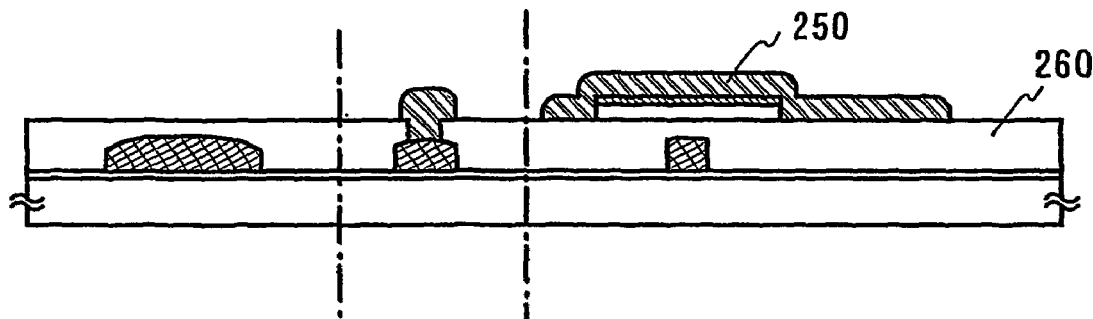
FIGS. 6A to 6D show a manufacturing process of a light-emitting device (Embodiment 3)

Similar to Embodiment 2, a conductive film pattern 250 is formed by droplet discharging (FIG. 6A).

Figure 6B:
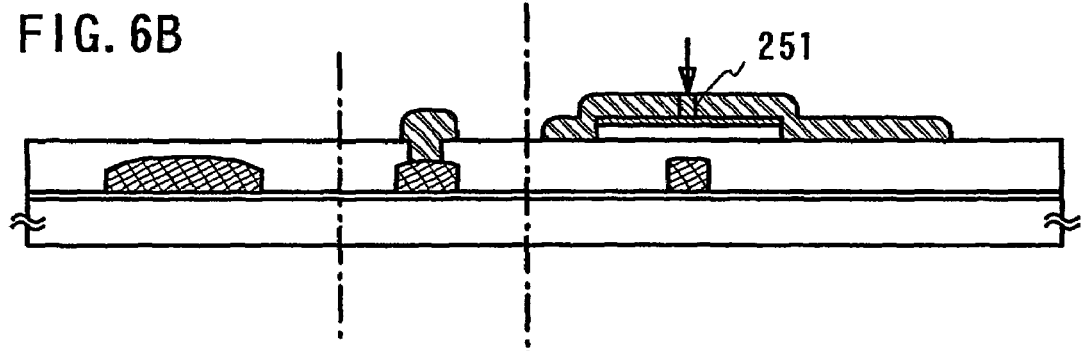

Then, the conductive film pattern 250 is selectively exposed to laser light by using the device illustrated in FIG. 4 (FIG. 6B).

Figure 6C:
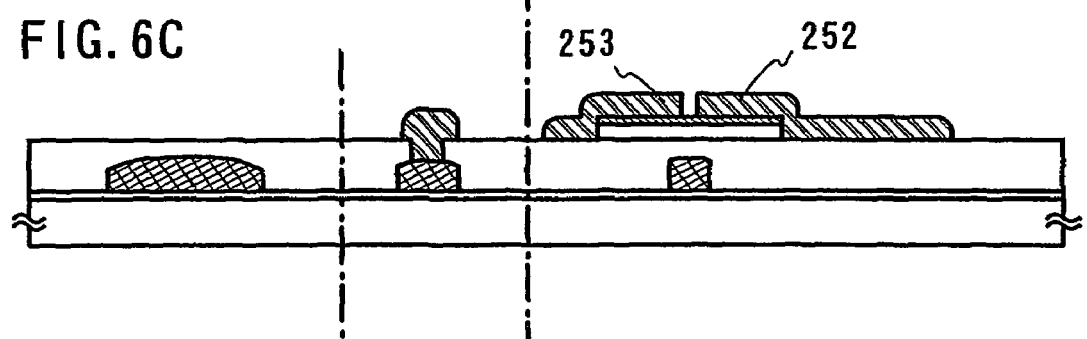

The portion 251 that is irradiated with laser light by developing is removed to form a source wiring or a drain wiring 252, 253 (FIG. 6C).

Figure 6D:
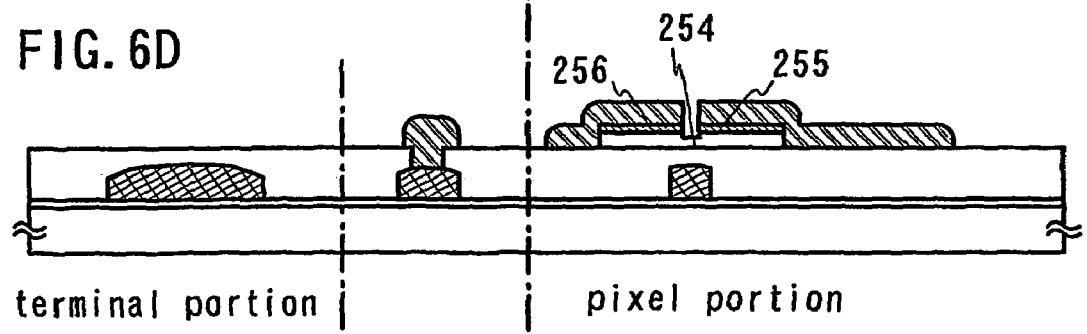

The state illustrated in FIG. 6D is obtained by etching an n-type semiconductor film and a top layer portion of the semiconductor film using the source wiring, the drain wiring 252, 253 as masks. At this state, a channel etch TFT, which is provided with a channel formation region 254 that serves as an active layer, a source region 256, and a drain region 255 is completed. The subsequent processes are the same as that explained in Embodiment 1, and will not be further explained.

This embodiment can be freely combined to Embodiment 1 or 2.

Embodiment 4

FIGS. 7A to 7D illustrate a process of forming a source wiring or a drain wiring using a gate electrode as a mask in a self-aligning manner by light exposure of a reverse-surface.

A base insulating film 301 is formed over a substrate. As the base insulating film 301, a base insulating film formed by an insulating film such as a silicon oxide film, a silicon nitride film, or a silicon oxynitride film is used. The base insulating film may not be formed when it is not required.

A conductive film having a thickness of 100 to 600 nm is formed by sputtering over the base insulating film 301. The conductive film may be formed by an element selected from the group consisting of Ta, W, Ti, Mo, Al, and Cu; a single layer made form an alloy material or a compound material containing the foregoing elements as its main component, or a laminated layer of the foregoing single layers. Alternatively, a semiconductor film as typified by a polycrystalline silicon film doped with an impurity element such as phosphorus may be used as the conductive film.

Then, a resist mask is formed by using a photo mask and etched by dry etching or wet etching. The conductive film is etched by the etching treatment to obtain a gate electrode 302 as illustrated in FIG. 7A.

Similar to Embodiment 1, a gate insulating film, a semiconductor film, and an n-type semiconductor film are sequentially deposited by plasma CVD or sputtering. Then, a mask is provided to selectively etch the semiconductor film and the n-type semiconductor film. Accordingly, an island like semiconductor film and an island like n-type semiconductor film are obtained.

Figure 7A:
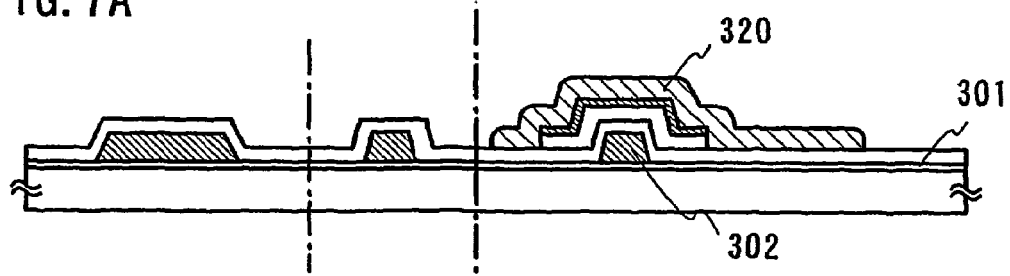
FIGS. 7A to 7D show a manufacturing process of a light-emitting device (Embodiment 4)

Similar to Embodiment 2, a conductive pattern 320 is formed by droplet discharging (FIG. 7A). A negative type photosensitive material is mixed into the conductive pattern 320.

Figure 7B:
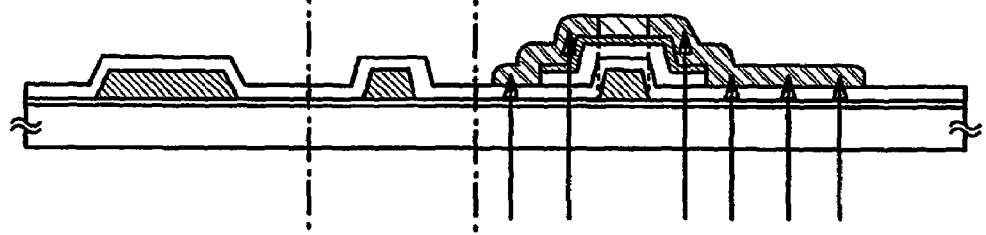

Then, the reverse surface of the conductive pattern 320 is exposed to laser light in a self-aligning manner by using a laser beam drawing device (FIG. 7B). The portion irradiated with laser light in the conductive pattern brings about chemical reactions. A substrate that is transparent to light is used. Laser light having a wavelength that passes through the substrate is selected. Laser annealing can be performed in the case that laser light can be emitted to the semiconductor film or the n-type semiconductor film depending on the wavelength of the laser light.

Figure 7C:
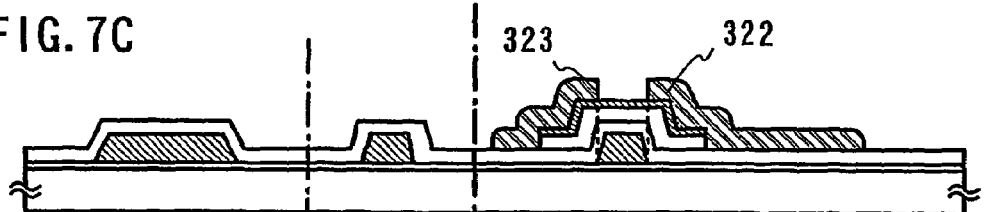

And then, developing is performed, and a portion that is not irradiated with the laser light is removed to form a source wiring or a drain wiring 322, 323 (FIG. 7C).

The space between the source wiring and the drain wiring 322 or 323 is determined by the width of the gate electrode.

Figure 7D:
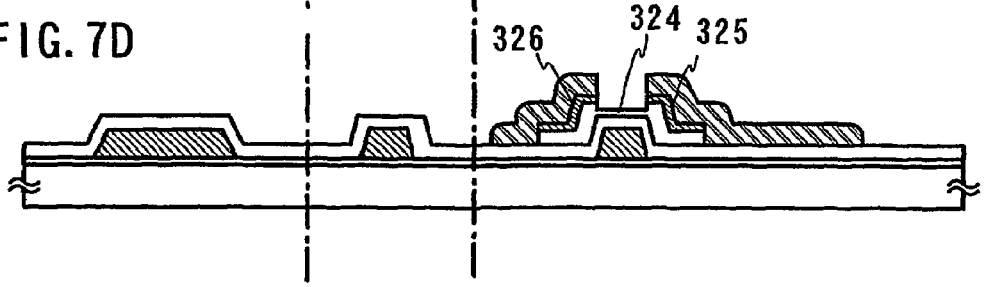

The state illustrated in FIG. 7D is obtained by etching an n-type semiconductor film and a top layer portion of the semiconductor film using the source wiring or the drain wiring 322, 323 as masks. At this state, a channel etch TFT, which is provided with a channel formation region 324 that serves as an active layer, a source region 326, and a drain region 325 is completed. The subsequent processes are the same as that explained in Embodiment 1, and will not be further explained.

Since a channel formation region of a TFT is formed in a self-aligning manner according to the present invention, patterning difference is not produced and variation of TFT can be reduced. According to the present invention, a manufacturing process can be simplified.

This embodiment can be freely combined with Embodiment 1, 2, or 3.

Embodiment 5

A method for manufacturing an active matrix light-emitting display device having a channel stop TFT as a switching element is explained in this embodiment.

Figure 8:
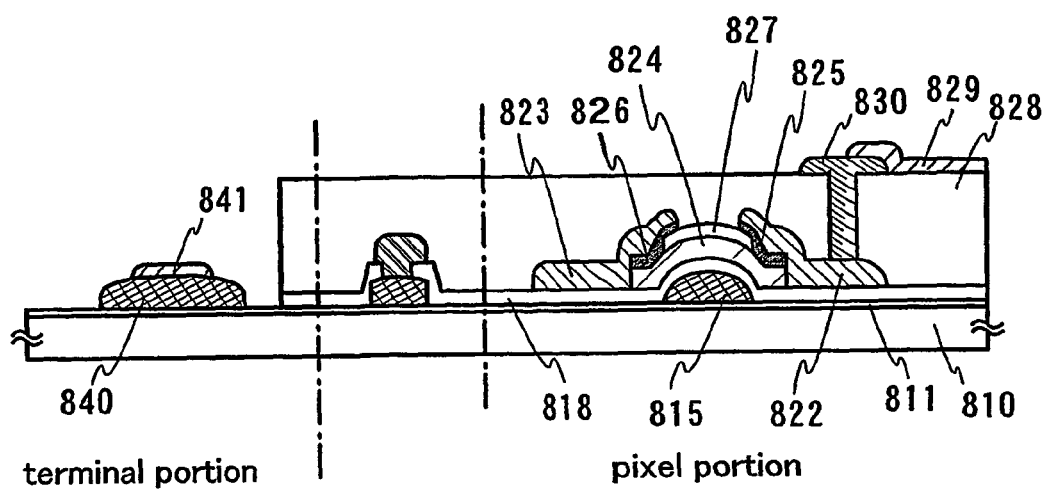
FIG. 8 is a cross-sectional view of a channel stop TFT (Embodiment 5)

As illustrated in FIG. 8, a base film 811 is formed over a substrate 810 as in the case with Embodiment 1. As the base film 811, $TiO_2$ that is a photocatalyst material is formed over the whole of the substrate.

Then, light having a wavelength that causes photocatalyst action is emitted to the desired region, that is, $TiO_2$ at the edge of a region provided with a wiring in this embodiment, and an irradiated region is formed. Laser light can be used as the light having a wavelength that causes photocatalyst action. The light is selectively emitted to a desired region by using the device illustrated in FIG. 4. Accordingly, the irradiated region becomes to have an oil-shedding property.

A conductive film serving as a gate electrode 815 is formed by dropping a dot formed by mixing a conductor into solvent from or to a non irradiated region by ink jetting. Simultaneously, a terminal electrode 840 is formed at a terminal portion.

Then, a gate insulating film 818 is formed to cover the gate electrode. Thereafter, a semiconductor film is formed by plasma CVD. And then, in order to form a channel protective film 827, an insulating film is formed by, for example, plasma CVD to be patterned at a desired region to have a desired form. In this instance, the channel protective film 827 can be formed by exposing the reverse surface of a substrate to light using the gate electrode as a mask. Further, the channel protective film may be formed by discharging polyimide, polyvinyl alcohol, or the like by drops. As a result, an exposure process can be eliminated.

Thereafter, a semiconductor film having one conductivity type, for example, an n-type semiconductor film is formed by plasma CVD or the like.

Then, a mask made from polyimide is formed by ink jetting over the n-type semiconductor film. A semiconductor film 824 and semiconductor films having n-type conductivity 825, 826 are patterned by using the mask. Thereafter, the mask is removed by cleaning.

Wirings 823, 822 are formed. The wirings 823, 822 can be formed by ink jetting. The wirings 823, 822 serve as so-called a source wiring or a drain wiring.

An interlayer insulating film 828 is formed. A contact hole reaching to the wiring 822 is formed in the interlayer insulating film. An electrode 830 is formed to the contact hole.

An electrode 829 connecting electrically to the wiring 822 via the electrode 830 is formed. Simultaneously, an electrode 841 is formed at the terminal portion. The electrodes 829, 841 can be formed by ink jetting. The electrode 829 serves as an anode or a cathode of a light-emitting element in a light-emitting display device. As the electrode 829, a dot formed by mixing a conductor into water type solvent can be used. A transparent conductive film can be formed by using especially a transparent conductor.

At this stage, a TFT substrate for a light-emitting panel as illustrated in FIG. 8 provided with a channel stop TFT and a first electrode is completed. The subsequent processes are the same as those explained in Embodiment 1, and will not be further explained.

In this embodiment, the wiring or the electrode obtained by ink jetting can also be formed, as explained in Embodiment 1, by discharging a conductive material solution containing a photosensitive material to be exposed to laser light. Further, the resist mask can also be formed by exposure of laser light.

This embodiment can be freely combined with any one of Embodiment 1 to 4.

Embodiment 6

In this embodiment, a method for manufacturing an active matrix light-emitting display device having a foreword staggered TFT as a switching element that is manufactured by droplet discharging is explained.

A base film 911 for improving adhesiveness between a substrate 910 and a material layer that is to be formed by droplet discharging is formed.

A source wiring layer 923 and a drain wiring layer 924 are formed by droplet discharging over the base film 911.

A terminal electrode 940 is formed at a terminal portion. As a conductive material for forming the foregoing layers, a composite made from metal particles as its main component such as Ag (silver), Au (gold), Cu (copper), W (tungsten), or Al (aluminum) can be used. Since the source and drain wiring layers are preferably reduced its resistance, any one of gold, silver, and copper dissolved or dispersed into solvent is preferably used as a material. More preferably, silver or copper having low resistance is used. As the solvent, esters such as butyl acetate, alcohols such as isopropyl alcohol, organic solvent such as acetone can be used. The surface tension and the viscosity are appropriately controlled by adjusting the concentration of the solvent or adding surface-active agent or the like.

After an n-type semiconductor layer is formed over a whole surface, the n-type semiconductor layer between the source wiring layer 923 and the drain wiring layer 924 is removed by etching.

A semiconductor film is formed over a whole surface. The semiconductor film is formed by an amorphous semiconductor film or a semiamorphous semiconductor film formed by vapor growth or sputtering using a semiconductor material gas as typified by silane or germane.

Figure 9:
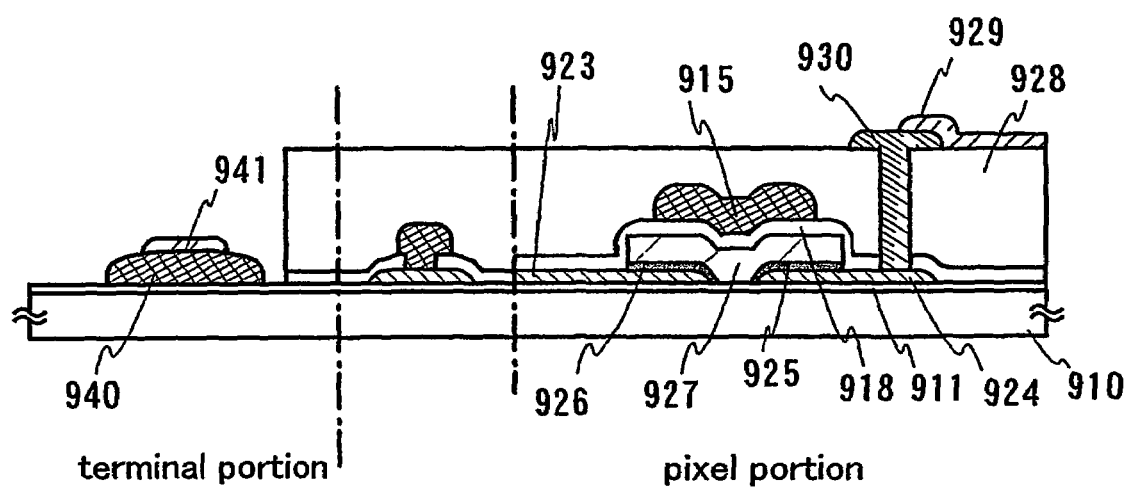
FIG. 9 is a cross-sectional view of a staggered TFT (Embodiment 6)

A mask is formed by droplet discharging. Then, the semiconductor film and the n-type semiconductor layer are patterned to form a semiconductor layer 927 and n-type semiconductor layers 925, 926 as illustrated in FIG. 9. The semiconductor layer 927 is formed to extend over both the source wiring layer 923 and the drain wiring layer 924. The n-type semiconductor layers 925, 926 are interposed between the source wiring layer 923 and the drain wiring layer 924, and the semiconductor layer 927.

Then, a gate insulating film is formed by a single layer or a laminated layer by plasma CVD or sputtering. Especially, the gate insulating film is preferably formed by stacking three laminated layers; that is, an insulating layer made from silicon nitride, an insulting layer made from silicon oxide, and an insulating layer made from silicon nitride.

A mask is formed by droplet discharging to pattern the gate insulating layer 918.

A gate wiring 915 is formed by droplet discharging. As a conductive material for forming the gate wiring 915, a composite containing metal particles (Ag (silver), Au (gold), Cu (copper), W (tungsten), Al (aluminum), or the like) as its main component can be used. The gate wiring 915 is extended to the terminal portion to connect to the terminal electrode 940 of the corresponding terminal portion.

Then, a plane interlayer insulating film 928 is formed by, but not exclusively, coating. The interlayer insulating can be formed by inorganic insulating film such as silicon oxide film formed by vapor growth or sputtering. Alternatively, a silicon nitride film may be formed by plasma CVD or sputtering as a protective film, and a plane insulating film may be formed by coating.

A contact hole reaching to the wiring 924 is formed in the interlayer insulating film. An electrode 930 is formed to the contact hole.

An electrode 929 connecting electrically to the wiring 924 via the electrode 930 is formed. Simultaneously, an electrode 941 is formed at the terminal portion. The electrodes 929, 941 can be formed by ink jetting. The electrode 929 serves as an anode or a cathode of a light-emitting element in a light-emitting display device. As the electrode 929, a dot formed by mixing a conductor into water type solvent can be used. A transparent conductive film can be formed by using especially a transparent conductor.

At this stage, a TFT substrate for a light-emitting panel as illustrated in FIG. 9 provided with a top gate TFT (staggered TFT) and a first electrode is completed. The subsequent processes are the same as those explained in Embodiment 1, and will not be further explained.

In this embodiment, the wiring or the electrode obtained by ink jetting can also be formed, as explained in Embodiment 1, by discharging a conductive material solution containing a photosensitive material to be exposed to laser light. Further, the resist mask can also be formed by exposure of laser light.

This embodiment can be freely combined with any one of Embodiment 1 to 4.

Embodiment 7

FIGS. 17A to 18D illustrate an example of a method for manufacturing an active matrix liquid crystal display device having a channel etch TFT as a switching element.

Similar to Embodiment 1, a base layer 2011 for improving adhesiveness between a substrate 2010 and a material layer that is to be formed by droplet discharging over the substrate 2010.

As the substrate 2010, a plastic substrate or the like that can resist processing temperature of this manufacturing process in addition to a non alkali glass substrate manufactured by fusion technique or float technique such as barium borosilicate glass, alumino borosilicate glass, or alumino silicate glass. In the case of manufacturing a reflective liquid crystal display device, a semiconductor substrate such as single crystalline silicon, a metal substrate such as stainless, or a substrate formed by providing an insulating layer over the surface of a ceramic substrate.

Figure 17A:
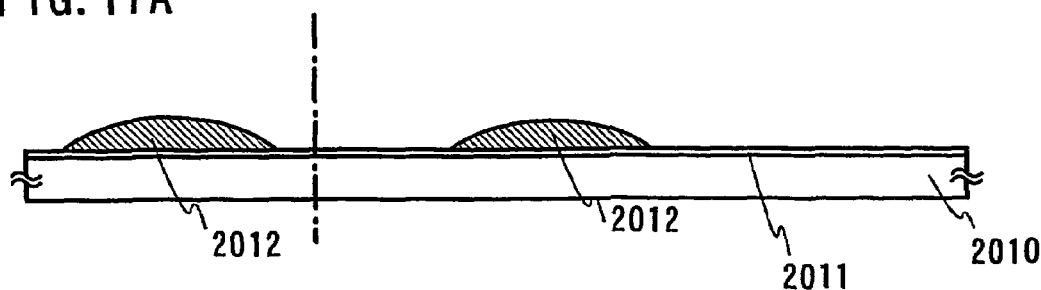
FIGS. 17A to 17E are cross-sectional views of a manufacturing process of an AM-LCD (Embodiment 7)

Similar to Embodiment 1, a conductive film pattern 2012 is formed by discharging conductive material solution by drops by the device illustrated in FIG. 16 using droplet discharging method, typically, ink jetting (FIG. 17A).

Figure 17B:
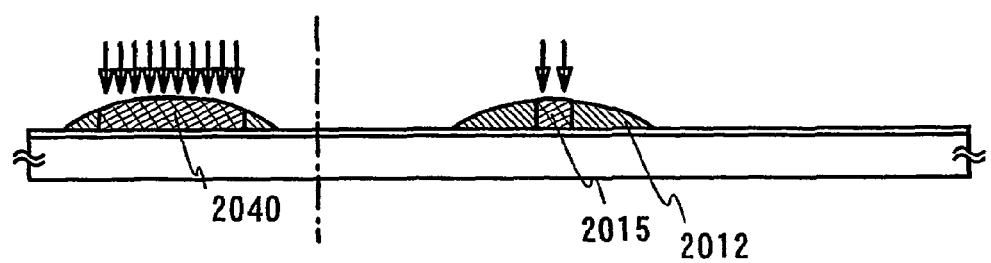

Then, similar to Embodiment 1, the conductive film pattern 2012 is selectively irradiated with laser light in order to expose a part of the conductive film pattern 2012 to the laser light by the device illustrated in FIG. 4 (FIG. 17B).

Figure 17C:
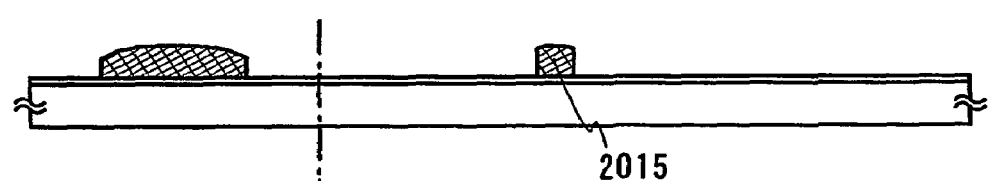

The conductive film pattern 2012 is developed by etchant (or developing solution) to trim an excess portion. Then, baking treatment is performed to form a metal wiring 2015 serving as a gate electrode or a gate wiring (FIG. 17C).

A wiring 2040 extending to the terminal portion is formed as well as the metal wiring 2015. Although not shown, a capacitor electrode or a capacitor wiring for forming retention volume is formed if necessary.

In case of using a positive type photosensitive material, a portion one wishes to remove is irradiated with laser light to be brought about chemical reactions. The chemically reacted portion may be dissolved by etchant.

Alternatively, exposure by laser light irradiation may be performed after conductive material solution is discharged by drops, dried in a room temperature, and pre-baked.

A gate insulating film 2018, a semiconductor film, and an n-type semiconductor film are sequentially deposited by plasma CVD or sputtering.

As a gate insulating film 2018, a material containing silicon oxide, silicon nitride, or silicon nitride oxide as its main component obtained by plasma CVD can be used. Alternatively, the gate insulating film 2018 may be silicon oxide film containing an alkyl group formed by siloxane based polymer by droplet discharging and baking.

The semiconductor film is formed by an amorphous semiconductor film or a semiamorphous semiconductor film by a vapor growth method, a sputtering method, or a thermal CVD method, each of which uses a semiconductor material gas as typified by silane or germane.

The n-type semiconductor film may be formed by an amorphous semiconductor film or a semiamorphous semiconductor film by plasma CVD using a silane gas and a phosphine gas. Although there is a fact that the n-type semiconductor film 2020 can reduce contact resistance between the semiconductor film and an electrode to be formed in the following process, the n-type semiconductor film 2020 may be formed according to need.

Figure 17D:
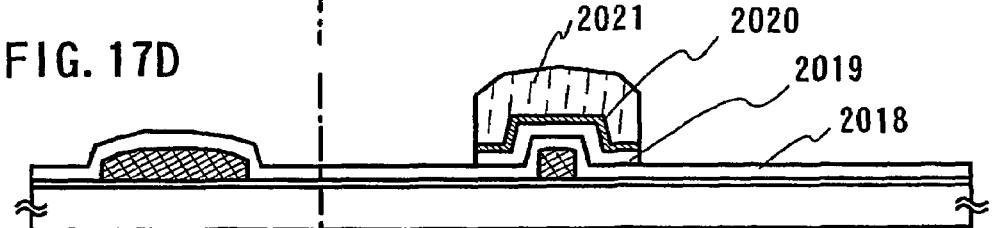

Then, a mask 2021 is provided, and then, the semiconductor film and the n-type semiconductor film are selectively etched to obtain an island like semiconductor film 2019 and an n-type semiconductor film 2020 (FIG. 17D). As a method for forming the mask 2021, droplet discharging or printing (relief printing, plane printing, gravure printing, screen printing, and the like) can be used.

Figure 17E:
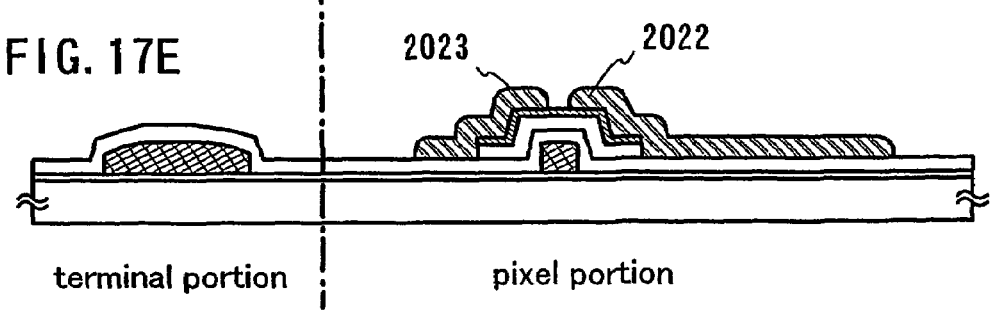

After removing the mask 2021, a source wiring, drain wiring 2022, 2023 are formed by discharging selectively a composite containing a conductive material (Ag (silver), Au (gold), Cu (copper), W (tungsten), Al (aluminum), or the like) by droplet discharging. Similarly, a connecting wiring (not shown) is formed at the terminal portion (FIG. 17E).

Figure 18A:
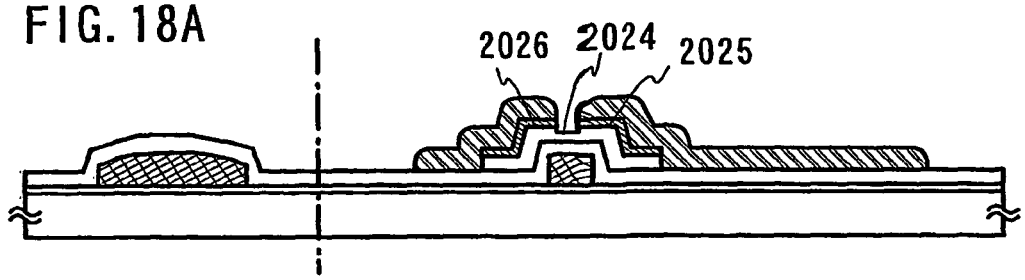
FIGS. 18A to 18D are cross-sectional views of a manufacturing process of an AM-LCD (embodiment 7)

The state illustrated in FIG. 18A is obtained by etching the n-type semiconductor film and a top layer portion of the semiconductor film by using the source wiring, the drain wiring 2022, 2023 as masks. At this time, a channel etch TFT, which is provided with a channel formation region 2024 serving as an active layer, a source region 2026, and a drain region 2025, is completed.

Figure 18B:
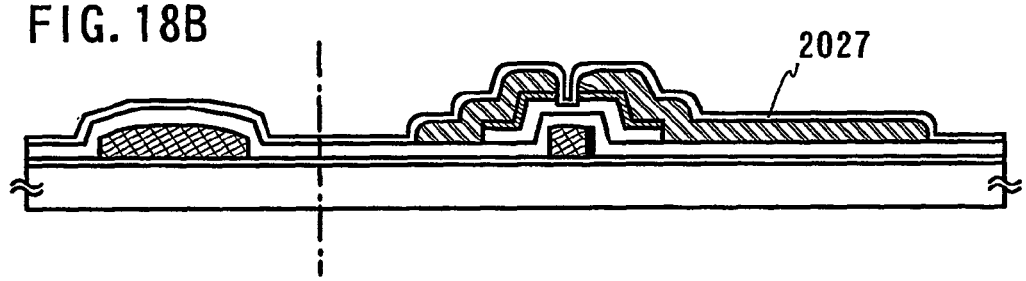

A protective film 2027 to prevent the channel formation region 2024 from being contaminated by impurities is formed (FIG. 18B). As a material for the protective film 2027, a material containing silicon nitride or silicon nitride oxide as its main component formed by sputtering or plasma CVD is used. In this instance, an example of using the protective film is described; however, the protective film is not always necessarily provided.

Then, an interlayer insulating film 2028 is selectively formed by droplet discharging. As a material for the interlayer insulating film 2028, a resin material such as epoxy resin, acrylic resin, phenol resin, novolac resin, acryl resin, melamine resin, or urethane resin is used. A method for forming the interlayer insulating film 2028 is not limited to the droplet discharging. Besides, coating, plasma CVD, or the like can be used to form the interlayer insulating film 2028 over a whole surface.

Then, the protective film is etched using the interlayer insulating film 2028 as a mask to form a convex portion (pillar) 2029 made from a conductive member over a part of the source wring or drain wiring 2022, 2023. The convex portion (pillar) 2029 may be stacked by repeating discharging and baking of a composite containing a conductive material (Ag (silver), Au (gold), Cu (copper), W (tungsten), Al (aluminum), or the like). After etching the protective film, etching treatment is performed at the terminal portion using the interlayer insulating film as a mask to remove selectively the gate insulating film.

Figure 18C:
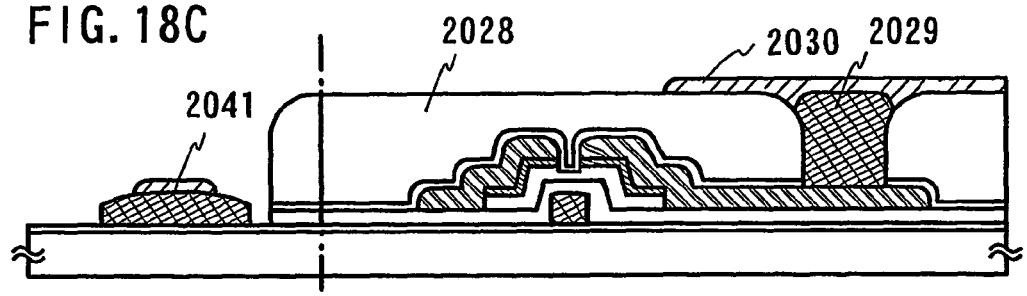

Then, a pixel electrode 2030 that is in contact with a convex portion (pillar) 2029 is formed over the interlayer insulating film 2028 (FIG. 18C). Similarly, a terminal electrode 2041 that is in contact with a wiring 2040 is formed. In the case of manufacturing a transparent liquid crystal display panel, a predetermined pattern made from a composite indium tin oxide (ITO), indium tin oxide containing silicon oxide (ITSO), zinc oxide (ZnO), tin oxide ($SnO_2$), or the like may be formed and baked to form a pixel electrode 2030 and a terminal electrode 2041.

In the case of manufacturing a reflection liquid crystal display panel, the pixel electrode 2030 and the terminal electrode 2041 can be formed by a composite containing metal particles as its main component such as Ag (silver), Au (gold), Cu (copper), W (tungsten), or Al (aluminum) by droplet discharging. Alternatively, the pixel electrode may be formed by forming a transparent conductive film and a light reflection conductive film by sputtering; forming a mask pattern by droplet discharging; and performing etching treatment.

Figure 19:
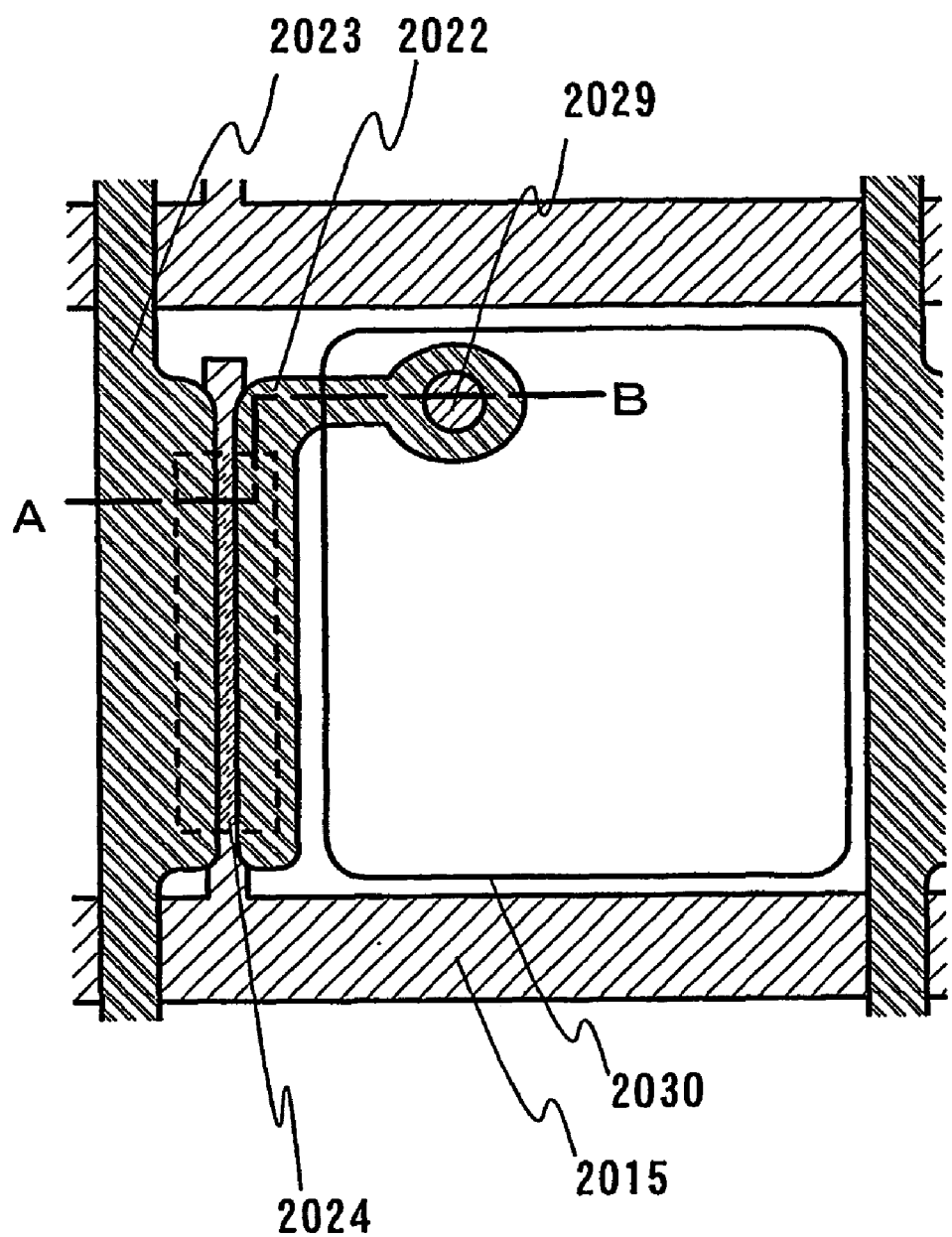
FIG. 19 is a top view of a pixel (Embodiment 7)

FIG. 19 illustrates an example of a top surface view of a pixel at the state illustrated in FIG. 18C. In FIG. 19, cross-section taken along line A-B corresponds to a cross-sectional view illustrated in FIG. 18C. Like components in FIG. 19 are denoted by like numerals as of FIG. 18C.

According to the foregoing processes, a TFT substrate for a liquid crystal display panel provided with a bottom gate TFT (reverse staggered TFT) and a pixel electrode is completed over the substrate 2010.

Then, an orientation film 2034a is formed to cover the pixel electrode 2030. The orientation film 2034a may be formed by droplet discharging, screen printing, or offset printing. Thereafter, rubbing treatment of the surface of the orientation film 2034a is performed.

A color filter composed of a coloring layer 2036a, a light-shielding layer (black matrix) 2036b, and an overcoat layer 2037 is provided over an opposing substrate 2035; an opposing electrode 2038 formed by a transparent electrode is formed; and an orientation film 2034b is formed thereover. Sealant forming a closed pattern (not shown) is formed to surround a region that is overlapped with a pixel portion. Although an example of drawing sealant forming a closed pattern is described to discharge liquid crystals 2039 by drops here, alternatively, liquid crystals may be injected due to capillary phenomenon by dipping (upwelling) after pasting the TFT substrate. The color filter can also be formed by droplet discharging.

Then, a liquid crystal is dropped to paste both the substrates to each other under reduced pressure in order bubbles not to be entered. The liquid crystal is dropped within the closed-loop pattern at once or a plurality numbers of times. As an orientation mode of the liquid crystal, a TN mode, that is, the arrangement of liquid crystal molecules is oriented at 90 degrees in the direction of from incident light to outgoing light, is often adopted. In the case of manufacturing a TN mode liquid crystal display device, substrates are pasted to each other so that rubbing directions of each of the substrates are at right angles to each other.

The substrates may be spaced by dispersing spherical spacers, forming a column-like spacer made from resin, or mixing filer into sealant. The foregoing column-like spacer is an organic resin material containing at least any one of acrylic, polyimide, polyimide amide, or epoxy; a material selected from the group consisting of silicon oxide, silicon nitride, and silicon oxynitride; or an inorganic material formed by a laminated film made from the foregoing materials.

Then, unnecessary portion of the substrate is trimmed. In the case of forming multiple panels from one substrate, the substrate is divided into each panel. In the case of forming one panel from one substrate, the trimming process can be omitted by pasting preliminarily divided opposing substrates onto the substrate.

Figure 18D:
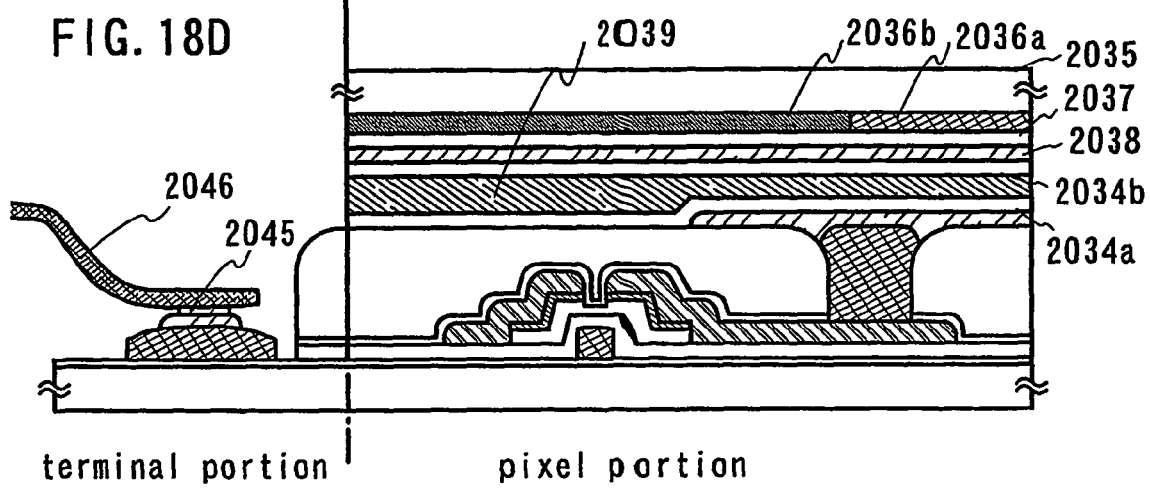

An FPC 2046 is pasted onto the panel via an anisotropic conductive layer 2045 by a known method. A liquid crystal module is completed according to the foregoing processes (FIG. 18D). Further, an optical film is pasted if necessary. In the case of manufacturing a transparent liquid crystal display device, a polarized plate is pasted onto both an active matrix substrate and an opposing substrate.

As mentioned above, in this embodiment, a microscopic pattern can be realized by exposing the conductive film pattern using droplet discharging to laser light and by developing. By forming various patterns directly over the substrate by droplet discharging, a liquid crystal display panel can be readily manufactured even if a fifth generation and later glass substrate having a side of over 1000 mm is used.

This embodiment explains a process that does not perform spin coating and that does not perform a light exposure process using a photo mask as much as possible. However, the present invention is not limited thereto, a part of the patterning can be performed by a light exposure process using a photo mask.

This embodiment can be freely combined to Embodiment 1.

Embodiment 8

In Embodiment 7, an example of exposing a gate wiring by a laser beam drawing device. In this embodiment, a process example of using a laser beam drawing device for forming a source wiring or a drain wiring is explained with reference to FIGS. 20A to 20D.

The process differs slightly from that explained Embodiment 7, and so the same part of the process will not be further explained in this embodiment for simplification.

Figure 20A:
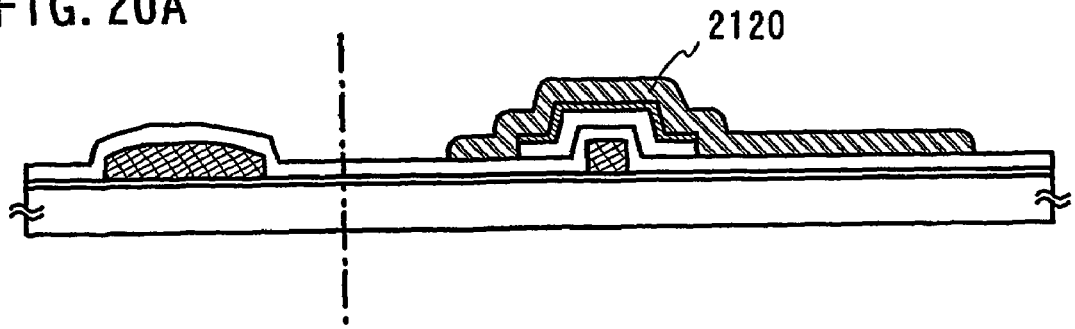
FIGS. 20A to 20D are views for showing a method for manufacturing a liquid crystal display device (Embodiment 8)

Similar to Embodiment 7, up to a patterning process of a semiconductor film is performed. Then, a conductive film pattern 2120 is formed by droplet discharging (FIG. 20A). A positive type photosensitive material is mixed into the conductive film pattern 2120.

Figure 20B:
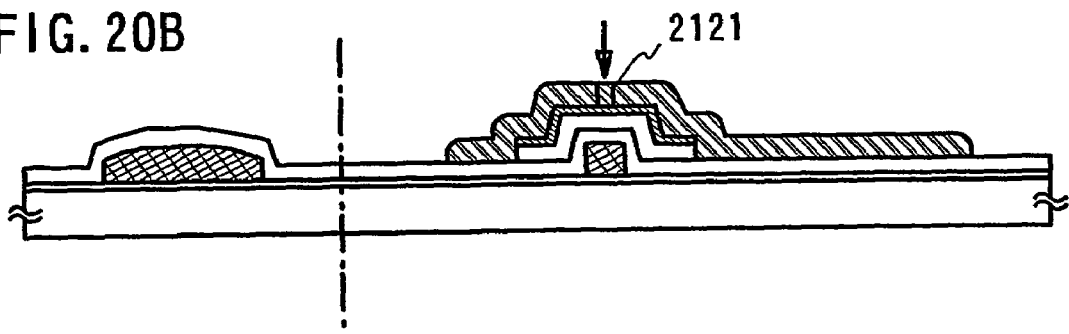

Then, the conductive film pattern 2120 is exposed to laser light by using the device illustrated in FIG. 4 (FIG. 20B). A portion 2121 that is irradiated with the laser light brings about chemical reactions.

Figure 20C:
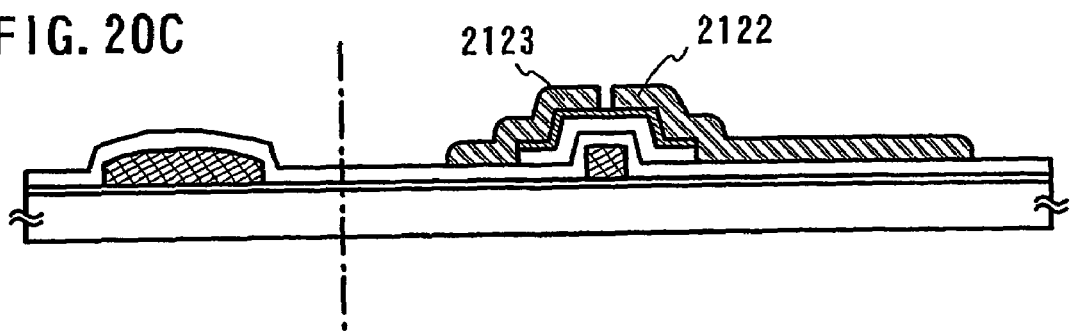

The portion 2121 that is irradiated with laser light by developing is removed to form a source wiring and a drain wiring 2122 or 2123 (FIG. 20C).

Since the space between the source wiring and the drain wiring 2122 or 2123 is determined by laser irradiation, a practitioner can freely set the space. Setting freely the space between the source wiring and the drain wiring 2122 or 2123 is useful since the space determines the length (L) of a channel formation region.

Figure 20D:
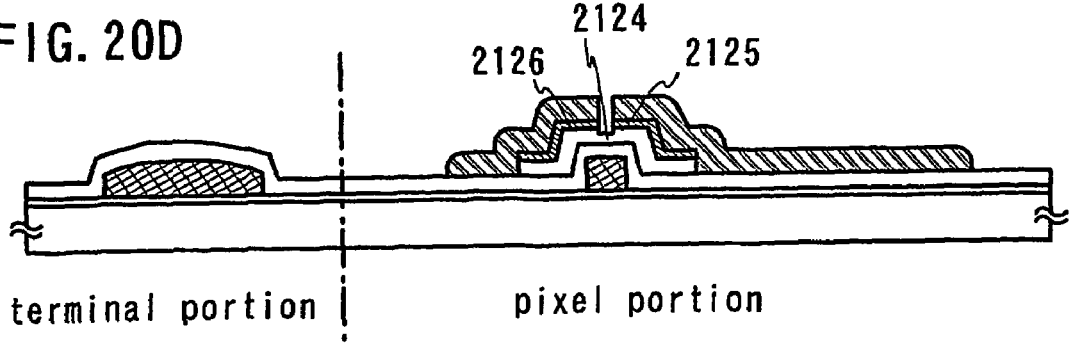

The state illustrated in FIG. 20D is obtained by etching an n-type semiconductor film and a top layer portion of the semiconductor film using the source wiring and the drain wiring 2122 or 2123 as masks. At this state, a channel etch TFT, which is provided with a channel formation region 2124 that serves as an active layer, a source region 2126, and a drain region 2125, is completed. The subsequent processes are the same as that explained in Embodiment 7, and will not be further explained.

In the case of forming the source wiring or the drain wiring by using droplet discharging, the space therebetween should be spaced to some extent in consideration of a margin for dripping or the like. Therefore, the length (L) of the channel formation region is difficult to be reduced. When the laser light is used as explained in this embodiment, the channel formation region can be reduced, for example, to have the length (L) of 10 µm or less.

This embodiment can be freely combined to Embodiments 1 and 7.

Embodiment 9

FIGS. 21A to 21D illustrate examples of other processes. In FIGS. 21A to 21D, an example of using a planarizing film as a gate insulating film 2160 is illustrated. Other components are the same as those explained in Embodiment 8.

After forming a gate electrode, the gate insulating film 2160 having a plane surface is formed by sputtering, a planarizing treatment of a film obtained by chemical vapor deposition, or coating method. The planarizing treatment is typified by chemical mechanical polishing treatment.

In the case of manufacturing a liquid crystal display device having a large screen, a gate wiring having low resistance may be preferably formed to have a thick thickness, for example, of 1 to 5 µm. When a cross-sectional area is increased by increasing the thickness of a wiring, difference in level between the surface of the substrate and the surface of the thick film wiring is produced, which leads to deterioration of coverage. The plane gate insulating film 2160 is useful in case of increasing the thickness of the gate wiring.

Generally, the substrate surface provided with a metal wiring has protrusion by an increment of the thickness of the metal wiring. In this embodiment, the substrate surface provided with the plane gate insulating film 2160 is plane. Accordingly, coverage deterioration or the like is hardly occurred even if the thickness of a semiconductor film is reduced.

Similar to Embodiment 1, a semiconductor film and an n-type semiconductor film are sequentially formed. Then, a mask is provided to etch selectively the semiconductor film and the n-type semiconductor film. Accordingly, an island like semiconductor film and an n-type semiconductor film can be obtained.

Figure 21A:
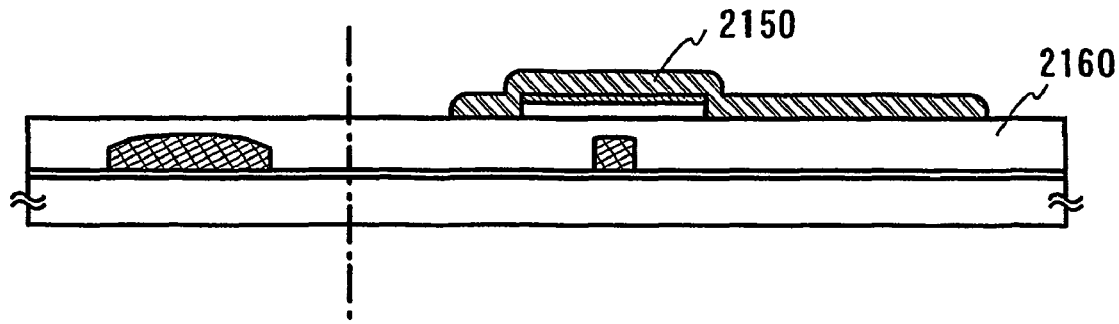
FIGS. 21A to 21D are views for showing a method for manufacturing a liquid crystal display device (Embodiment 9)

Similar to Embodiment 8, a conductive film pattern 2150 is formed by droplet discharging (FIG. 21A).

Figure 21B:
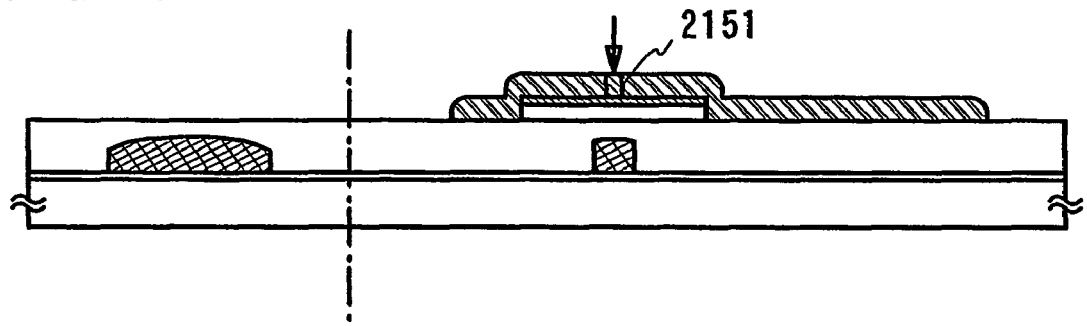

Then, the conductive film pattern 2150 is selectively exposed to laser light by using the device illustrated in FIG. 4 (FIG. 21B).

Figure 21C:
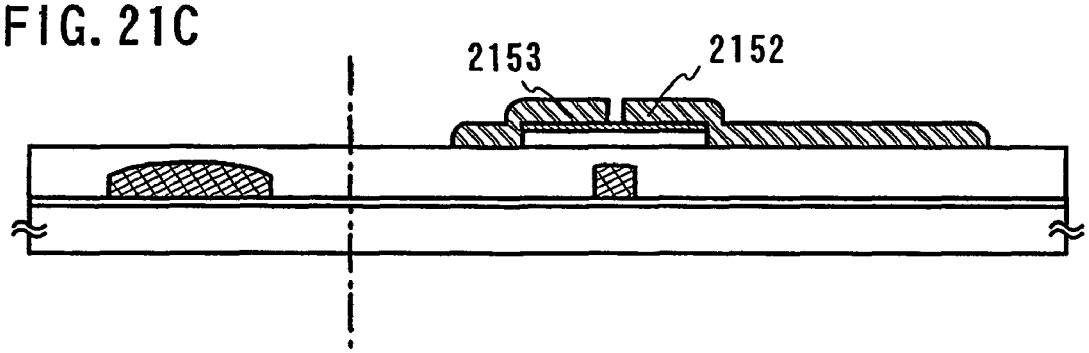

The portion 2151 that is irradiated with laser light is removed to form a source wiring or a drain wiring 2152, 2153 by developing (FIG. 21C).

Figure 21D:
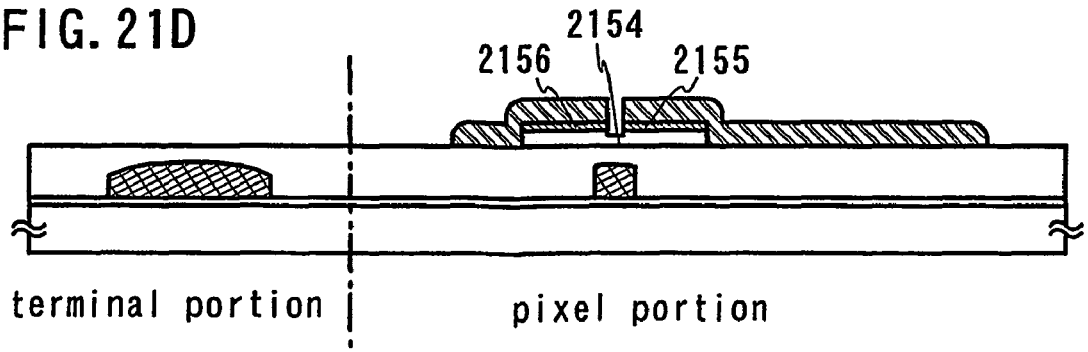

The state illustrated in FIG. 21D is obtained by etching an n-type semiconductor film and a top layer portion of the semiconductor film using the source wiring and the drain wiring 2152 or 2153 as masks. At this state, a channel etch TFT, which is provided with a channel formation region 2154 that serves as an active layer, a source region 2156, and a drain region 2155 is completed. The subsequent processes are the same as that explained in Embodiment 7, and will not be further explained.

This embodiment can be freely combined to Embodiment 1, 7, or 8.

Embodiment 10

FIGS. 22A to 22D illustrate a process of forming a source wiring or a drain wiring using a gate electrode as a mask in a self-aligning manner by light exposure of a reverse-surface.

A base insulating film 2201 is formed over a substrate. As the base insulating film 2201, a base insulating film formed by an insulating film such as a silicon oxide film, a silicon nitride film, or a silicon oxynitride film is used. The base insulating film may not be formed when it is not required.

A conductive film having a thickness of 100 to 600 nm is formed by sputtering over the base insulating film 2201. The conductive film may be formed by an element selected from the group consisting of Ta, W, Ti, Mo, Al, and Cu; a single layer made from an alloy material or a compound material containing the foregoing elements as its main component, or a laminated layer of the foregoing single layers. Alternatively, a semiconductor film as typified by a polycrystalline silicon film doped with an impurity element such as phosphorus may be used as the conductive film.

Then, a resist mask is formed by using a photo mask and etched by dry etching or wet etching. The conductive film is etched by the etching treatment to obtain a gate electrode 2202 as illustrated in FIG. 22A.

Similar to Embodiment 7, a gate insulating film, a semiconductor film, and an n-type semiconductor film are sequentially deposited by plasma CVD or sputtering. Then, a mask is provided to selectively etch the semiconductor film and the n-type semiconductor film. Accordingly, an island like semiconductor film and an island like n-type semiconductor film are obtained.

Figure 22A:
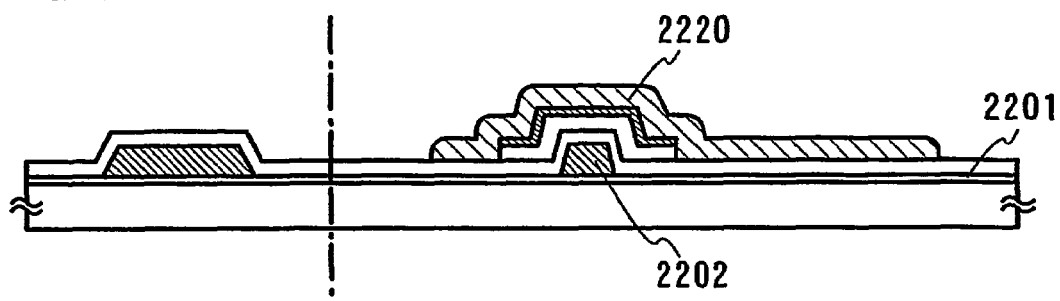
FIGS. 22A to 22D are views for showing a method for manufacturing a liquid crystal display device (Embodiment 10)

Similar to Embodiment 8, a conductive pattern 2220 is formed by droplet discharging (FIG. 22A). A negative type photosensitive material is mixed into the conductive pattern 2220.

Figure 22B:
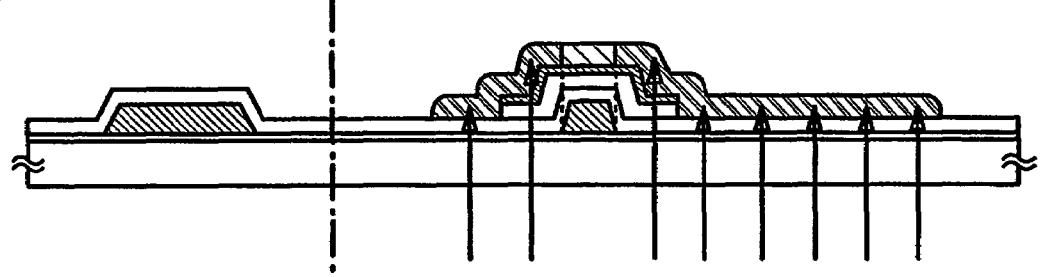

Then, the reverse surface of the conductive pattern 2220 is exposed to laser light in a self-aligning manner by using a laser beam drawing device (FIG. 22B). The portion irradiated with laser light in the conductive pattern brings about chemical reactions. A substrate that is transparent to light is used. Laser light having a wavelength that passes through the substrate is selected.

Figure 22C:
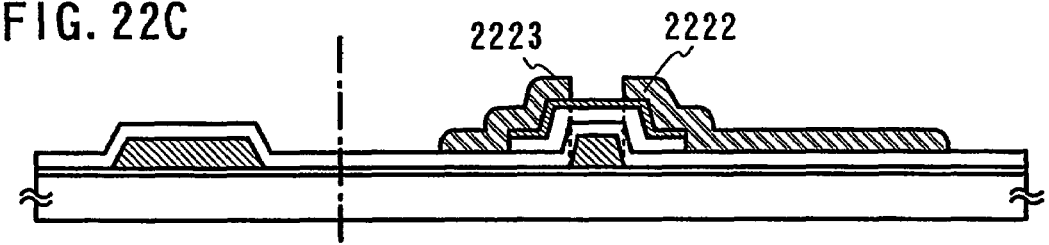

And then, developing is performed, and a portion that is not irradiated with the laser light is removed to form a source wiring and a drain wiring 2222 or 2223 (FIG. 22C).

The space between the source wiring and the drain wiring 2222 or 2223 is determined by the width of the gate electrode.

Figure 22D:
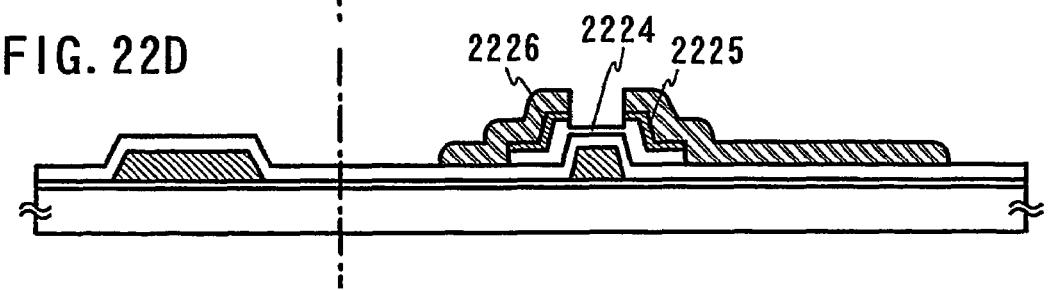

The state illustrated in FIG. 22D is obtained by etching an n-type semiconductor film and a top layer portion of the semiconductor film using the source wiring and the drain wiring 2222, 2223 as masks. At this state, a channel etch TFT, which is provided with a channel formation region 2224 that serves as an active layer, a source region 2226, and a drain region 2225 is completed. The subsequent processes are the same as that explained in Embodiment 7, and will not be further explained.

Since a channel formation region of a TFT is formed in a self-aligning manner according to the present invention, patterning difference is not produced and variation of a TFT can be reduced. According to the present invention, a manufacturing process can be simplified.

This embodiment can be freely combined with Embodiment 1, 7, 8, or 9.

Embodiment 11

A method for manufacturing an active matrix light-emitting display device having a channel stop TFT as a switching element is explained in this embodiment.

Figure 23:
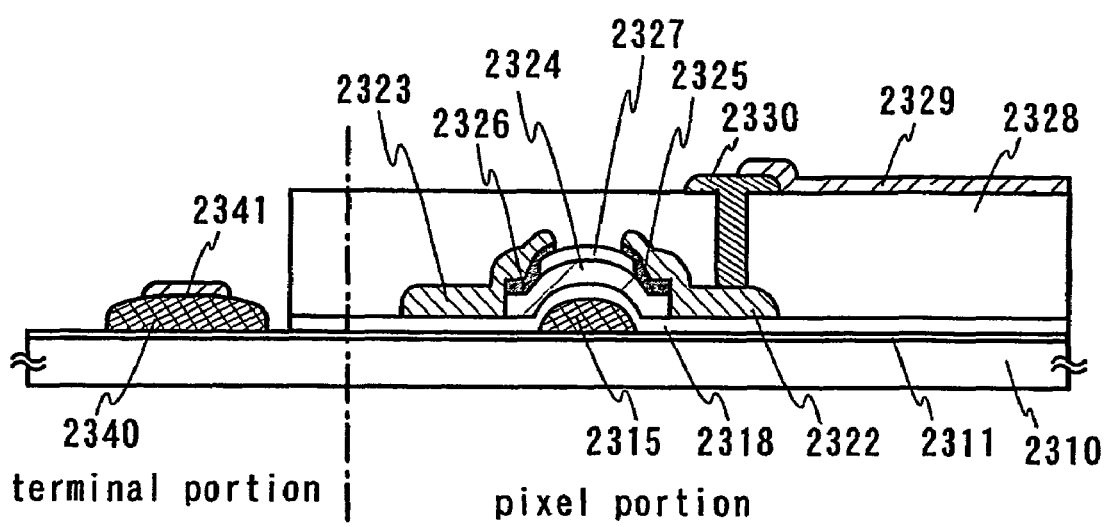
FIG. 23 is a cross-sectional view of a channel stop TFT (Embodiment 11)

As illustrated in FIG. 23, a base film 2311 is formed over a substrate 2310 as in the case with Embodiment 7. As the base film 2311, TiO$_2$ that is a photocatalyst material is formed over the whole of the substrate.

Then, light having a wavelength that causes photocatalyst action is emitted to the desired region, that is, TiO$_2$ at the edge of a region provided with a wiring in this embodiment, and an irradiated region is formed. Laser light can be used as the light having a wavelength that causes photocatalyst action. The light is selectively emitted to a desired region by using the device illustrated in FIG. 4. Accordingly, the irradiated region becomes to have an oil-shedding property.

A conductive film serving as a gate electrode 2315 is formed by dropping a dot formed by mixing a conductor into solvent from or to a non irradiated region by ink jetting. Simultaneously, a terminal electrode 2340 is formed at a terminal portion.

Then, a gate insulating film 1318 is formed to cover the gate electrode. Thereafter, a semiconductor film is formed by plasma CVD. And then, in order to form a channel protective film 2327, an insulating film is formed by, for example, plasma CVD to be patterned at a desired region to have a desired form. In this instance, the channel protective film 2327 can be formed by exposing from a side of the reverse surface of a substrate to light using the gate electrode as a mask. Further, the channel protective film may be formed by discharging polyimide, polyvinyl alcohol, or the like by ink jetting. As a result, an exposure process can be eliminated.

Thereafter, a semiconductor film having one conductivity type, for example, an n-type semiconductor film is formed by plasma CVD or the like.

Then, a mask made from polyimide is formed by ink jetting over the n-type semiconductor film. A semiconductor film 2324 and semiconductor films having n-type conductivity 2325, 2326 are patterned by using the mask. Thereafter, the mask is removed by cleaning.

Wirings 2323, 2322 are formed. The wirings 2323, 2322 can be formed by ink jetting. The wirings 2323, 2322 serve as so-called a source wiring or a drain wiring.

An interlayer insulating film 2328 is formed. A contact hole reaching to the wiring 2322 is formed. An electrode 2330 is formed to the contact hole.

An electrode 2329 connecting electrically to the wiring 2322 via the electrode 2330 is formed. Simultaneously, an electrode 2341 is formed at the terminal portion. The electrodes 2329, 2341 can be formed by ink jetting. The electrode 2329 serves as a pixel electrode in a liquid crystal display device. As the electrode 2329, a dot formed by mixing a conductor into water type solvent can be used. A transparent conductive film can be formed by using especially a transparent conductor.

At this stage, a TFT substrate for a liquid crystal display panel as illustrated in FIG. 23 provided with a channel stop TFT and a pixel electrode is completed. The subsequent processes are the same as those explained in Embodiment 7, and will not be further explained.

In this embodiment, the wiring or the electrode can also be formed, as explained in Embodiment 7, by discharging a conductive material solution containing a photosensitive material to be exposed to laser light. Further, the resist mask can also be formed by exposure of laser light.

This embodiment can be freely combined with any one of Embodiment 1, and 7 to 11.

Embodiment 12

Figure 24:
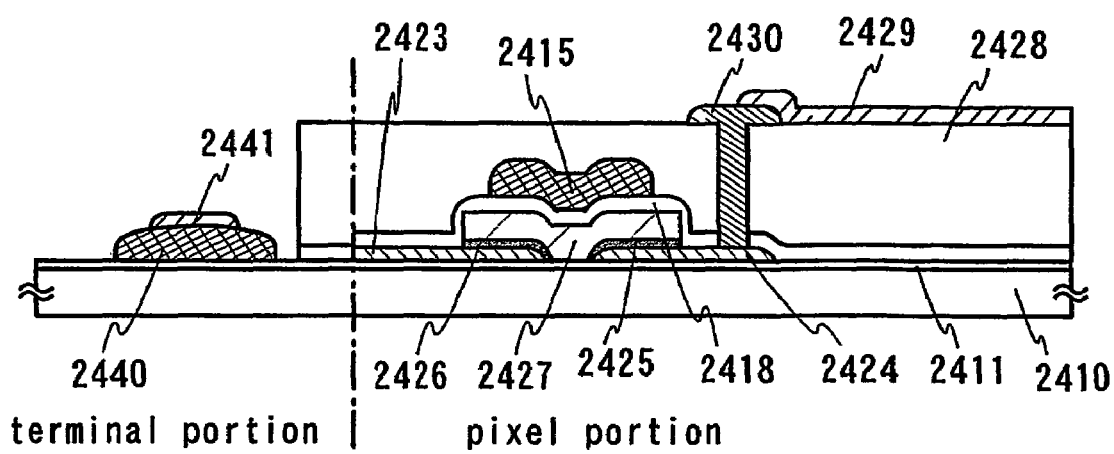
FIG. 24 is a cross-sectional view of a staggered TFT (Embodiment 12)

In this embodiment, a method for manufacturing an active matrix liquid crystal display device having a foreword staggered TFT as a switching element that is manufactured by droplet discharging is explained FIG. 24.

A base film 2411 for improving adhesiveness between a substrate 2410 and a material layer that is to be formed by droplet discharging is formed.

A source wiring layer 2423 and a drain wiring layer 2424 are formed by droplet discharging over the base film 2411.

A terminal electrode 2440 is formed at a terminal portion. As a conductive material for forming the foregoing layers, a composite made from metal particles as its main component such as Ag (silver), Au (gold), Cu (copper), W (tungsten), or Al (aluminum) can be used. Since the source and drain wiring layers are preferably reduced its resistance, any one of gold, silver, and copper dissolved or dispersed into solvent is preferably used as a material in consideration of specific resistance value. More preferably, silver or copper having low resistance is used. As the solvent, esters such as butyl acetate, alcohols such as isopropyl alcohol, organic solvent such as acetone can be used. The surface tension and the viscosity are appropriately controlled by adjusting the concentration of the solvent or adding surface-active agent or the like.

After an n-type semiconductor layer is formed over a whole surface, the n-type semiconductor layer between the source wiring layer 2423 and the drain wiring layer 2424 is removed by etching.

A semiconductor film is formed over a whole surface. The semiconductor film is formed by an amorphous semiconductor film or a semiamorphous semiconductor film formed by vapor growth or sputtering using a semiconductor material gas as typified by silane or germane.

A mask is formed by droplet discharging. Then, the semiconductor film and the n-type semiconductor layer are patterned to form a semiconductor layer 2427 and n-type semiconductor layers 2425, 2426 as illustrated in FIG. 24. The semiconductor layer 2427 is formed to extend over both the source wiring layer 2423 and the drain wiring layer 2424. The n-type semiconductor layers 2425, 2426 are interposed between the source wiring layer 2423 and the drain wiring layer 2424, and the semiconductor layer 2427.

Then, a gate insulating film is formed by a single layer or a laminated layer by plasma CVD or sputtering. Especially, the gate insulating film is preferably formed by stacking three laminated layers; that is, an insulating layer made from silicon nitride, an insulting layer made from silicon oxide, and an insulating layer made from silicon nitride.

A mask is formed by droplet discharging to pattern the gate insulating layer 2418.

A gate wiring 2415 is formed by droplet discharging. As a conductive material for forming the gate wiring 2415, a composite containing metal particles (Ag (silver), Au (gold), Cu (copper), W (tungsten), Al (aluminum), or the like) as its main component can be used. The gate wiring 2415 is extended to the terminal portion to connect to the terminal electrode 2440 of the corresponding terminal portion.

Then, a plane interlayer insulating film 2428 is formed by, but not exclusively, coating. The interlayer insulating film can be formed by inorganic insulating film such as silicon oxide film formed by vapor growth or sputtering. Alternatively, a silicon nitride film may be formed by plasma CVD or sputtering as a protective film, and then a plane insulating film may be formed by coating.

A contact hole reaching to the drain wiring 2424 is formed in the interlayer insulating film. An electrode 2430 is formed to the contact hole.

An electrode 2429 connecting electrically to the drain wiring 2424 via the electrode 2430 is formed. Simultaneously, an electrode 2441 is formed at the terminal portion. The electrodes 2429, 2441 can be formed by ink jetting. The electrode 2429 serves as a pixel electrode of a liquid crystal display device. As the electrode 2429, a dot formed by mixing a conductor into water type solvent can be used. A transparent conductive film can be formed by using especially a transparent conductor.

At this stage, a TFT substrate for a liquid crystal display panel as illustrated in FIG. 24 provided with a top gate TFT (staggered TFT) and a pixel electrode is completed. The subsequent processes are the same as those explained in Embodiment 7, and will not be further explained.

In this embodiment, the wiring or the electrode can also be formed, as explained in Embodiment 7, by discharging a conductive material solution containing a photosensitive material to be exposed to laser light. Further, the resist mask can also be formed by exposure of laser light.

This embodiment can be freely combined with any one of Embodiment 1, Embodiment 7 to 10.

Examples of the present invention composed of the foregoing aspects are described in more detail below.

Example 1

An example of mounting a driver circuit to an EL display panel that is manufactured according to the best mode is explained in this example.

Figure 11:
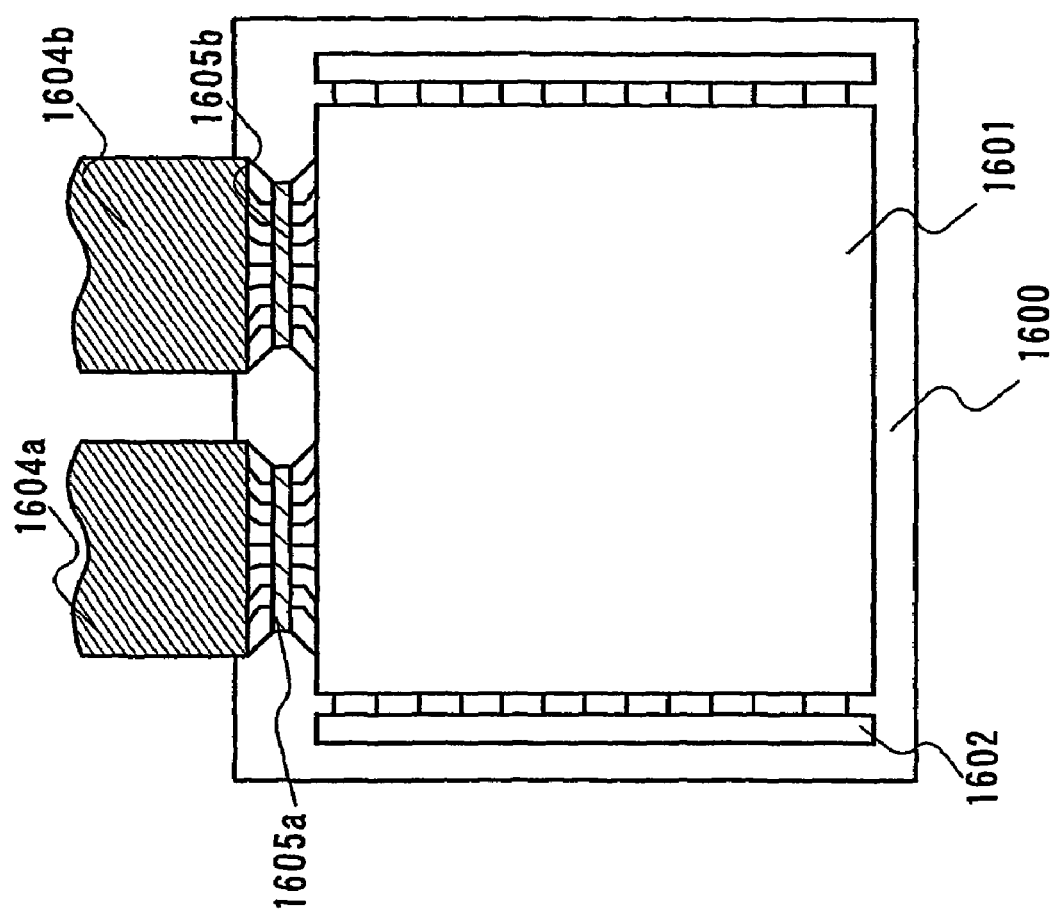
FIG. 11 is a top view of a light-emitting display device according to the present invention (Example 1)

A display device adopting COG technique is explained with reference to FIG. 11. A pixel portion 1601 for displaying information such as texts or images, and a driver circuit 1602 at a scanning side are provided over a substrate 1600. A substrate provided with a plurality of driver circuits is divided into a rectangular shape. The divided driver circuits (hereinafter, driver IC) 1605a, 1605b are mounted over the substrate 1600. FIG. 11 shows a plurality of the driving ICs 1605 and an embodiment of mounting a tape 1604a and a tape 1604b on tip of the driver ICs 1605a and the driver ICs 1605b. Alternatively, the substrate provided with a plurality of driver circuits is divided to have the same sizes as that of a length of the signal line side of the pixel portion, and a tape may be mounted on a tip of a single driver IC.

TAB technique may be used. In this instance, a plurality of tapes is pasted to be mounted with a driver IC. As is the case with COG technique, a single driver IC may be mounted to a single tape. In this instance, a piece of metal for securing the driver IC is preferably pasted to the driver IC in consideration of intensity.

A plurality of the driver IC to be mounted on these EL display panels is preferably formed over a rectangular substrate having a side of from 300 mm to 1000 mm or more from a viewpoint of improving productivity.

That is, a plurality of circuit patterns respectively having a unit composed of a driver circuit portion and an input output terminal is formed over a substrate and divided to be taken out the circuit pattern from the substrate. The driver IC may be formed to have a longer side of 15 to 80 mm and a short side of 1 to 6 mm, or to have a length that corresponds to one side of a pixel region, or a length of adding one side of the pixel portion to one side of each driver circuit.

The advantage of an outside dimension of a driver IC over an IC chip is a length of a longer side. The number of a driver IC having a longer side of from 15 to 80 mm that is required to be mounted to a pixel portion is less than that of an IC chip, which leads to improve manufacturing yields. In the case of forming a driver IC over a glass substrate, the productivity is not deteriorated since the driver IC is not limited by the substrate shape used as a maternal substrate. This is a great advantage over an IC chip in state of taking out from a circular silicon wafer.

In FIG. 11, the driver ICs 1605a and 1605b provided with driver circuits are mounted to the outside region of the pixel region 1601. These driver ICs 1605a and 1605b are driver circuits at the side of a signal line. To form a pixel region corresponding to RGB full color, the number of signal line of 3072 is required in an XGA class, whereas the number of signal line of 4800 is required in an UXGA class. Signal lines composed of the number of signal lines are divided into several blocks at the edge of the pixel region 1601 to form lead lines and gathered along with the pitch of an output terminal of the driver ICs 1605a and 1605b.

The driver IC is preferably formed by crystalline semiconductor formed over a substrate, and the crystalline semiconductor is preferably formed by laser light irradiation of continuous emission. Therefore, a solid or gas laser of continuous emission is used as an oscillator for producing the laser light. In the case of using a laser of continuous emission, a transistor with a few crystal defects can be manufactured by using a polycrystalline semiconductor layer having a large grain size. High speed driving is possible since mobility or response speed is favorable, and so operating frequency can be more improved than that of the conventional device, moreover, high reliability can be obtained since variations of characteristics are less. In order to further improve of the operating frequency, the channel length direction of the transistor is preferably conformed to the scanning direction of the laser light. This is due to the fact that the highest mobility can be obtained when the channel length direction of the transistor and the scanning direction of the laser light are almost in parallel with each other (preferably −30° to 30°) in a process of laser crystallization using a continuous emission laser. Further, the term as used herein "channel length direction" refers to a direction of flowing current, that is, a direction of moving charges in a channel formation region. The transistor manufactured in this way has an active layer composed of a polycrystalline semiconductor layer, which means that a crystal grain boundary is formed almost along with the channel direction.

To perform laser crystallization, laser light is preferably narrow down drastically to have a beam spot width of approximately 1 to 3 mm that is the same as the width of a shorter side of a driver IC. Further, to secure sufficient and efficient energy density, the irradiation region of laser light is preferably a linear shape. As used herein, the term "linear shape" does not refer to line in a strict sense, but an oblong shape or prolate ellipsoid shape having a large aspect ratio such as 2 or more aspect ratio (preferably 10 to 10000). A method for manufacturing a display device with improved productivity can be provided by forming the beam spot width of laser light to have the same length of a shorter side of a driver IC.

FIG. 11 illustrates an embodiment of forming integrally a scanning line driver circuit with a pixel portion, and mounting a driver IC as a signal line driver circuit. However, the present invention is not limited to the embodiment, and the driver IC may be mounted as both of a scanning line driver circuit and a signal line driver circuit. In this instance, the specifications of the driver ICs used at a scanning line and a signal line may be different with each other.

In the pixel region 1601, signal lines and scanning lines are crossed with each other to from a matrix configuration, and transistors are provided corresponding to each the crossing portion. According to the present invention, as a transistor provided to the pixel region 1601, a TFT having a channel portion of amorphous semiconductor or semiamorphous semiconductor is used. The amorphous semiconductor is formed by plasma CVD, sputtering, or the like. The semiamorphous semiconductor can be formed at temperature of 300° C. or less by plasma CVD. The semiamorphous semiconductor has an advantage of being formed to have a thickness required to form a transistor in a small amount of time even if a non alkali glass substrate having outside dimension of 550×650 mm is used. Such manufacturing technique is effective to manufacture a large screen display device. By forming the channel formation region by semiamorphous semiconductor, the semiamorphous TFT can obtain electron field effect mobility of 2 to 10 $cm^2/Vsec$. Accordingly, the TFT can be used as a switching element or an element for composing a driver circuit at the side of a scanning line. Therefore, an EL display panel that realizes system on panel can be manufactured.

FIG. 11 illustrates a display device on the premise that the scanning line driver circuit is integrally formed over the substrate by using a TFT that is formed by a semiconductor layer made from semiamorphous semiconductor. In the case of using a TFT having a semiconductor layer made from amorphous semiconductor, both of the scanning line driver circuit and the signal line driver circuit are mounted to the driver IC.

In this instance, the specifications of the driver ICs used at a scanning line and a signal line are preferably different with each other. The operating frequency is 100 kHz or less and high speed operation is comparatively not required despite the fact that the transistor composing the driver IC at the scanning line side is required to have, for example, withstand pressure of approximately 30 V. Therefore, the channel length (L) of a transistor composing a driver at the scanning line side is preferably set sufficiently large. On the other hand, although withstand pressure of approximately 12 V is sufficient for the transistor of a driver IC at the signal line side, it is required to operate at high speed since the operating frequency is approximately 65 MHz at 3 V. Accordingly, the channel length and the like of the transistor composing a driver are preferably set by a micron rule.

A method for mounting a driver IC is not especially limited, and a known COG method, a wire bonding method, or a TAB method can be used.

By forming the driver IC to have the same thickness as that of an opposing substrate, the height of them becomes almost the same, which leads to reduce the thickness of the display device. By manufacturing the respective substrates by the same materials, heat stress is not occurred even if variation in temperature is arisen in the display device and the characteristics of a circuit formed by a TFT are not damaged. Besides, the number of driver ICs mounted to one pixel region can be reduced by mounting a driver circuit with a drive IC that is longer than an IC chip.

As noted above, a driver circuit can be installed in an EL display panel.

This embodiment can be freely combined with any one of Embodiments 1 to 6.

Example 2

A light-emitting device having a thin film transistor is explained with reference to FIG. 12.

Figure 12A:
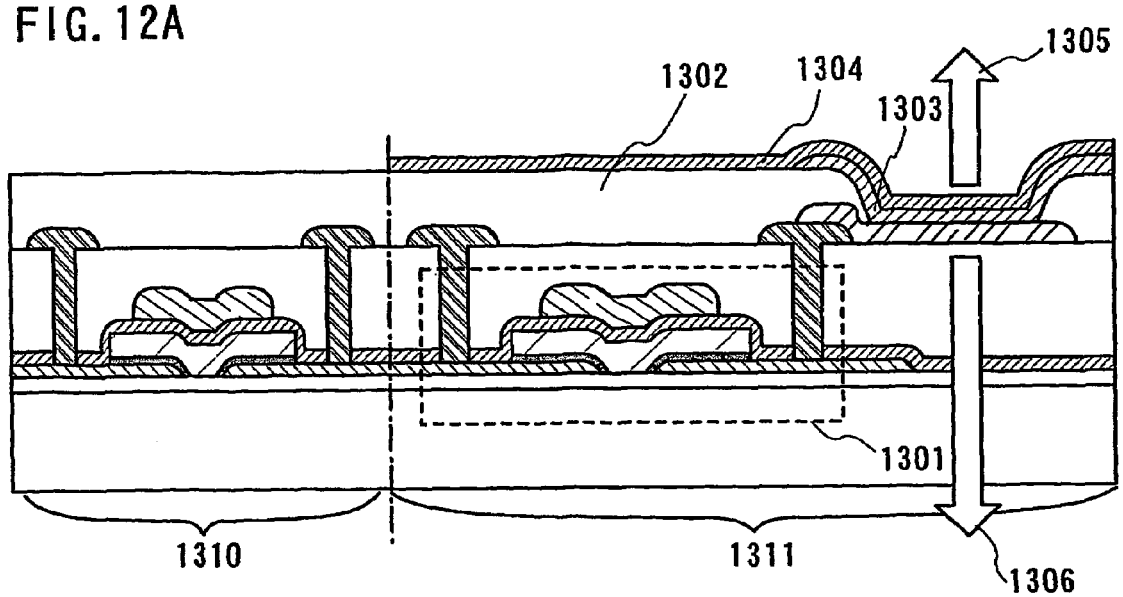
FIGS. 12A to 12C are cross-sectional views for showing an example of a light-emitting device (Example 2)

As illustrated in FIG. 12A, a top gate n-channel TFT using a semiamorphous silicon film as an active layer is provided to a driver circuit portion 1310 and a pixel portion 1311.

A method for manufacturing the top gate TFT is explained in Embodiment 6, and will not be further explained.

In this example, an n-channel TFT connected to a light-emitting element formed in the pixel portion 1311 is denoted as a drive TFT 1301. An insulating film 1302 referred to as a bank or the like is formed to cover the edge portion of an electrode (referred to as a first electrode) of the drive TFT 1301. The insulating film 1302 may be made from an inorganic material (silicon oxide, silicon nitride, silicon oxynitride, and the like), a photosensitive or nonphotosensitive organic material (polyimide, acrylic, polyamide, polyimide-amide, resist, or benzocyclobutene), so-called siloxane (a substance which has a skeleton formed by the bond of silicon (Si) and oxygen (O), and which includes at least hydrogen as a substituent, or at least one selected from the group consisting of fluoride, alkyl group, and aromatic hydrocarbon as the substituent), or a layered structure of the foregoing materials. As the organic material, positive type photosensitive organic resin or a negative type photosensitive organic resin can be used.

Over the first electrode, an opening portion is formed to the insulating film 1302. The opening portion is provided to an electroluminescent layer 1303 and a second electrode 1304 of a light-emitting element is formed to cover the electroluminescent layer 1303 and the insulating film 1302.

There are two kinds of molecular exciton possible from the electroluminescent layer, the singlet excited state and the triplet excited state. Since the ground state is generally a single state, light emission from the singlet state is referred to as fluorescence and the same from the triplet state is referred to as phosphorescence. Light emission from the electroluminescent layer is possible from either of the excited state. Further, fluorescence and phosphorescence may be combined and can be selected by emission characteristics (luminance, lifetime, and the like) of each RGB.

The electroluminescent layer 1303 is formed by stacking over the first substrate HIL (hole injecting layer), HTL (hole transporting layer), EML (light-emitting layer), ETL (electron transporting layer), EIL (electron injecting layer), sequentially. The electroluminescent layer 1303 may be formed to have a single layer structure or a mix structure besides the layered structure.

In the case of forming the electroluminescent layer 1303 to realize a full color display, materials, each of which exhibits red (R), blue (B), and green (G), may be selectively deposited by vapor deposition using a evaporation mask; ink jetting: or the like.

Specifically, CuPc or PEDOT is used for the HTL; α-NPD is used for the HTL; BCP or Alq$_3$ is used for the ETL: and BCP: Li or CaF$_2$ is used for the EIL. For example, Alq$_3$ doped with dopant corresponding to each emission color of R, G, and B (DCM or the like is used in the case of R, and DMQD or the like is used in the case of G) may be used for the EML. The materials for the electroluminescent layer are not limited to the foregoing materials used for a layered structure. For example, instead of using CuPc or PEDOT, oxides such as molybdenum oxide (MoOx: x=2~3), α-NPD, and rubrene can be deposited by co-evaporation to improve a hole injecting property. As such materials, an organic material (including a low molecular material or a high molecular material) or a composite material of organic and inorganic materials can be used.

Full color display can be realized by providing separately a color filter, or a color filter and a color conversion layer in the case of forming an electroluminescent layer exhibiting white emission. The color filter or the color conversion layer may be provided over, for example, a second substrate (sealing substrate) to be pasted together. The color filter or the color conversion layer can be formed by ink jetting. Needless to say, a monochromatic light-emitting device can be manufactured by forming an electroluminescent layer exhibiting emission color other than white emission. An area color display device capable of monochromatic display can be manufactured.

Materials for the first electrode and the second electrode 1304 are required to be selected in consideration of a work function. The first electrode and the second electrode may be either of an anode or a cathode by a pixel constitution. In this example, since the polarity of a drive TFT is an n-channel type, the first electrode serves preferably as a cathode and the second electrode serves preferably as an anode. In the case that the polarity of the drive TFT is a p-channel type, the first electrode serves preferably as an anode and the second electrode serves preferably as a cathode.

In this example, since the polarity of a drive TFT is an n-channel type, the light-emitting device has preferably the structure composed of the first electrode serving as a cathode, EIL (electron injecting layer), ETL (electron transporting layer), EML (light-emitting layer), HTL (hole transporting layer), and the second electrode serving as an anode.

As a passivation film for covering the second electrode, an insulating film may be formed by DLC or the like by sputtering or CVD. As a result, moisture or oxygen can be prevented from penetrating. Further, moisture or oxygen can be prevented from penetrating by covering the side of a display means by the first electrode, the second electrode, or another electrode. Then, the sealing substrates are pasted. The space formed by the sealing substrate may be filled with nitrogen or provided with drying agent. The space formed by the sealing substrate may be filled with resin having a light-emitting property and a high absorption property.

To increase contrast, a polarized plate or a circular polarized plate may be provided. For example, a polarized plate or a circular polarized plate can be provided over a surface or both surfaces of the display surface.

In the light-emitting device having the structure formed as mentioned above, a material having a light-transmitting property (ITO or ITSO) is used for the first electrode and the second electrode. Therefore, light is emitted from the electroluminescent layer to emitting directions 1305 and 1306 at luminance corresponding to a video signal inputted from a signal line.

Figure 12B:
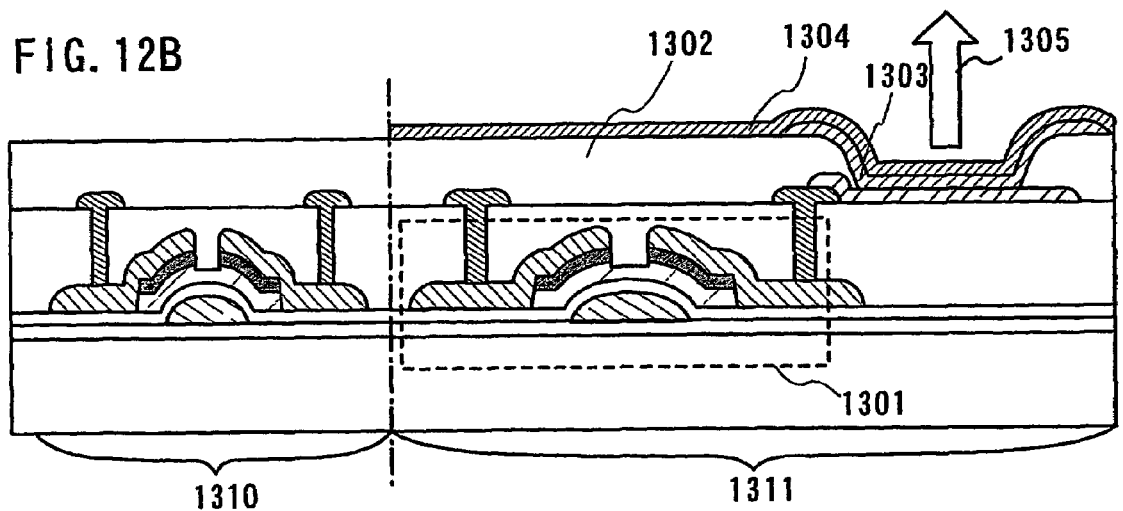

FIG. 12B illustrates a structure example that is partly different from that illustrated in FIG. 12A.

In a structure of a light-emitting device illustrated in FIG. 12B, a channel etching n-channel TFT is provided to the driver circuit portion 1310 and the pixel portion 1311.

A method for manufacturing the channel etching TFT is explained in Embodiment 1, and will not be further explained in this example.

As is the case with FIG. 12A, an n-channel TFT connected to a light-emitting element formed in the pixel portion 1311 is denoted to as a drive TFT 1301. The structure illustrated in FIG. 12B differs from that illustrated in FIG. 12A on the point that the first electrode is formed by a conductive film having a non light transmitting property and preferably having a high light reflecting property, and the second electrode 1304 is formed by a conductive film having a light transmitting property. Therefore, the emitting direction 1305 of light is only at the side of the sealing substrate.

Figure 12C:
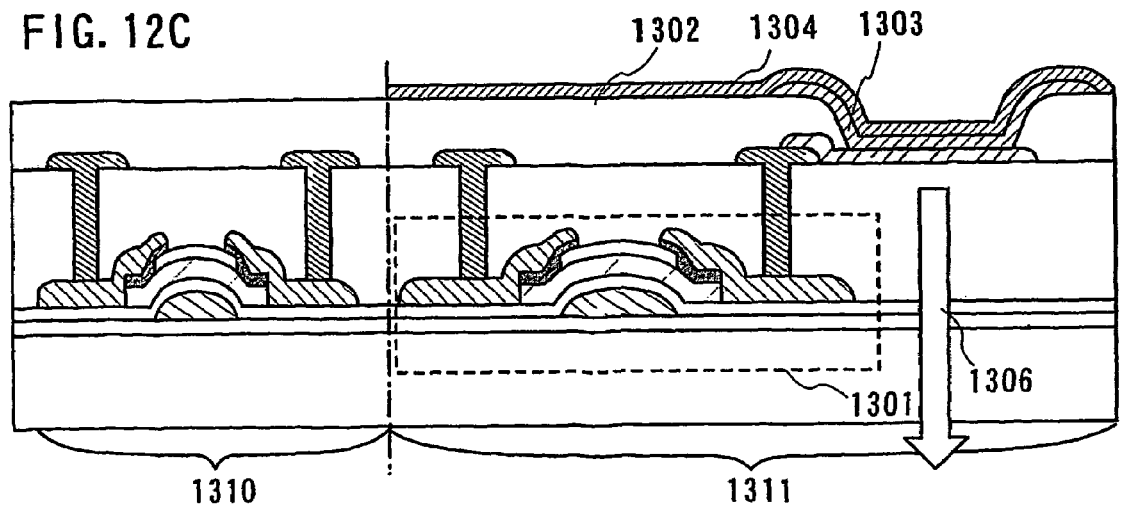

FIG. 12C illustrates a structure example that is partly different from that illustrated in FIG. 12A.

In a structure of a light-emitting device illustrated in FIG. 12C, a channel stop n-channel TFT is provided to the driver circuit portion 1310 and the pixel portion 1311.

A method for manufacturing the channel stop n-channel TFT is explained in Embodiment 5, and will not be further explained in this example.

As is the case with FIG. 12A, an n-channel TFT connected to a light-emitting element formed in the pixel portion 1311 is denoted to as a drive TFT 1301. The structure illustrated in FIG. 12C differs from that illustrated in FIG. 12A on the point that the first electrode is formed by a conductive film having a light transmitting property, and the second electrode 1304 is formed by a conductive film having a non light transmitting property and preferably having a high light reflecting property. Therefore, the emitting direction 1306 of light is only at the side of the substrate.

The structure of a light-emitting device using each thin film transistor is explained. The constitution of the thin film transistor and the structure of the light-emitting device can be freely combined with each other.

This example can be freely combined with any one of Embodiments 1 to 6 and Example 1.

Example 3

The structure of a pixel of an EL display panel is explained with reference to an equivalent circuit illustrated in FIG. 13 in this example.

Figure 13A:
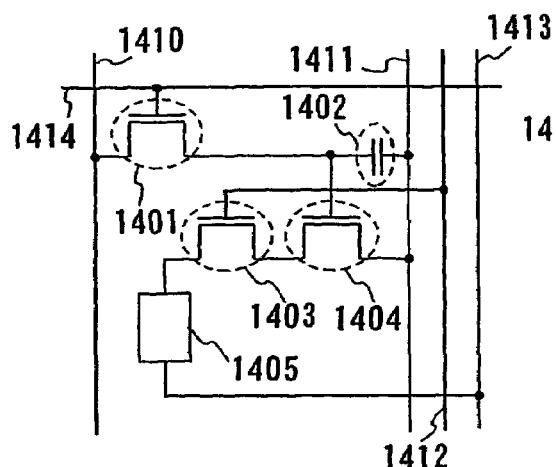
FIGS. 13A to 13F are explanatory views for a structure of a pixel that can be applied to an EL display panel according to the present invention (Example 3)

A pixel illustrated in FIG. 13A is provided with a signal line 1410 and power lines 1411 to 1413 in columns, and a scanning line 1414 in rows. The pixel includes a switching TFT 1401, a drive TFT 1403, a current control TFT 1404, a capacitor element 1402, and a light-emitting element 1405.

Figure 13B:
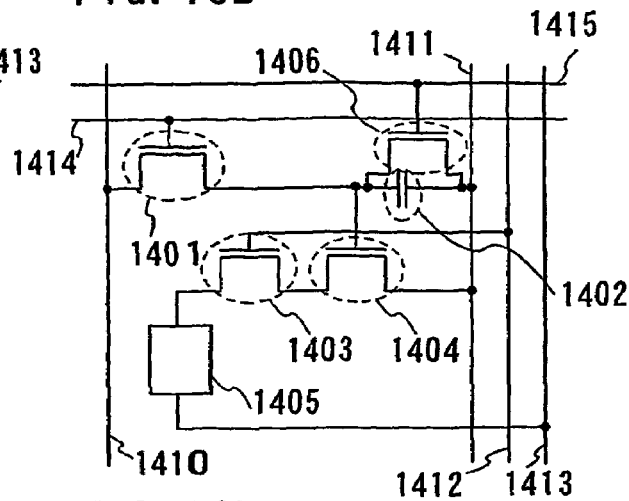
Figure 13C:
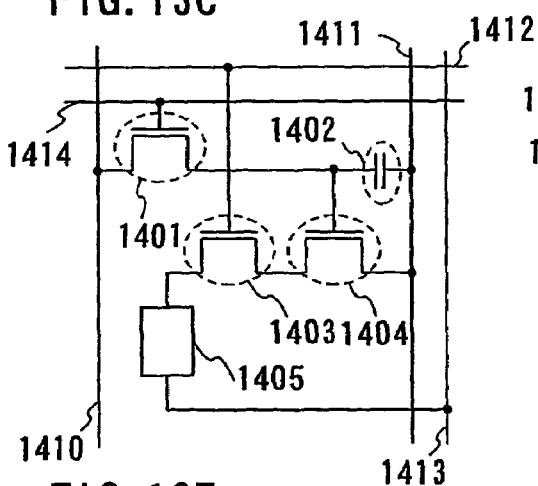
Figure 13D:
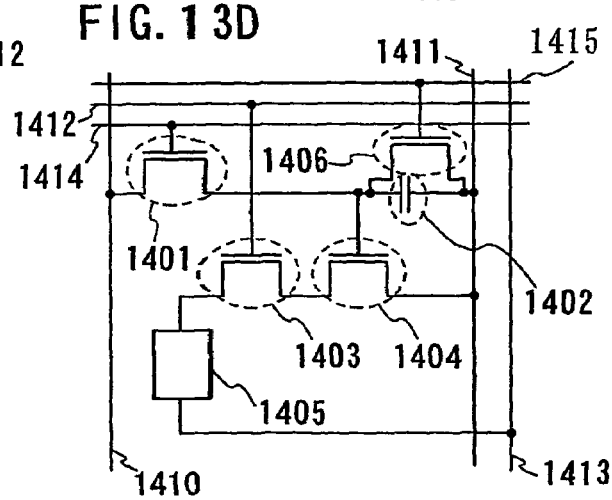

A pixel illustrated in FIG. 13C has the same structure as that of the pixel illustrated in FIG. 13A except the point that a gate electrode of a TFT 1403 is connected to a power line 1412 arranged in rows. That is, both pixels illustrated in FIGS. 13A and 13C show the same equivalent circuit diagrams. However, in the case of arranging the power line 1412 in columns (FIG. 13A) and in the case of arranging the power line 1412 in rows (FIG. 13C), each of the power line is formed by a conductive layer of a different layer. Here, wirings connected with the gate electrode of the TFT 1403 are focused and illustrated in both FIGS. 13A and 13C to show that the wirings are formed by different layers.

As characteristics of pixels illustrated in FIGS. 13A and 13C, the points that the TFTs 1403 and 1404 are connected with each other in series, and a channel length $L_3$ and a channel width $W_3$ of the TFT 1403; and a channel width $W_4$ and a channel length $L_4$ of a TFT 1404 are set to meet $L_3/W_3$: $L_4/W_4$=5 to 6000:1. As an example in the case that lengths and widths meet 6000:1, $L_3$ may be 500 μm; $W_3$, 3 μm; $L_4$, 3 μm; and $W_4$, 100 μm.

Further, the TFT 1403 operates in a saturation region to control a current value flowing into the light-emitting element 1405, whereas the TFT 1404 operates in a linear region to control current supply to the light-emitting element 1405. The both TFTs have preferably the same conductive types in terms of a manufacturing process. As the TFT 1403, not only an enhancement TFT but also a depletion TFT can be used. According to the present invention having the foregoing structure, a slight variation of $V_{GS}$ of the TFT 1404 does not affect the current value of the light-emitting element 1405. That is, the current value of the light-emitting element 1405 is determined by the TFT 1403 operating in a saturation region. According to the present invention having the forgoing structure, a display device in which unevenness of luminance due to variations of characteristics of a TFT is improved and image quality is also improved can be provided.

In pixels illustrated in FIGS. 13A to 13D, the TFT 1401 controls input of a video signal to the pixel. Upon the TFT 1401 turning ON and inputting a video signal to the pixel, the video signal is stored in the capacitor element 1402. FIGS. 13A and 13C illustrate the structure of having the capacitor element 1402, however, the present invention is not limited thereto. In the case that the capacity for storing the video signal can be covered by gate capacitor or the like, the capacity element 1402 is not required to be expressly provided.

The light-emitting element 1405 has the structure composed of a pair of electrodes and an electroluminescent layer interposed between the pair of electrodes. In order to apply forward bias voltage, an electric potential difference is provided between a pixel electrode and an opposing electrode (between an anode and a cathode). The electroluminescent layer is formed by various materials such as an organic material or an inorganic material. Luminescence generated from the electroluminescent layer is light emission (fluorescence) produced in returning excited molecules from the singlet excited state to the ground state, and light emission (phosphorescence) produced in returning excited molecules from the triplet excited state to the ground state.

A pixel illustrated in FIG. 13B has the same structure as that of the pixel illustrated in FIG. 13A except the point that a TFT 1406 and the scanning line 1415 are provided. Similarly, a pixel illustrated in FIG. 13D has the same structure as that of the pixel illustrated in FIG. 13C except the point that the TFT 1406 and the scanning line 1415 are provided.

ON/OFF of the TFT 1406 is controlled by the scanning line that is newly provided. Upon the TFT 1406 turning ON, charges stored in the capacitor element 1402 are discharged and the TFT 1406 is turned OFF. That is, it can possible to make compellingly the state that current does not flows through the light-emitting element 1405 by the arrangement of the TFT 1406. Therefore, duty ratio can be improved, since the structures illustrated in FIGS. 13B and 13D can start a light period simultaneously with or soon after the start of a write period without waiting the write of signals into all of pixels.

Figure 13E:
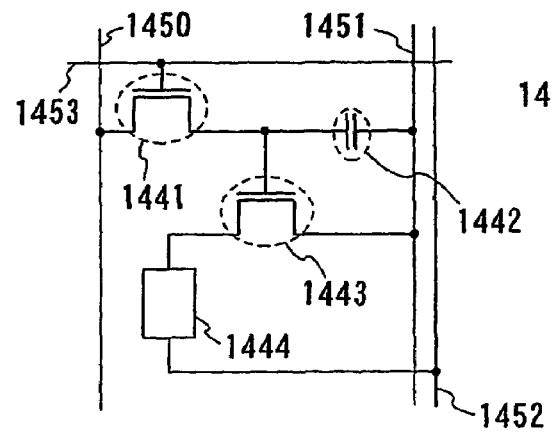
Figure 13F:
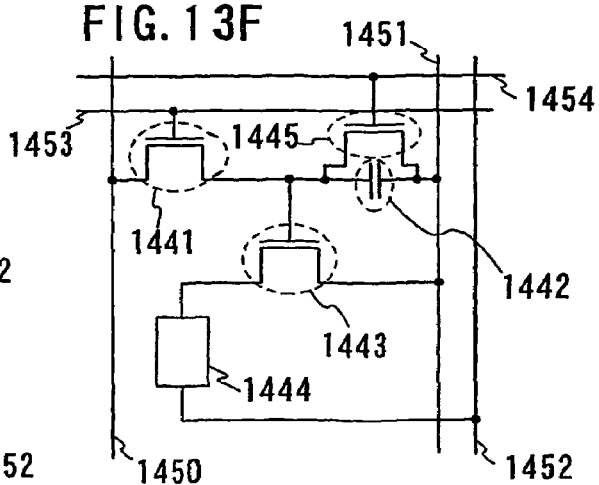

A pixel illustrated in FIG. 13E is provided with a signal line 1450, power lines 1451, and 1452 in columns, and a scanning line 1453 in rows. The pixel includes a switching TFT 1441, a drive TFT 1443, a capacitor element 1442, and a light-emitting element 1444. A pixel illustrated in FIG. 13F has the same structure as that of the pixel illustrated in FIG. 13E except the point that a TFT 1445 and a scanning line 1454 are provided. Further, the structure of FIG. 13F can improve duty ratio by the arrangement of the TFT 1445.

This example can be freely combined to any one of Embodiments 1 to 6 and Examples 1 and 2.

Example 4

A display module is explained in this example. As an example of the display module, FIG. 14 illustrates a cross-sectional view of a light emission display module.

Figure 14A:
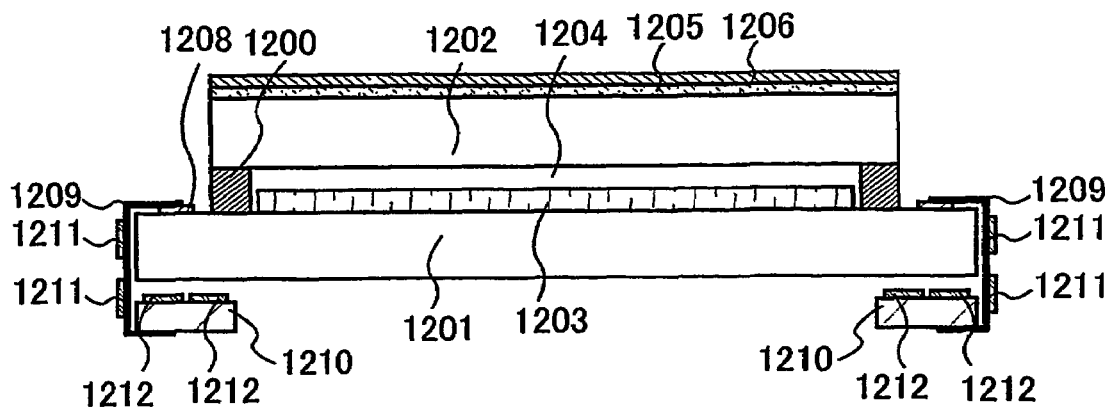
FIGS. 14A to 14C are cross-sectional views of a light-emitting display module (Example 4)

FIG. 14A illustrate a cross-section of a light emission display module secured with an active matrix substrate 1201 and a sealing substrate 1202 by sealant 1200. A pixel portion 1203 is provided between the active matrix substrate 1201 and the sealing substrate 1202 to form a display region.

A space 1204 is formed between the sealing substrate 1202 and the pixel portion 1203. The space is filled with an inert gas, for example, nitride gas; or provided with a resin having a light transmitting property and high water absorbing property, accordingly, moisture or oxygen can be further prevented from penetrating. Alternatively, resin having a light transmitting property and a high water absorbing property can be formed. Even if light generated from a light-emitting element is emitted to a second substrate by resin having light transmitting property, a display module can be formed without reducing transmittance.

To increase contrast, a polarized plate or a circular polarized plate (polarized plate, and ¼λ plate and ½λ plate) may be provided to at least the pixel portion of the module. In the case that display is recognized from the side of the sealing substrate 1202, the sealing substrate 1202, ¼λ plate and ½λ plate 1205, and a polarized plate 1206 may be preferably provided sequentially. Moreover, an antireflection film may be provided over the polarized plate.

In the case that display is recognized from both sides of the sealing substrate 1202 and the active matrix substrate 1201, ¼λ plate and ½λ plate 1205, and a polarized plate 1206 are preferably provided over the active matrix substrate 1201.

A wiring substrate 1210 is connected to a connecting terminal 1208 provided to the active matrix substrate 1201 via an FPC 1209. The FPC or a connecting wiring is provided with a pixel driver circuit (IC chip, driver IC, or the like) 1211 and the wiring substrate 1210 is installed with an external circuit 1212 such as a control circuit or a power circuit.

Figure 14B:
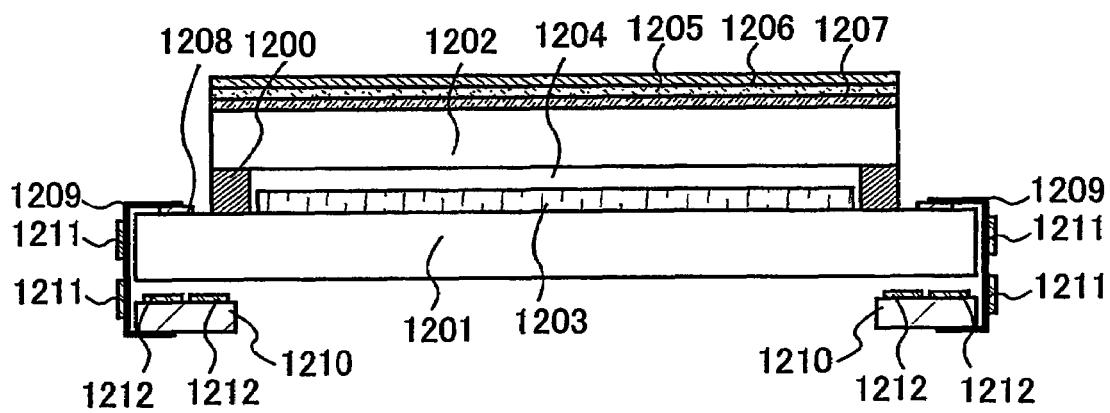

As illustrated in FIG. 14B, a colored layer 1207 can be provided between the pixel portion 1203 and the polarized plate, or between the pixel portion and the circular polarized plate. In this instance, full color display becomes possible by providing a light-emitting element capable of exhibiting white emission to the pixel portion and providing separately a colored layer exhibiting RGB. Alternatively, full color display becomes possible by providing a light-emitting element capable of exhibiting blue emission and providing separately a color conversion layer in the pixel portion. Further alternatively, full color display becomes possible by providing a light-emitting element capable of exhibiting red, green, and blue emission and providing a colored layer. Such display module can display high-definition images with good color purity of each RGB.

Figure 14C:
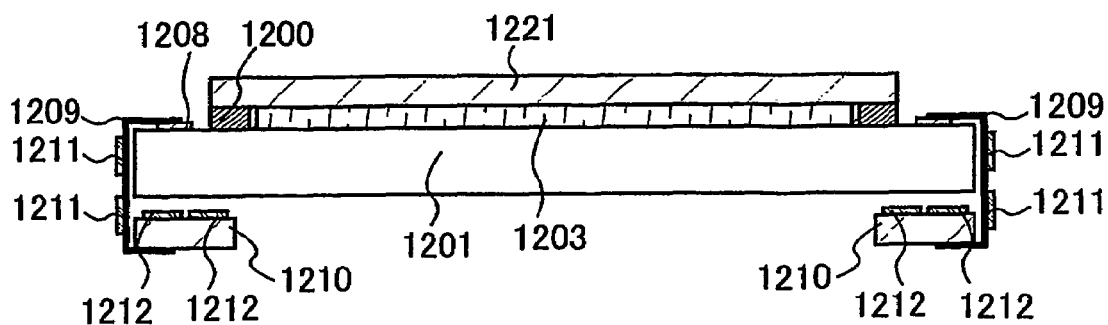

In FIG. 14C, contrary to FIG. 14A, the active matrix substrate and the light-emitting element are sealed by using a protective film 1221 of a film, resin, or the like without using an opposing substrate. The protective film 1221 is provided to cover a second pixel electrode of the pixel portion 1203. As a material for a second protective film, an organic material such as epoxy resin, urethane resin, or silicon resin. The second protective film may be formed by dropping a polymer material by droplet discharging. In this example, the second protective film is formed by discharging epoxy resin by a dispenser and drying. Moreover, an opposing substrate may be provided over the protective film. The other structures are the same as those illustrated in FIG. 14A.

By sealing without using an opposing substrate, a display device can be reduced its weight, size, and thickness.

The module according to this example has the structure in which a printed substrate 1210 is mounted by using the FPC 1209; however, the present invention is not limited thereto. The pixel driver circuit 1211 and the external circuit 1212 may be mounted on the substrate by a COG (Chip On Glass) method.

This example can be freely combined to any one of Embodiments 1 to 6 and Examples 1 to 3.

Example 5

In this example, a drying agent of a display panel explained in the foregoing example is explained with reference to FIG. 15.

Figure 15A:
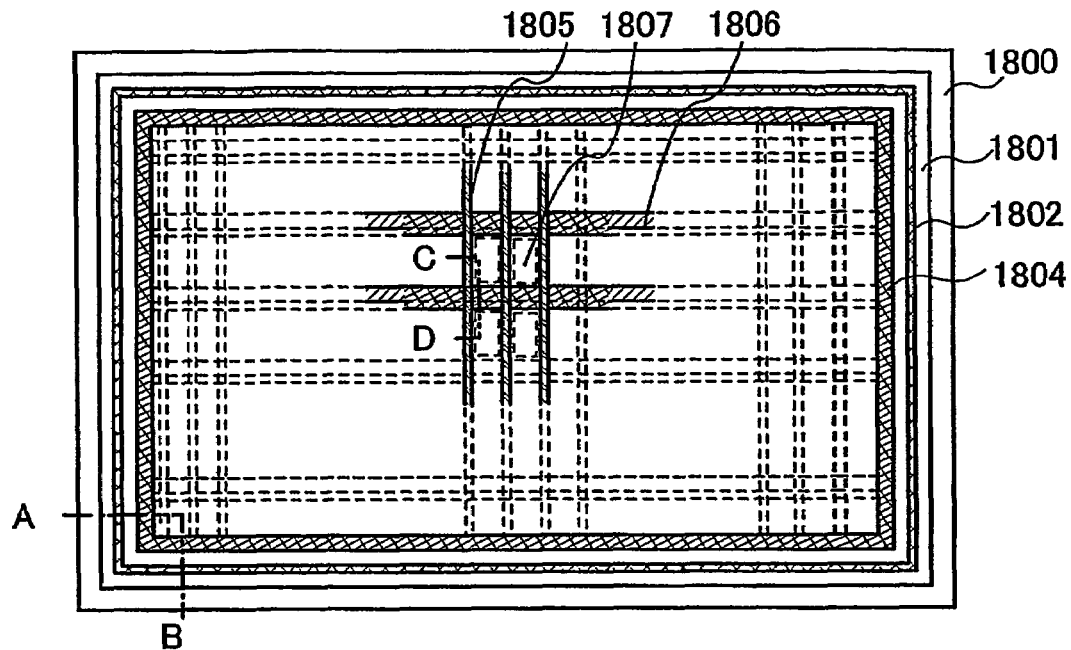
FIGS. 15A to 15C are a top view and cross-sectional views of a display panel (Example 5)
Figure 15B:
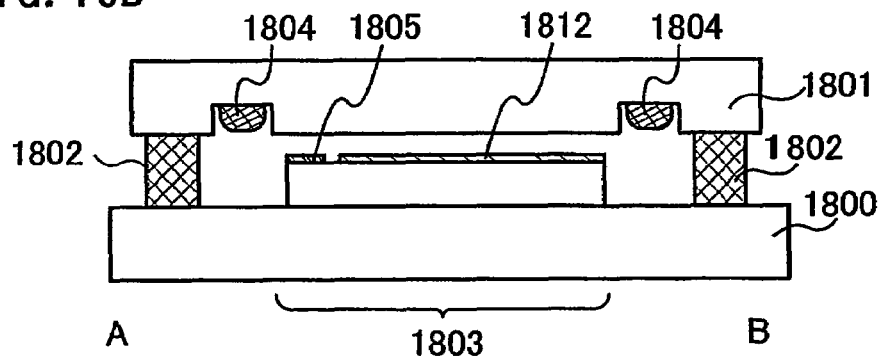
Figure 15C:
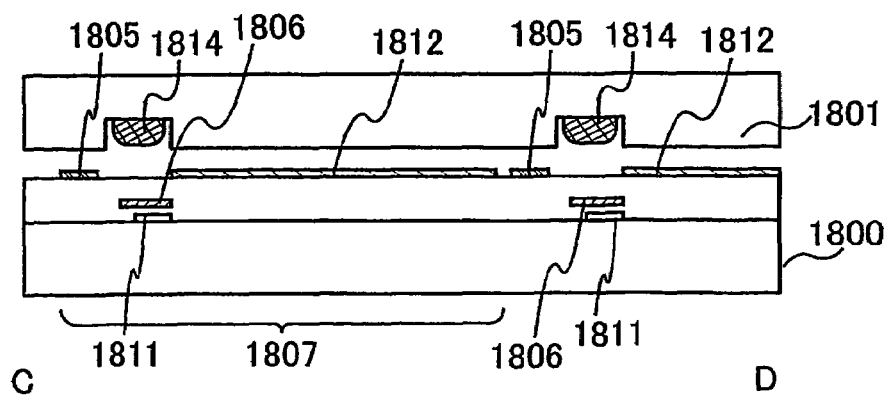

FIG. 15A is a top view of a display panel. FIG. 15B is a cross-sectional view of FIG. 28A taken along line A-B, whereas FIG. 15C is a cross-sectional view of FIG. 15A taken along line C-D.

As illustrated in FIG. 15A, an active matrix substrate 1800 and an opposing substrate 1801 are sealed by sealant 1802. A pixel region is provided between a first substrate and a second substrate. In the pixel region, a pixel 1807 is provided at a crossing region of a source wiring 1805 and a gate wiring 1806. A drying agent 1804 is provided between the pixel region and the sealant 1802. In the pixel region, a gate wiring or a source wiring is provided, and a drying agent 1814 is provided at the top portion. Here, the drying agent 1814 is provided over the gate wiring; however, the drying agent 1814 can be provided over the gate wiring and the source wiring.

As the drying agent 1804, a material that absorbs water ($H_2O$) by chemical absorption such as oxides of alkali earth metal such as calcium oxide (CaO) or barium oxide (BaO). Alternatively, a material that absorbs water by physical absorption such as zeolite or silica gel can be used.

A drying agent can be contained in resin having high moisture permeability in the state of granularity to be secured to the substrate. As the resin having high moisture permeability, acrylic resin such as ester acrylate, ether acrylate, ester urethane acrylate, ether urethane arylate, butadiene urethane acrylate, peculiarity urethane acrylate, epoxy acrylate, amino resin acrylate, or acrylic resin acrylate can be used. Besides, epoxy resin such as bisphenol A type liquid resin, bisphenol A type solid resin, bromine epoxy resin, bisphenol F type resin, bisphenol AD type resin, phenol resin, cresol resin, novolac resin, cyclic aliphatic epoxy resin, epi-bis epoxy resin, glycidyl ester based resin, glycidyl amine based resin, heterocyclic epoxy resin, or modified epoxy resin. Another material can be used. For example, an inorganic material such as siloxane can be used.

As the material having a water absorbing property, a composite that is formed by mixing molecules that can absorb water by chemical absorption into organic solvent to be solidified can be used.

As the foregoing inorganic materials or resin having high moisture permeability, a material having higher moisture permeability than that of a material used as the foregoing sealant.

In the above-mentioned light-emitting device according to the present invention, water penetrated into the light-emitting device from outside can be absorbed before reaching the region provided with a light-emitting element. As a result, an element provided to a pixel, typically, a light-emitting element can be prevented from being damaged due to water.

As illustrated in FIG. 15B, the drying agent 1804 is provided between the sealant 1802 and the pixel region 1803 at the periphery of the display panel. A concave portion is provided to the active matrix substrate or the opposing substrate to provide the drying agent 1804. Accordingly, the display panel can be manufactured to be thin.

As illustrated in FIG. 15C, a pixel region 1807 is provided with a semiconductor region 1811 that is a part of a semiconductor element for driving a display element; a gate wiring 1806; a source wiring 1805; and a pixel electrode 1812. In the pixel portion of the display panel, the drying agent 1814 is provided to the opposing substrate to be overlapped with the gate wiring 1806. Since the width of the gate wiring is two to four times larger than that of the source wiring, opening ration is not reduced and deterioration due to water penetration into the light-emitting element can be restricted by providing the drying agent 1814 over the gate wiring 1816 that is a non display region.

This example can be freely combined with any one of Embodiments 1 to 6, and Examples 1 to 4.

Example 6

In this example, an example of using droplet discharging for dropping liquid crystals is described. In this example, FIGS. 25A to 25D illustrate an example of manufacturing a panel for taking four panels from one large substrate 1110.

Figure 25A:
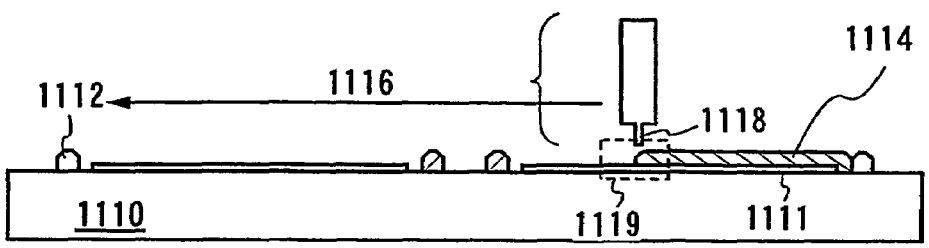
FIGS. 25A to 25D are a perspective view and cross-sectional views for showing droplet discharging of a liquid crystal (Example 6)

FIG. 25A is a cross-sectional view in forming a liquid crystal layer by dispenser (or ink jetting). A liquid crystal material 1114 is discharged, spraying, or dropping from a nozzle 1118 of a liquid crystal discharging device 1116 so as to cover a pixel portion 1111 surrounded by sealant 1112. The liquid crystal discharging device 1116 is moved in the direction indicated by arrow in FIG. 25A. Further, an example of moving the nozzle 1118 is explained, however, the nozzle may be secured and the substrate may be moved to form the liquid crystal layer.

Figure 25B:
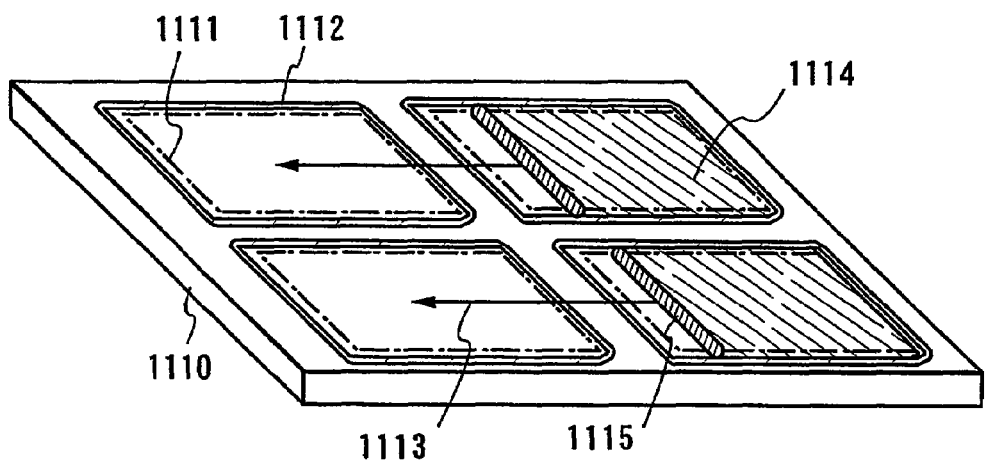

FIG. 25B is a perspective view. FIG. 25B illustrates that the liquid crystal material 1114 is selectively discharged, spraying, or dropping only to the region surrounded by the sealant 1112; and a drop surface 1115 is moved along with a nozzle scanning direction 1113.

Figure 25C:
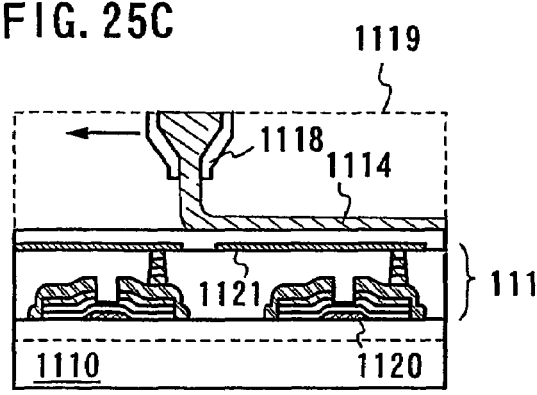
Figure 25D:
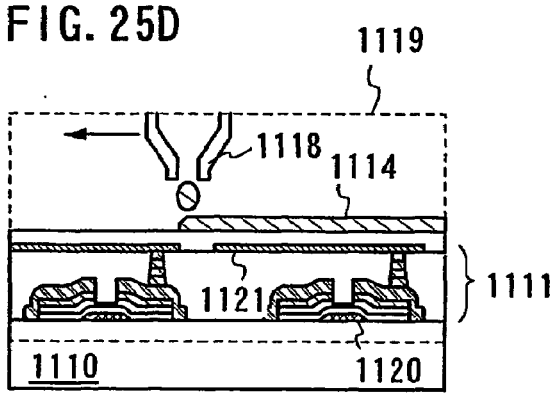

FIGS. 25C and 25D are enlarged cross-sectional views for showing a region encircled by dotted line 1119 illustrated in FIG. 25A. In the case that the liquid crystal material has high viscosity, the liquid crystal material is discharged continuously and adhered to the surface in the form of a kind of ribbon. On the other hand, in the case that the liquid crystal material has low viscosity, the liquid crystal material is discharged intermittently, that is, droplets are dropped as shown in FIG. 25D.

In FIG. 25C, reference numeral 1120 denote a reverse staggered TFT obtained according to Embodiment 1, and 1121 denotes a pixel electrode, respectively. The pixel portion 1111 is composed of a pixel electrode arranged in a matrix configuration, a switching element connected to the pixel electrode, the reverse staggered TFT (that is used in this instance), and a retention volume (not shown).

A manufacturing flow of a panel is hereinafter explained with reference to FIGS. 26A to 26D.

Figure 26A:
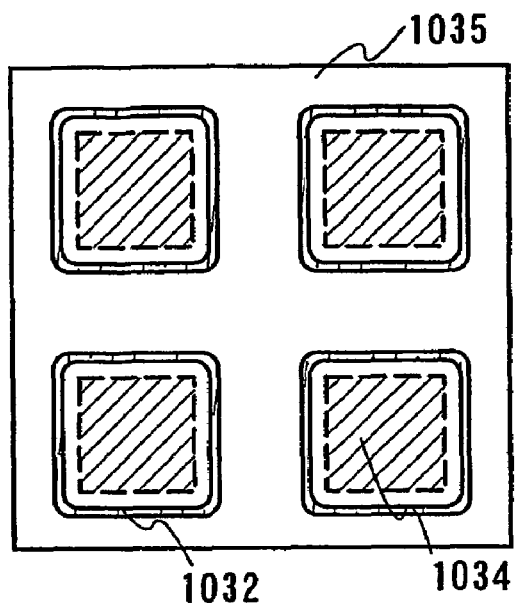
FIGS. 26A to 26D show a top view for showing carrying out processes (Example 6)

A first substrate 1035 provided with a pixel portion 1034 over the insulating surface is prepared. The first substrate 1035 is preliminarily provided with an orientation film, performed with rubbing treatment, dispersed with a spherical spacer or provided with a columnar spacer, or provided with a color filter. Then, as illustrated in FIG. 26A, sealant 1032 is formed at the predetermined position (pattern surrounding the pixel portion 1034) over the first substrate 1035 in an inert gas atmosphere or under reduced pressure by a dispenser device or an ink jet device. As the semitransparent sealant 1032, a material including filler (diameter of from 6 to 24 μm) and having viscosity of 40 to 400 Pa/s is used. Further, the sealant that is not dissolved in liquid crystal that is to be in contact with the sealant is preferably selected. As the sealant, acrylic photo curing rein or acrylic heat curing resin may be used. The sealant 1032 can be formed by printing since it only has to form a simple pattern.

Figure 26B:
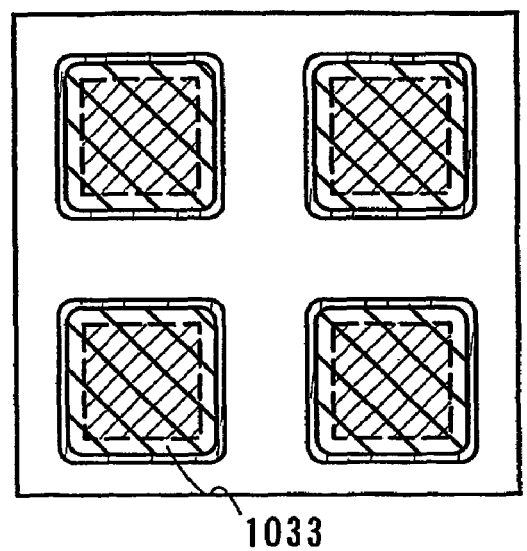

A liquid crystal 1033 is dropped by ink jetting in the region surrounded by the sealant 1032 (FIG. 26B). As the liquid crystal 1033, a known liquid crystal material that has viscosity capable of being discharged by ink jetting is used. Since the viscosity of a liquid crystal material can be set by controlling temperature, a liquid crystal material is suitable for ink jetting. By ink jetting, a necessary amount of the liquid crystal 1033 can be held without waste in the region surrounded by the sealant 1032.

Figure 26C:
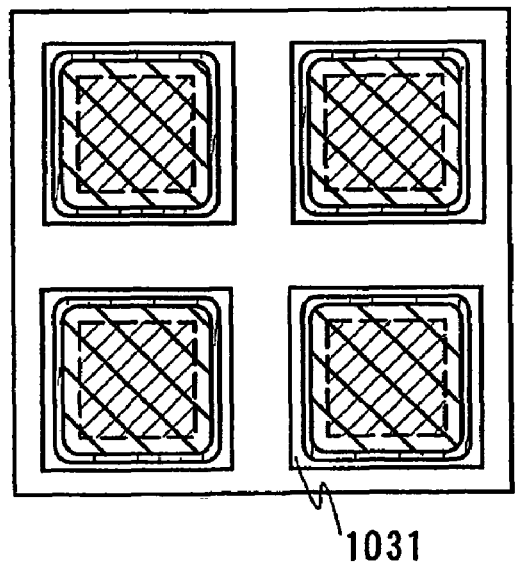

Then, the first substrate 1035 provided with the pixel portion 1034 is pasted onto the second substrate 1031 provided with the opposing electrode or the oriented film under reduced pressure so that air bubbles are not entered between the two substrates (FIG. 26C). In this instance, the sealant 1032 is cured by ultraviolet irradiation or heat treatment simultaneously with the pasting. In addition to the ultraviolet irradiation, heat treatment can also be performed.

Figure 27A:
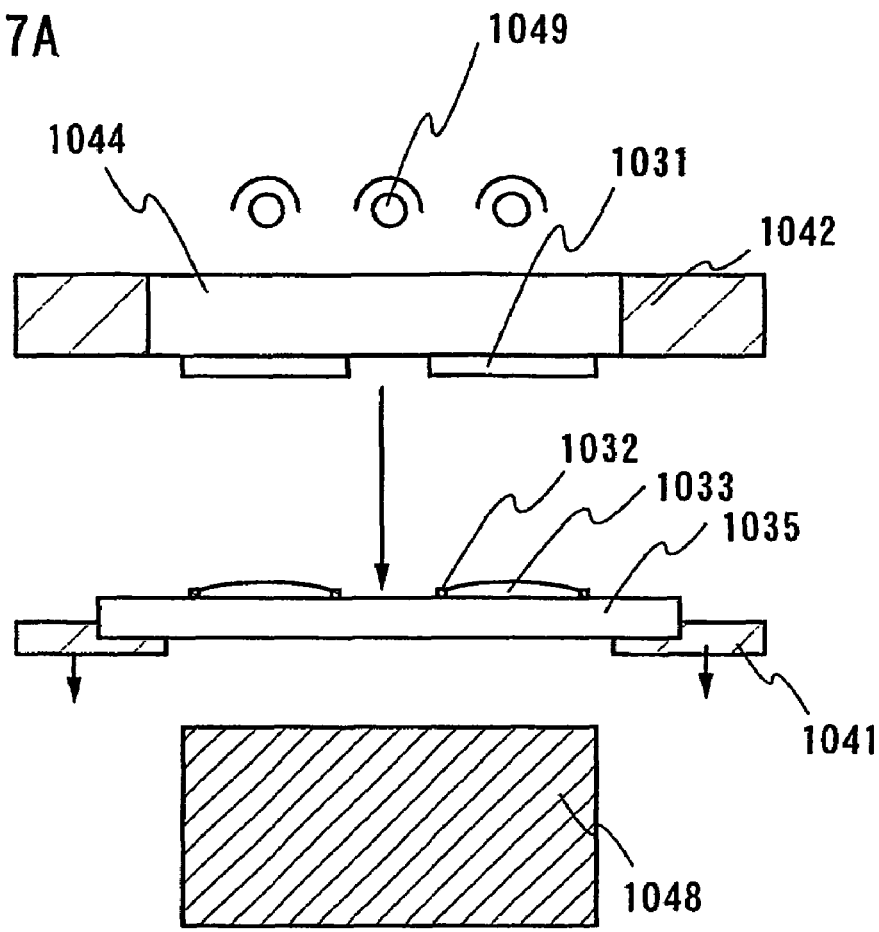
FIGS. 27A and 27B are cross-sectional view for showing a pasting device and a pasting process (Example 6)
Figure 27B:
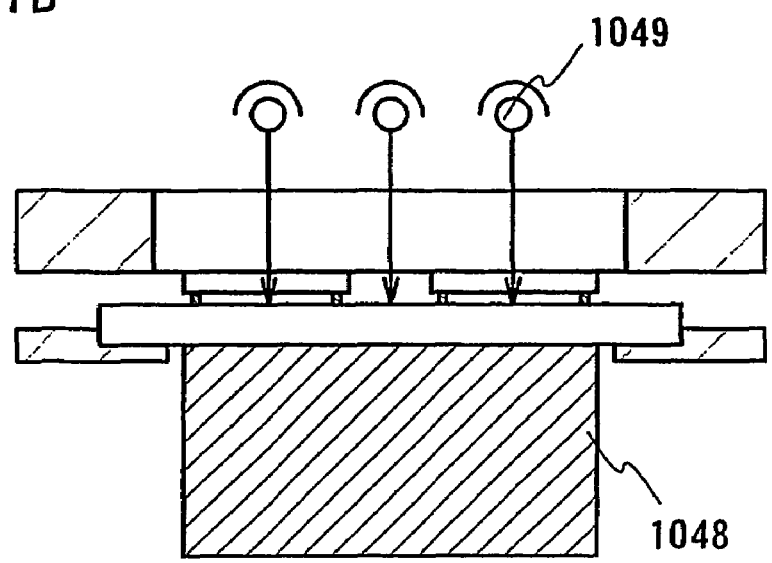

FIGS. 27A and 27B illustrate an example of a pasting device capable of performing UV irradiation or heat treatment in pasting or after pasting.

In FIGS. 27A and 27B, reference numeral 1041 denotes a first substrate support medium; 1042, a second substrate support medium; 1044, a window; 1048, a lower surface table; and 1049, a light source. In FIGS. 27A and 27B, like components are denoted by like numerals as of FIG. 26.

The lower surface table 1048 is installed with a heater for curing sealant. The second substrate support medium is provided with the window 1044 to pass ultraviolet light from the light source 1049. Although not shown, alignment of a substrate is performed through the window 1044. The second substrate 1033 serving as an opposing substrate is preliminarily cut into a desired size and secured to the second substrate support medium 1042 by a vacuum chuck. FIG. 27A illustrates the state of before being pasted.

In pasting, the first substrate support medium and the second substrate support medium are moved down, and the both substrates 1035 and 1031 are pasted together, then, ultraviolet light is emitted to the pasted substrates to be cured. FIG. 27B illustrates the state of after pasting.

Figure 26D:
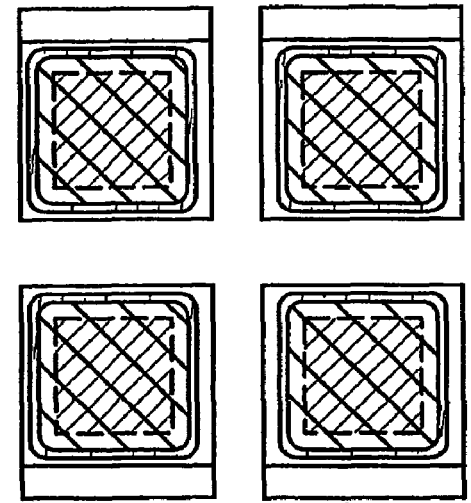

Then, the first substrate 1035 is cut by using a cutting device such as a scriber device, a breaker device, a roll cutter device, or the like (FIG. 26D). Accordingly, four substrates are manufactured from one substrate. Then, an FPC is pasted to the panels by known technique.

As the first substrate 1035 and the second substrate 1031, a glass substrate or a plastic substrate can be used.

Figure 28A:
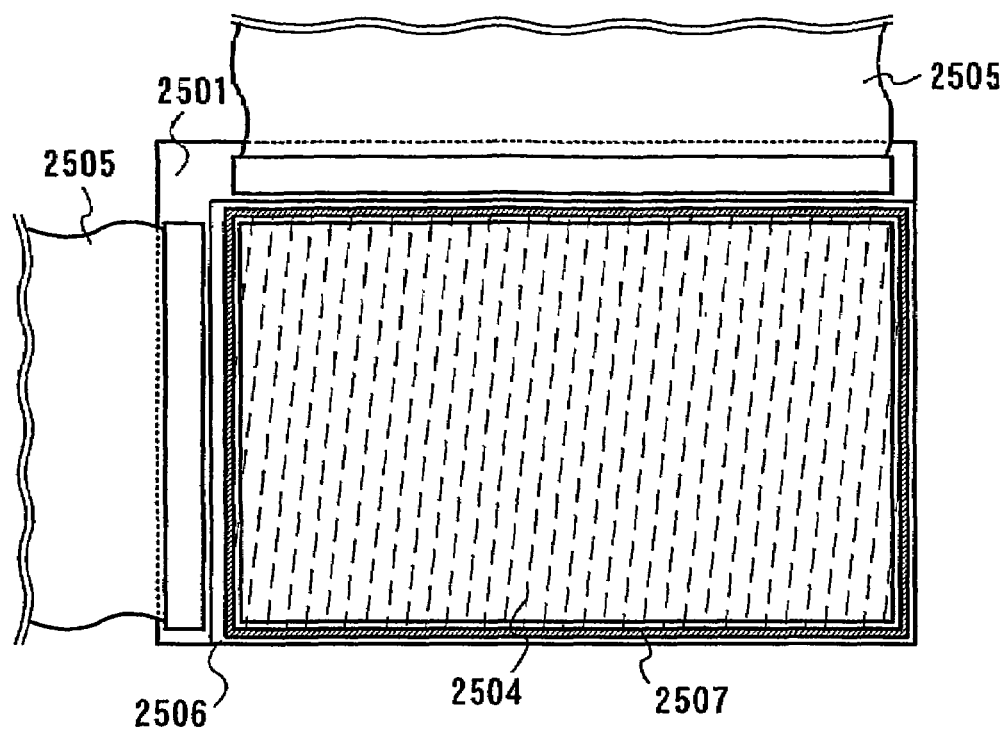
FIGS. 28A and 28B are top views of a liquid crystal module (Example 6)
Figure 28B:
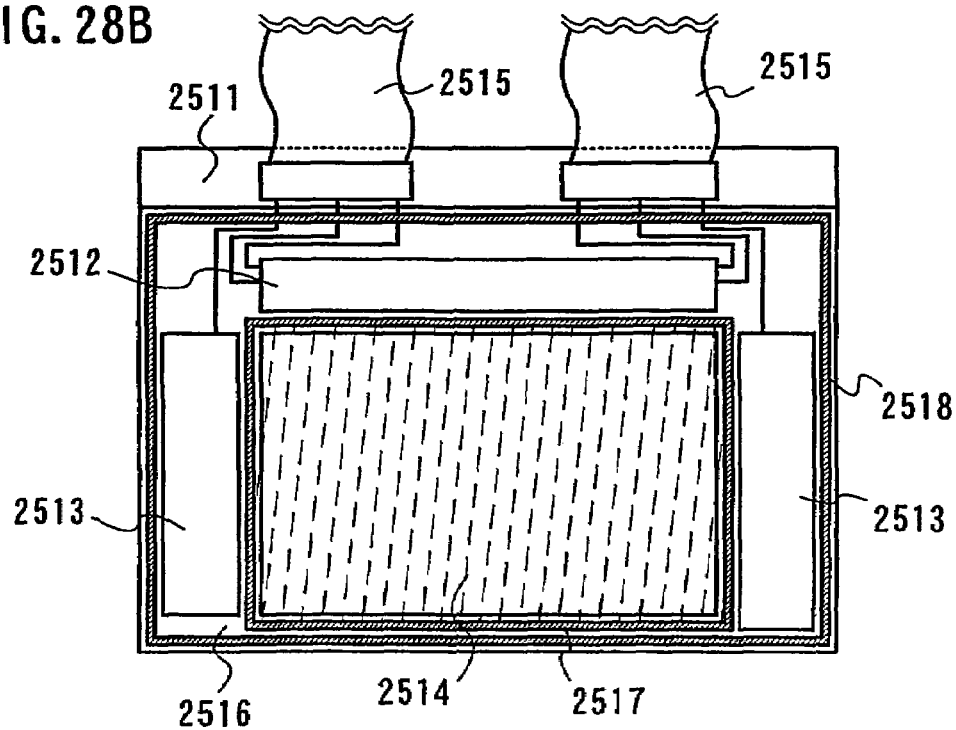

FIG. 28A illustrates a top view of a liquid crystal module obtained according to the foregoing processes. FIG. 28B illustrates an example of a top view of another liquid crystal module.

In FIG. 28A, reference numeral 2501 denotes an active matrix substrate; 2506, an opposing substrate; 2504, a pixel portion; 2507, sealant; and 2505, an FPC. Further, a liquid crystal is discharged by droplet discharging and the pair of substrates 2501, 2506 are pasted by the sealant 2507 under reduced pressure.

In the case that a TFT having an active layer made from a semiamorphous silicon film, a part of a driver circuit can be manufactured and a liquid crystal module as illustrated in FIG. 28B can be manufactured.

Figure 30:
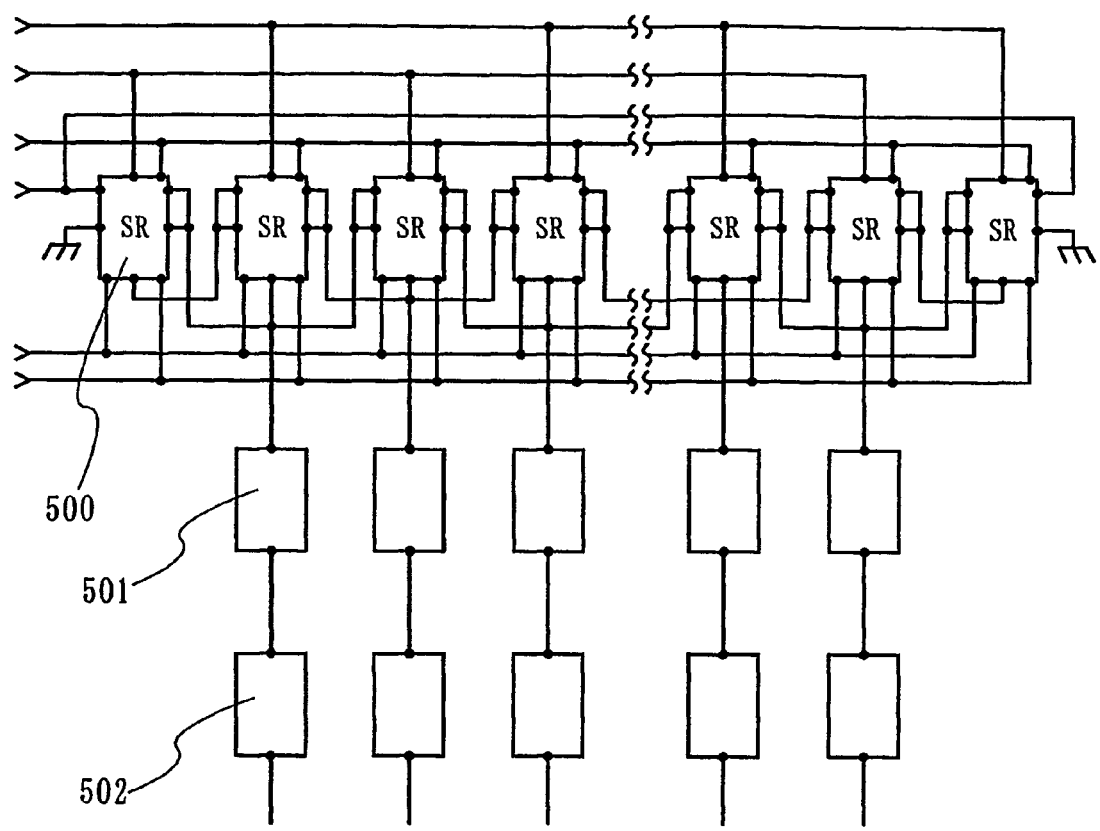
FIG. 30 is a block diagram of a driver circuit (Example 6)

FIG. 30 is a block diagram of a scanning line driver circuit composed of an n-channel TFT using semiamorphous silicon (SAS) from which electric field effect mobility of from 5 to 50 $cm^2/Vsec$ can be obtained.

In FIG. 30, a block denoted by reference numeral 500 corresponds to a pulse output circuit that outputs one stage of a sampling pulse. A shift resister is composed of n numbers of pulse output circuits. Reference numeral 501 denotes a buffer circuit. A pixel 502 is connected to the tip of the buffer circuit.

Figure 31:
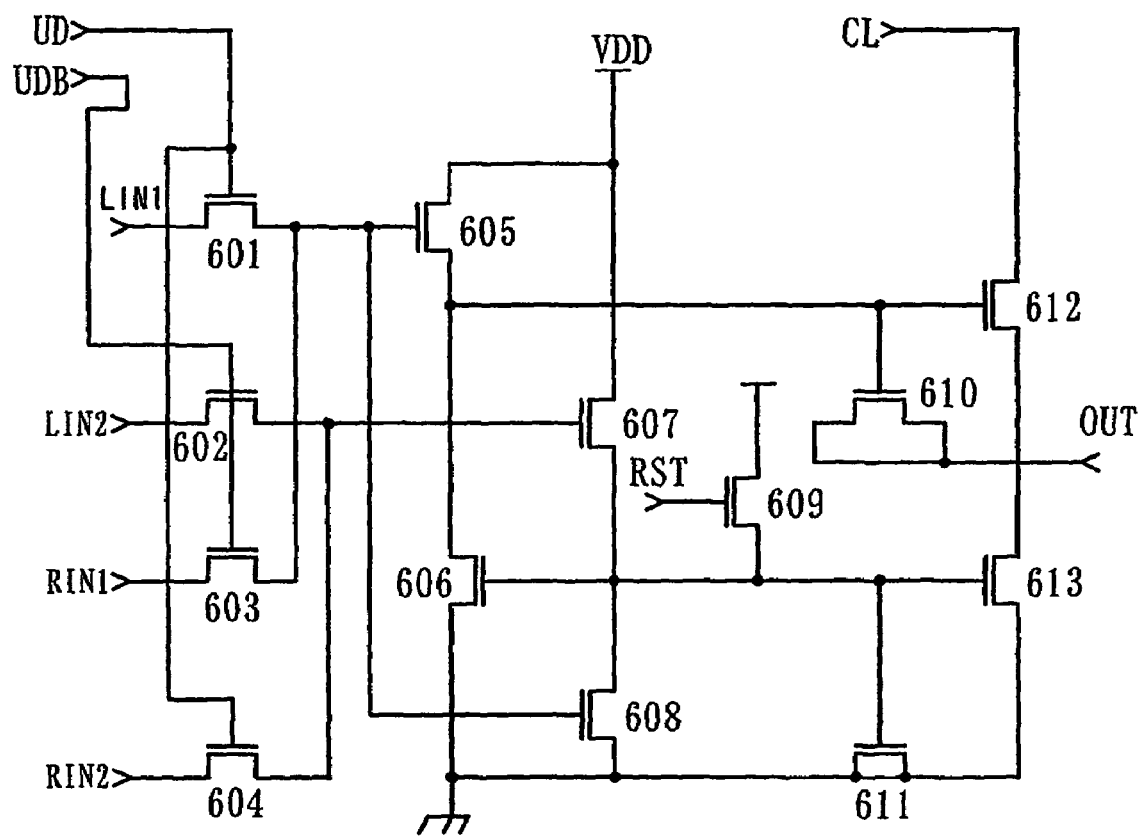
FIG. 31 is a circuit diagram of a driver circuit (Example 6)

FIG. 31 illustrates a specific configuration of the pulse output circuit 500, which is composed of n-channel TFTs 601 to 613. The sizes of the TFTs may be determined in consideration of operating characteristics of the n-channel TFTs using semiamorphous semiconductor (SAS). For example, if the channel length is 8 μm, the channel width can be set in the range of 10 to 80 μm.

Figure 32:
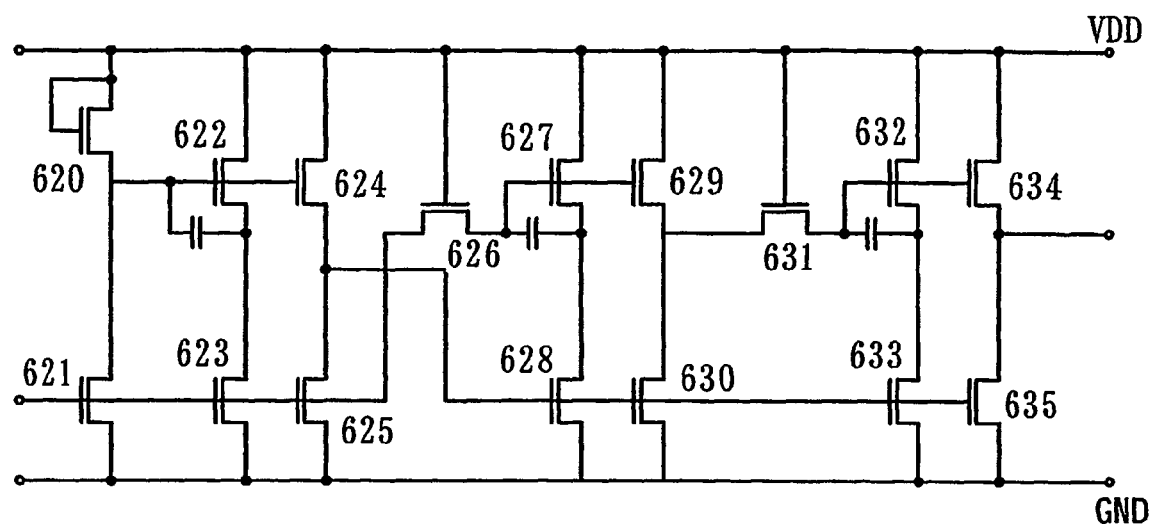
FIG. 32 is a circuit diagram of a driver circuit (Example 6)

FIG. 32 illustrates a specific configuration of the buffer circuit 501. The buffer circuit is also composed of n-channel TFTs 620 to 635. The sizes of the TFTs may be determined in consideration of operating characteristics of the n-channel TFTs using semiamorphous semiconductor (SAS). For example, if the channel length is 10 μm, the channel width can be set in the range of 10 to 1800 μm.

A driver circuit that cannot be formed by a TFT having an active layer formed by a semiamorphous silicon film is mounted with an IC chip (not shown).

In FIG. 28B, reference numeral 2511 denotes an active matrix substrate; 2516, an opposing substrate; 2512, a source signal line driver circuit; 2513, a gate signal line driver circuit; 2514, a pixel portion; 2517, first sealant; and 2515, an FPC. Further, a liquid crystal is discharged by droplet discharging and the pair of substrates 2511, 2516 are pasted by the first sealant 2517 and second sealant under reduced pressure. The driver circuit portions 2512, 2513 do not require a liquid crystal, and so a liquid crystal is provided to only the pixel portion 2514. The second sealant 2518 is provided to reinforce the whole of the panel.

The obtained liquid crystal module are provided with a back light valve 2604 and a mirror, and covered by a cover 2606. Accordingly, an active matrix liquid crystal display device (transparent type) is completed as illustrated partly by the cross-section in FIG. 29. The back light may be arranged to the outside of the display region and a light conductive plate may be used. Further, the cover and the liquid module are secured by adhesive or organic resin. Since the active matrix liquid crystal display device is a transparent type, a polarized plate 2603 is pasted onto both of the active matrix substrate and the opposing substrate. In addition, another optical film (antireflection film, a polarized film, or the like) or a protective film (not shown) may be provided.

Figure 29:
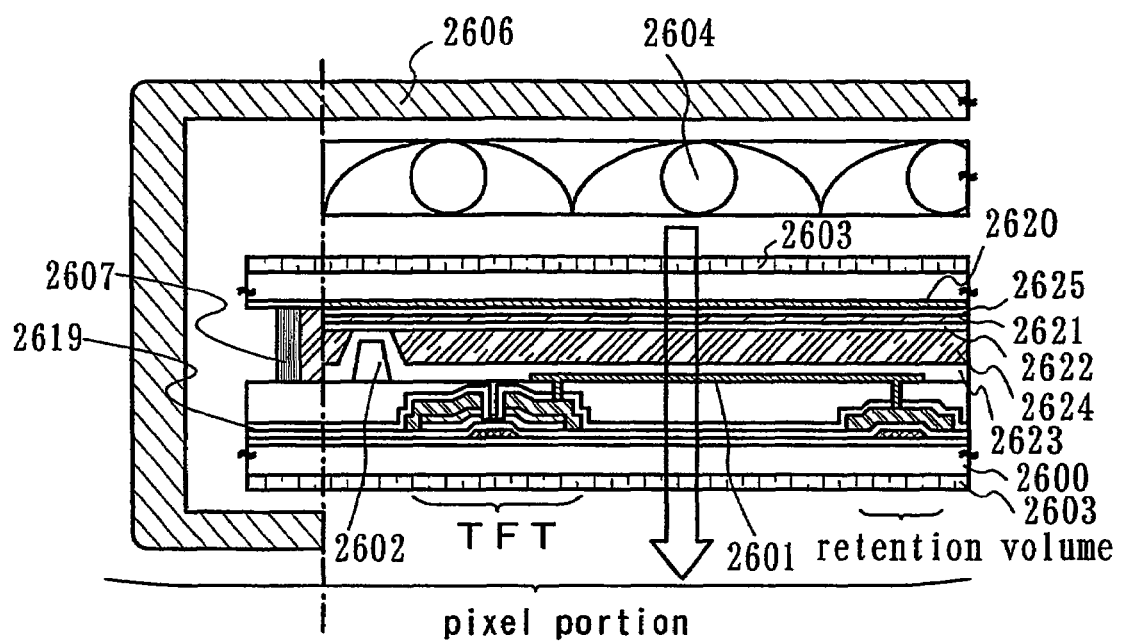
FIG. 29 is a cross-sectional view for showing a structure of an active matrix liquid crystal display device (Example 6)

In FIG. 29, reference numeral 2600 denotes a substrate; 2601, a pixel electrode; 2602, a columnar spacer; 2607, sealant; 2620, a color filter in which a colored layer and a light-shielding layer are arranged to correspond to each pixel; 2625, a planarized film; 2621, an opposing substrate; 2622, 2623, oriented films; 2624, a liquid crystal layer; and 2619, a protective film.

This example can be freely combined with any one of Embodiment 1, and Embodiments 7 to 12.

Example 7

Given as examples of such electric appliances manufactured by using a liquid crystal display device and a light-emitting device according to the invention: a camera such as a video camera or a digital camera, a goggles-type display (head mount display), a navigation system, a sound reproduction device (a car audio equipment, an audio set and the like), a personal computer, a game machine, a portable information terminal (a mobile computer, a cellular phone, a portable game machine, an electronic book, or the like), an image reproduction device including a recording medium (more specifically, a device which includes a display for reproducing a recording medium and for displaying the reproduced image such as a digital versatile disc (DVD) and so forth), or the like. FIGS. 33A to 33D show various specific examples of such electric appliances.

Figure 33A:
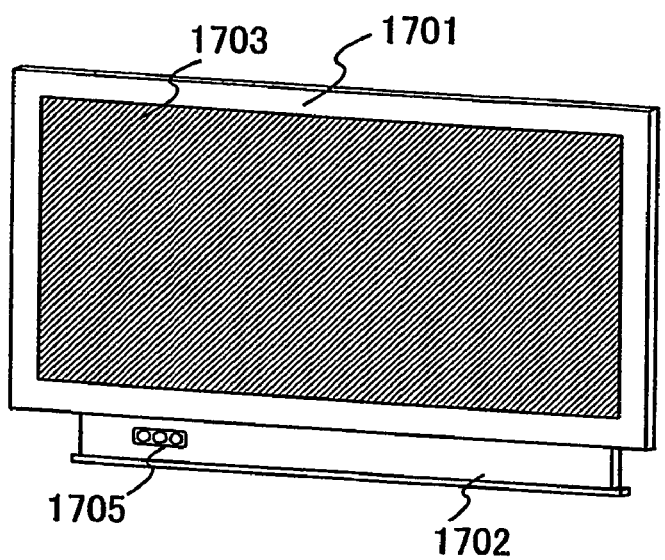
FIGS. 33A to 33D show examples of an electric appliance.

FIG. 33A illustrates a large display device having a large screen of 22 to 50 inches comprising a housing 1701, a support table 1702, a display portion 1703, a video input terminal 1705, and the like. The display device includes all of the display devices for displaying information, such as a personal computer, a receiver of TV broadcasting, and a receiver of bi-directional TV. According to the present invention, a comparative low price large display device can be realized even if a glass substrate of generation five and the subsequent generation having a length of 1000 mm on a side is used.

Figure 33B:
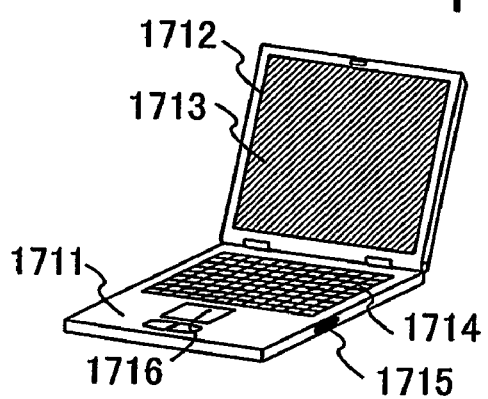

FIG. 33B illustrates a personal computer comprising a main body 1711, a housing 1712, a display portion 1713, a key board 1714, an external connecting port 1715, a pointing mouse 1716, and the like. According to the present invention, a comparative low price personal computer can be realized.

Figure 33C:
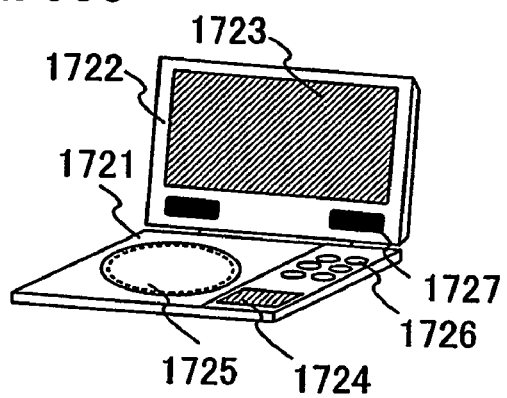

FIG. 33C illustrates a portable image reproduction device including a recording medium (specifically, a DVD reproduction device) comprising a main body 1721, a housing 1722, a display portion A 1723, a display portion B 1724, a recording medium (DVD and the like) reading portion 1725, operation keys 1726, a speaker portion 1727, and the like. The display portion A 1723 displays mainly image information, whereas the display portion B 1724 displays mainly text information. The image reproduction including a recording medium device includes a domestic game machine and the like. According to the present invention, a comparative low price image reproduction device can be realized.

Figure 33D:
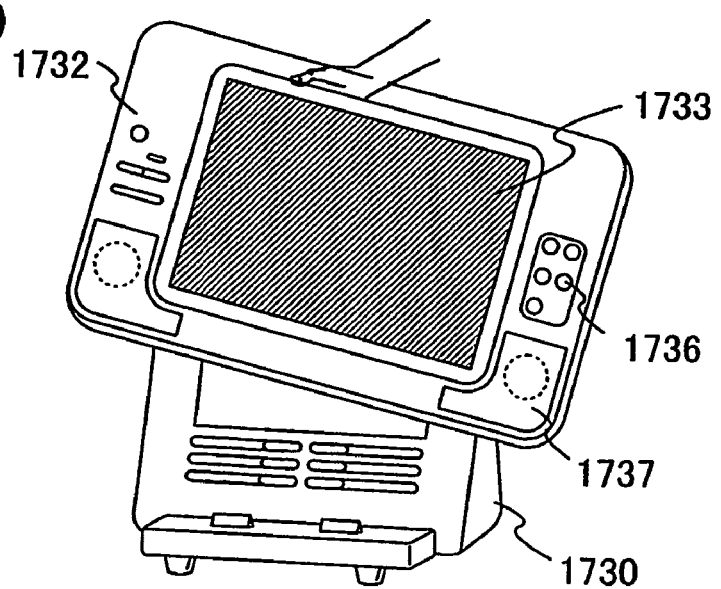

FIG. 33D illustrates a TV having a wireless portable display. A housing 1732 is installed with a battery and a signal receiver, in which the battery drives a display portion 1733 and a speaker portion 1737. The battery has a charger 1730 capable of being charged repeatedly. The charger 1730 can send and receive image signals, and send the image signals to a signal receiver of the display. The housing 1732 is controlled by operation keys 1736. The device illustrated in FIG. 33D may be referred to as an image sound two-way communication device since signals can be sent from the housing 1732 to the charger 1730. Further, the TV can control communications of another electric appliance by sending a signal from the housing 1732 to the charger 1730 using the operation keys 1736 and by sending signals that can be sent by the charger 1730 to another electric appliance. Accordingly, the device may also be referred to as a general remote-control device. According to the present invention, a comparative large (22 to 50 inches) portable TV can be provided by low cost manufacturing processes.

As mentioned above, a light-emitting device or a liquid crystal display device, each of which is obtained by practicing the present invention, can be used as a display portion of various kinds of electric appliance.

This example can be freely combined with Embodiments 1 to 12, and Examples 1 to 6.

INDUSTRIAL APPLICABILITY

According to the present invention, a patterning process can be shortened and an amount of materials can be reduced in a manufacturing process for a light-emitting device or a liquid crystal display device for forming a conductive pattern. Therefore, the costs can be drastically reduced regardless of the substrate size.

EXPLANATION OF REFERENCE

10: substrate, 11: base layer, 12: conductive pattern, 15: gate electrode, 17: leading out electrode, 18: gate insulating film, 19: semiconductor film, 20: semiconductor film, 32; mask, 22: source wiring or drain wiring, 23: source wiring or drain wiring, 24: channel formation region, 25: drain region, 26: source region, 27: protective film, 28: interlayer insulating film, 29: convex portion (pillar), 30: first electrode, 34: bank, 35: sealing substrate, 36 layer containing an organic compound, 37: second electrode, 38: filler, 40: wiring, 41: terminal electrode, 45: anisotropic conductive film, 46: FPC, 220: conductive film pattern, 221: portion irradiated with laser light, 222: source wiring or drain wiring, 223: drain region, 226: source region, 250: conductive pattern, 251: portion irradiated with laser light, 252: source wiring or drain wiring, 253: source wiring or drain wiring, 254: channel formation region, 255: drain region, 256: source region, 260: gate insulating film, 260: gate insulating film, 301: base insulating film, 302: gate electrode, 320: conductive film pattern, 322: source wiring or drain wiring, 323: source wiring or drain wiring, 324: channel formation region, 325: drain region, 326: source region, 401: laser beam directly drawing device, 402: personal computer, 403: laser oscillator, 404: power source, 405: optical system, 406: sound optical modulator, 407: optical system, 408: substrate, 409: substrate, 410: D/A converter, 411: driver, 412: driver, 500: pulse output circuit, 501: buffer circuit, 502: pixel, 601: n-channel TFT, 602: n-channel TFT, 603: n-channel TFT, 604: n-channel TFT, 608: n-channel TFT, 609: n-channel TFT, 610: n-channel TFT, 611: n-channel TFT, 612: n-channel TFT, 613, 620: n-channel TFT, 621: n-channel TFT, 622: n-channel TFT, 623: n-channel TFT, 624: n-channel TFT, 625: n-channel TFT, 626: n-channel TFT, 627: n-channel TFT, 628: n-channel TFT, 629: n-channel TFT, 630: n-channel TFT, 631: n-channel TFT, 632: n-channel TFT, 633: n-channel TFT, 634: n-channel TFT, 635: n-channel TFT, 700: substrate, 701: pixel portion, 702: pixel, 703: scanning line side input terminal, 704: signal line side input terminal, 810: substrate, 811: base film, 815: gate electrode, 818: gate insulating film, 822: wiring, 823: wiring, 824: semiconductor film, 825: wiring, 826: n-type semiconductor film, 827: channel protective film, 828: interlayer insulating film, 829: electrode, 830: electrode, 840: terminal electrode, 841: electrode, 910: substrate, 911:

base film, 915: gate wiring, 918: gate insulating layer, 923: source wiring layer, 924: source wiring layer, 925: n-type semiconductor layer, 926: n-type semiconductor layer, 927: semiconductor layer, 928: interlayer insulating film, 929: electrode, 930: electrode, 940: terminal electrode, 941: electrode, 1031: second substrate, 1032 sealant, 1033: liquid crystal, 1034: pixel portion, 1035: first substrate, 1041 first substrate support medium, 1042: second substrate support medium, 1044: window, 1048: lower surface table, 1049: light source, 1110: large substrate, 1111: pixel portion, 1112: sealant, 1113: nozzle scanning direction, 1114: liquid crystal material, 1115: dropped surface, 1116: droplet discharging device, 1118: nozzle, 1119: portion denoted by dotted line, 1120: reverse staggered TFT, 1121: pixel electrode, 1200: sealant, 1201 active matrix substrate, 1202: sealing substrate, 1203: pixel portion, 1204: space, 1205: ¼λ plate and ½λ plate, 1206: polarized plate, 1207: colored layer, 1208: connecting terminal, 1209 FPC, 1210: printed substrate, 1211: pixel driver circuit, 1212: external circuit, 1221: protective film, 1301: driving TFT, 1302: insulating film, 1303: electroluminescent layer, 1304: second electrode, 1305: emitting direction, 1306: both arrows direction, 1310: driver circuit portion, 1311: pixel portion, 1401 switching TFT, 1402: capacitor element, 1403: driving TFT, 1404: current control TFT, 1405: light-emitting element, 1406: TFT, 1410: signal line, 1411: power line, 1412: power line, 1413: power line, 1414: scanning line, 1415: power line, 1441: switching TFT, 1442: capacitor element, 1443 driving TFT, 1444: light-emitting element, 1445: TFT, 1450: signal line, 1451: power line, 1452: power line, 1453 scanning line, 1454: scanning line, 1500: large substrate, 1503: region, 1504: imaging means, 1505*a* head, 1505*b*: head, 1505*c* head, 1507: stage, 1511: marker, 1600: substrate, 1601: pixel region, 1602: scanning line driver circuit, 1604*a*, 1604*b*, and 1605*a* driver circuit, 1605*b* driver circuit, 1701: housing, 1702: support medium, 1703: display portion, 1705: video input terminal, 1711 main body, 1712: housing, 1713: display portion, 1714: key board, 1715: external connecting port, 1716: pointing mouse, 1721: main body, 1722: housing, 1723: display portion A, 1724: display portion B, 1725 recording medium reading portion, 1726: operation keys, 1727: speaker portion, 1730: charger, 1732: housing, 1733: display portion, 1736: operation keys, 1737: speaker portion, 1800: active matrix substrate, 1801: opposing substrate, 1802: sealant, 1803: pixel region, 1804: drying agent, 1805: source wiring, 1806: gate wiring, 1807: pixel, 1811: pixel, 1812: pixel electrode, 1814: drying agent, 2010: substrate, 2011: base substrate, 2012: conductive film pattern, 2015: gate wiring, 2018: gate insulating film, 2019: semiconductor film, 2020: semiconductor film, 2021: mask, 2022: source wiring or drain wiring, 2023: source wiring or drain wiring, 2024: channel formation region, 2025: drain region, 2026: source region, 2027: protective film, 2028: interlayer insulating film, 2029: convex portion (pillar), 2030: pixel electrode, 2034*a*: oriented film, 2034*b*: oriented film, 2035: opposing substrate, 2036*a*: colored layer, 2036*b*: light-shielding film (black matrix), 2037: overcoat layer, 2038, 2039: liquid crystal, 2040: wiring, 2045: anisotropic conductive layer, 2046: FPC, 2120: conductive film pattern, 2121: portion irradiated with laser light, 2122: source wiring or drain wiring, 2123: source wiring or drain wiring, 2124: channel formation region, 2125: drain region, 2126: source region, 2150: conductive pattern, 2151: portion irradiated with laser light, 2152: source wiring or drain wiring, 2158: source wiring or drain wiring, 2154: channel formation region, 2155: drain region, 2156: source region, 2160: gate insulating film, 2201: base insulating film, 2202: gate electrode, 2220: conductive film pattern, 2222: source wiring or drain wiring, 2223: source wiring or drain wiring, 2224: channel formation region, 2225: drain region, 2226: source region, 2310: substrate, 2311: base insulating, 2315: gate electrode, 2318: gate insulating film, 2322: wiring, 2323: wiring, 2324: semiconductor film, 2325: n-type semiconductor film, 2326: n-type semiconductor film, 2627: channel protective film, 2328: interlayer insulating film, 2329: electrode, 2330: electrode, 2340: terminal electrode, 2341: electrode, 2410, 2411: base film, 2415: gate wiring, 2418: gate insulating layer, 2423: source wiring layer, 2424: drain wiring layer, 2425: n-type semiconductor, 2426: n-type semiconductor, 2427: semiconductor layer, 2428: interlayer insulating film, 2429: electrode, 2430: electrode, 2440: terminal electrode, 2441: electrode, 2501: substrate, 2504: pixel portion, 2505: FPC, 2506: opposing substrate, 2507: sealant, 2511: substrate, 2512: source signal line driver circuit, 2513: gate signal line driver circuit, 2514: pixel portion, 2515: FPC, 2516: opposing substrate, 2517: sealant, 2518: second sealant, 2600: substrate, 2601: pixel electrode, 2602: spacer, 2603: polarized plate, 2604: backlight valve, 2606: cover, 2607: sealant, 2620: CF, 2621: opposing electrode, 2622: oriented film, 2623: oriented film, 2624 liquid crystal layer, 2625: planarized film.

The invention claimed is:

1. A method for manufacturing a semiconductor device comprising:
    forming a base layer comprising a photocatalyst material on an insulating surface of a substrate, wherein the photocatalyst material is selected from the group consisting of titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$) and tungsten oxide ($WO_3$);
    forming a first conductive film pattern by discharging a conductive material containing a photosensitive material on the base layer by droplet discharging;
    selectively exposing the first conductive film pattern to laser light; and
    forming a second conductive film pattern by developing the exposed first conductive film pattern.

2. A method for manufacturing a semiconductor device according to claim 1, wherein the conductive material containing the photosensitive material comprises a material selected from the group consisting of Ag, Au, Cu, Ni, Al or Pt, and a compound thereof.

3. A method for manufacturing a semiconductor device according to claim 1, wherein the photosensitive material is a negative type photosensitive material.

4. A method for manufacturing a semiconductor device according to claim 1, wherein the photosensitive material is a positive type photosensitive material.

5. A method for manufacturing a semiconductor device according to claim 1, wherein a transition metal is doped into the photocatalyst material.

6. A method for manufacturing a semiconductor device comprising:
    forming a base layer comprising a photocatalyst material on an insulating surface of a substrate, wherein the photocatalyst material is selected from the group consisting of titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$) and tungsten oxide ($WO_3$);

forming a first conductive film pattern by discharging a conductive material containing a photosensitive material on the base layer by droplet discharging;

selectively exposing the first conductive film pattern to laser light;

forming a second conductive film pattern having a narrower width than that of the first conductive film pattern by developing the exposed first conductive film pattern;

forming a gate insulating film covering the second conductive film pattern; and forming a semiconductor film over the gate insulating film.

7. A method for manufacturing a semiconductor device according to claim 6, wherein the conductive material containing the photosensitive material comprises a material selected from the group consisting of Ag, Au, Cu, Ni, Al or Pt, and a compound thereof.

8. A method for manufacturing a semiconductor device according to claim 6, wherein the photosensitive material is a negative type photosensitive material.

9. A method for manufacturing a semiconductor device according to claim 6, wherein the photosensitive material is a positive type photosensitive material.

10. A method for manufacturing a semiconductor device according to claim 6, wherein a transition metal is doped into the photocatalyst material.

11. A method for manufacturing a semiconductor device comprising:

forming a base layer comprising a photocatalyst material on an insulating surface of a substrate, wherein the photocatalyst material is selected from the group consisting of titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$) and tungsten oxide ($WO_3$);

forming a first conductive film pattern by discharging a conductive material containing a photosensitive material on the base layer by droplet discharging;

selectively exposing the first conductive film pattern to laser light;

forming a gate electrode by developing the exposed first conductive film pattern;

forming a gate insulating film covering the gate electrode;

forming a first semiconductor film over the gate insulating film;

forming a second conductive film pattern by discharging a conductive material containing a positive type photosensitive material over the first semiconductor film;

exposing a selected portion of the second conductive film pattern to laser light;

forming a source wiring and a drain wiring by developing the exposed second conductive film pattern; and etching the first semiconductor film using the source wiring and the drain wiring as masks.

12. A method for manufacturing a semiconductor device according to claim 11, further comprising a step of forming a second semiconductor film containing an impurity element imparting n-type or p-type conductivity over the first semiconductor film.

13. A method for manufacturing a semiconductor device according to claim 12, further comprising a step of etching the second semiconductor film using the source wiring and the drain wiring as masks.

14. A method for manufacturing a semiconductor device according to claim 11, wherein the conductive material containing the positive type photosensitive material is discharged by droplet discharging.

15. A method for manufacturing a semiconductor device according to claim 11, wherein a transition metal is doped into the photocatalyst material.

16. A method for manufacturing a semiconductor device comprising:

forming a base layer comprising a photocatalyst material on a first surface of a substrate, wherein the photocatalyst material is selected from the group consisting of titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$) and tungsten oxide ($WO_3$);

forming a first conductive film pattern by discharging a conductive material containing a photosensitive material on the base layer by droplet discharging;

selectively exposing the first conductive film pattern to laser light;

forming a gate electrode by developing the exposed first conductive film pattern;

forming a gate insulating film covering the gate electrode;

forming a first semiconductor film over the gate insulating film;

forming a second conductive film pattern by discharging a conductive material containing a negative type photosensitive material over the first semiconductor film;

exposing a portion of the second conductive film pattern to laser light by emitting the laser light from a side of a second surface of the substrate using the gate electrode as a mask wherein the second surface is opposite to the first surface;

forming a source wiring and a drain wiring by developing the exposed second conductive film pattern; and etching the first semiconductor film using the source wiring and the drain wiring as masks.

17. A method for manufacturing a semiconductor device according to claim 16, wherein the substrate has an insulating surface.

18. A method for manufacturing a semiconductor device according to claim 16, further comprising a step of forming a second semiconductor film containing an impurity element imparting n-type or p-type conductivity over the first semiconductor film.

19. A method for manufacturing a semiconductor device according to claim 18, further comprising a step of etching the second semiconductor film using the source wiring and the drain wiring as masks.

20. A method for manufacturing a semiconductor device according to claim 16, wherein the conductive material containing the negative type photosensitive material is discharged by droplet discharging.

21. A method for manufacturing a semiconductor device according to claim 16, wherein the source electrode and the drain electrode are formed in a self aligning manner to have a space therebetween that is the same as a width of the gate electrode.

22. A method for manufacturing a semiconductor device according to claim 16, wherein a transition metal is doped into the photocatalyst material.

* * * * *

UNITED STATES PATENT AND TRADEMARK OFFICE
CERTIFICATE OF CORRECTION

PATENT NO. : 7,691,685 B2
APPLICATION NO. : 10/579800
DATED : April 6, 2010
INVENTOR(S) : Shinji Maekawa et al.

It is certified that error appears in the above-identified patent and that said Letters Patent is hereby corrected as shown below:

Column 3, line 14, "µ1" should read "p1".
Column 3, line 20, "µ1" should read "p1".
Column 14, line 66, "flight-emitting" should read "light-emitting".
Column 16, line 52, "layer, a, electron", should read "layer, an electron".
Column 28, line 35, "Abase", should read "A base".
Column 29, line 49, "film 1318 is", should read "film 2318 is".

Signed and Sealed this

Thirteenth Day of July, 2010

David J. Kappos
*Director of the United States Patent and Trademark Office*